(12) United States Patent
Yamazaki et al.

(10) Patent No.: US 9,343,578 B2
(45) Date of Patent: May 17, 2016

(54) SEMICONDUCTOR DEVICE AND MEASUREMENT DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Shinpei Matsuda, Kanagawa (JP); Masashi Oota, Kanagawa (JP); Noritaka Ishihara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/141,838

(22) Filed: Dec. 27, 2013

(65) Prior Publication Data

US 2014/0183530 A1    Jul. 3, 2014

(30) Foreign Application Priority Data

Dec. 28, 2012  (JP) ................. 2012-287533

(51) Int. Cl.
*H01L 29/10* (2006.01)
*H01L 29/786* (2006.01)
*H01L 29/51* (2006.01)
(Continued)

(52) U.S. Cl.
CPC ...... *H01L 29/7869* (2013.01); *H01L 29/41733* (2013.01); *H01L 29/45* (2013.01); *H01L 29/517* (2013.01); *H01L 29/78606* (2013.01); *H01L 29/78693* (2013.01); *H01L 29/78696* (2013.01)

(58) Field of Classification Search
None
See application file for complete search history.

(56) References Cited

U.S. PATENT DOCUMENTS

| 5,528,032 A | 6/1996 | Uchiyama |
| 5,731,856 A | 3/1998 | Kim et al. |
| 5,744,864 A | 4/1998 | Cillessen et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

(Continued)

*Primary Examiner* — Fei Fei Yeung Lopez
(74) *Attorney, Agent, or Firm* — Fish & Richardson P.C.

(57) ABSTRACT

A semiconductor device includes an oxide semiconductor layer over a first oxide layer; first source and drain electrodes over the oxide semiconductor layer; second source and drain electrodes over the first source and drain electrodes respectively; a second oxide layer over the first source and drain electrodes; a gate insulating layer over the second source and drain electrodes and the second oxide layer; and a gate electrode overlapping the oxide semiconductor layer with the gate insulating layer provided therebetween. The structure in which the oxide semiconductor layer is sandwiched by the oxide layers can suppress the entry of impurities into the oxide semiconductor layer. The structure in which the oxide semiconductor layer is contacting with the source and drain electrodes can prevent increasing resistance between the source and the drain comparing one in which an oxide semiconductor layer is electrically connected to source and drain electrodes through an oxide layer.

47 Claims, 59 Drawing Sheets

(51) Int. Cl.
*H01L 29/417* (2006.01)
*H01L 29/45* (2006.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,247,562 B2 | 7/2007 | Ishikawa |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,863,611 B2 | 1/2011 | Abe et al. |
| 7,964,871 B2 | 6/2011 | Iwasaki |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,237,166 B2 | 8/2012 | Kumomi et al. |
| 8,274,078 B2 | 9/2012 | Itagaki et al. |
| 8,334,532 B2 | 12/2012 | Umeda et al. |
| 8,343,800 B2 | 1/2013 | Umeda et al. |
| 8,378,351 B2 | 2/2013 | Fukumoto et al. |
| 8,421,083 B2 | 4/2013 | Yamazaki et al. |
| 8,436,403 B2 | 5/2013 | Yamazaki et al. |
| 8,470,650 B2 | 6/2013 | Akimoto et al. |
| 8,492,758 B2 | 7/2013 | Yamazaki et al. |
| 8,492,840 B2 | 7/2013 | Yamazaki et al. |
| 8,502,221 B2 | 8/2013 | Yamazaki |
| 8,653,513 B2 | 2/2014 | Suzawa et al. |
| 9,142,679 B2 | 9/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1* | 6/2009 | Maekawa et al. ............... 257/43 |
| 2009/0206332 A1 | 8/2009 | Son et al. |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2010/0038641 A1 | 2/2010 | Imai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0084280 A1 | 4/2011 | Nakayama et al. |
| 2011/0089417 A1 | 4/2011 | Yamazaki et al. |
| 2011/0127521 A1 | 6/2011 | Yamazaki |
| 2011/0140100 A1 | 6/2011 | Takata et al. |
| 2011/0156026 A1 | 6/2011 | Yamazaki et al. |
| 2011/0193083 A1 | 8/2011 | Kim et al. |
| 2011/0215328 A1 | 9/2011 | Morosawa et al. |
| 2011/0240991 A1 | 10/2011 | Yamazaki |
| 2011/0298027 A1 | 12/2011 | Isobe et al. |
| 2011/0303913 A1 | 12/2011 | Yamazaki et al. |
| 2012/0119205 A1 | 5/2012 | Taniguchi et al. |
| 2012/0155150 A1 | 6/2012 | Nagatsuka et al. |
| 2012/0161139 A1 | 6/2012 | Endo et al. |
| 2012/0305913 A1 | 12/2012 | Yamazaki et al. |
| 2012/0319183 A1 | 12/2012 | Yamazaki et al. |
| 2013/0009219 A1 | 1/2013 | Yamazaki et al. |
| 2013/0009220 A1 | 1/2013 | Yamazaki et al. |
| 2014/0042438 A1 | 2/2014 | YAMAZAKI.S |
| 2014/0077205 A1 | 3/2014 | YAMAZAKI.S et al. |
| 2014/0131702 A1* | 5/2014 | Matsubayashi ...... H01L 29/7869 257/43 |
| 2014/0138675 A1* | 5/2014 | YAMAZAKI, Shunpei ... 257/43 |

FOREIGN PATENT DOCUMENTS

| | | |
|---|---|---|
| JP | 60-198861 A | 10/1985 |
| JP | 63-210022 A | 8/1988 |

(56) References Cited

FOREIGN PATENT DOCUMENTS

| | | |
|---|---|---|
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2010-177431 A | 8/2010 |
| JP | 2011-222767 A | 11/2011 |
| JP | 2012-160679 A | 8/2012 |
| WO | 2004/114391 A1 | 12/2004 |

OTHER PUBLICATIONS

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide Tfts and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vo. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

(56) References Cited

OTHER PUBLICATIONS

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphoreent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-Bo Systems [A; Fe, Ga, or Al; B: Mg, Mn, Fe, Ni, Cu,or Zn] At Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film.Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA Amoled Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

T.C. Fling; "2-D Numerical Simulation of High Performance Amorphous In—Ga—Zn—O TFTs for Flat Panel Displays", AM-FPD '08 Digest of Technical Papers; Jul. 2, 2008; pp. 251-252.

Hyun-Joong Chung et al.; "Bulk-Limited Current Conduction in Amorphous InGaZnO Thin Films"; Electrochemical and Solid-State Letters; 2008; pp. H51-H54; vol. 11, No. 3.

Mami Fujii et al.; "Experimental and Theoretical Analysis of Degradation in Ga2O3—In2O3—ZnO Thin-Film Transistors"; Jpn. J. Appl. Phys. (Japanese Journal of Applied Physics); Apr. 20, 2009; pp. 04C091-1-04C091-6; vol. 48, No. 4.

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; AGNE Gijutsu Center, with English translation.

Arokia Nathan et al.; "Amorphous Oxide TFTs: Progress and Issues"; SID Digest '12 : SID International Symposium Digest of Technical Papers; Jun. 3, 2012; pp. 1-4.

Masaya Nakayama et al.; "17a-TL-8 Effect of GaO Layer on IGZO-TFT Channel"; Extended Abstracts (The 57th Spring Meeting 2010), The Japan Society of Applied Physics and Related Societies; Mar. 17, 2010; p. 21-008, with English translation.

\* cited by examiner

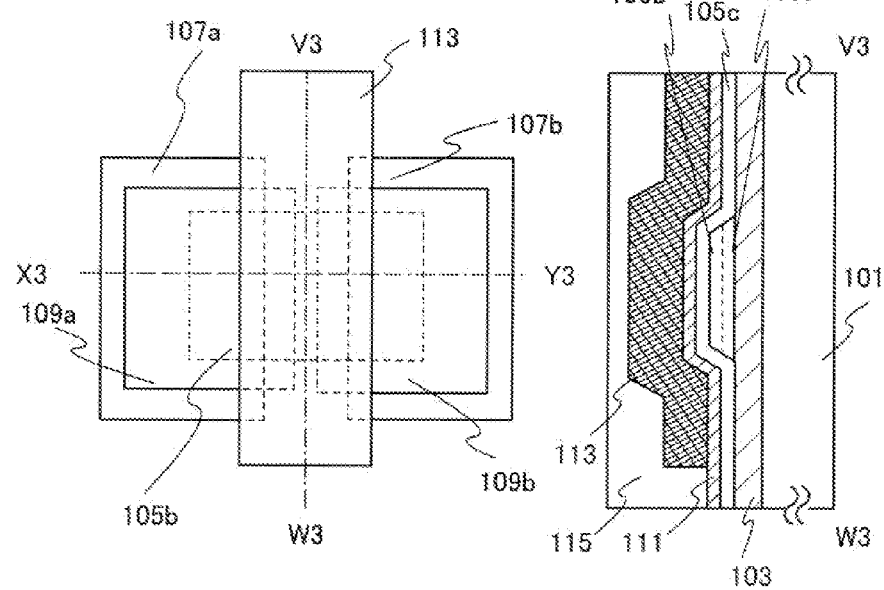
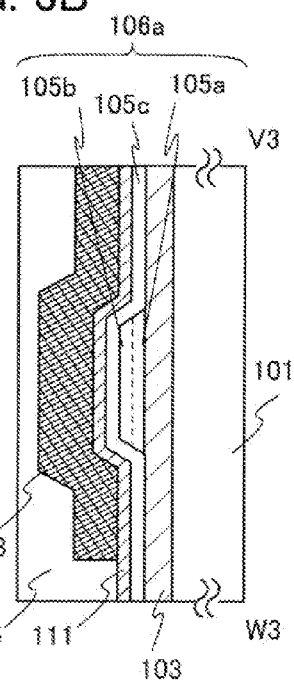
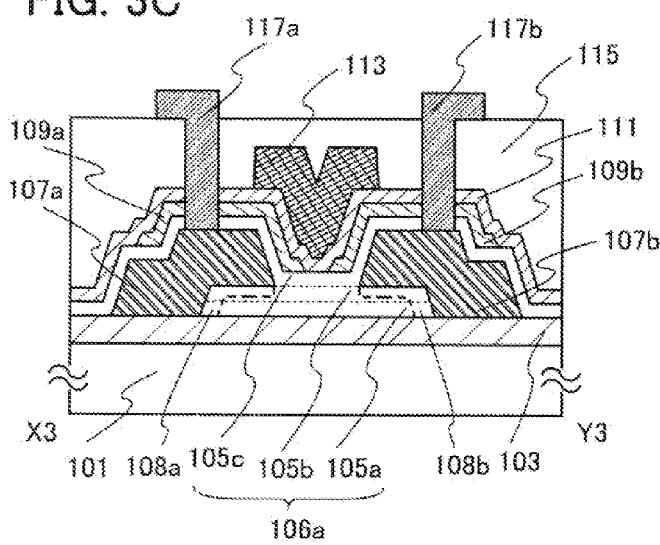
FIG. 3A
FIG. 3B
FIG. 3C

Before Ion Collision

After Ion Collision cleavage plane

○ In
● Ga
○ Zn
● O

↑ c-axis

FIG. 12B1   FIG. 12B2

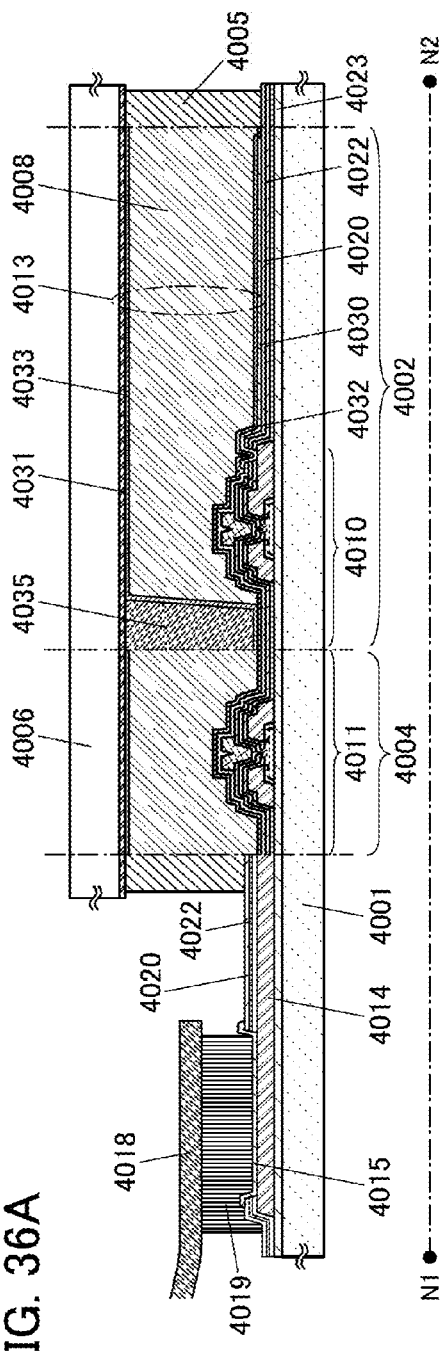
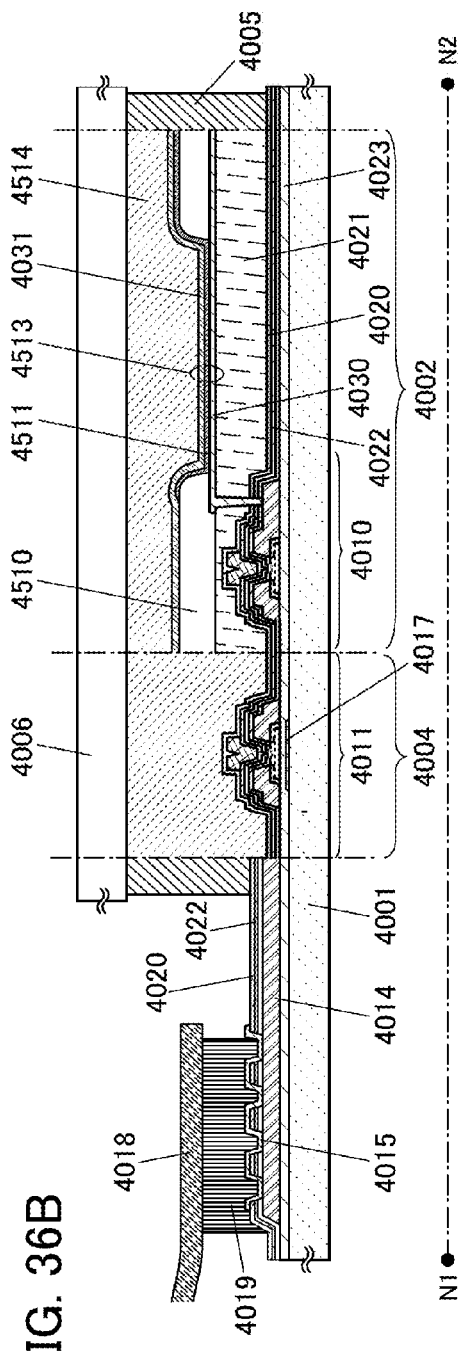
FIG. 36A
FIG. 36B

310

320

SEMICONDUCTOR DEVICE AND MEASUREMENT DEVICE

BACKGROUND OF THE INVENTION

1. Field of the Invention

One embodiment of the present invention relates to a semiconductor device, a light-emitting device, a power storage device, a driving method thereof, or a manufacturing method thereof. Further, one embodiment of the present invention relates to a measurement device for measuring the capacitance of an oxide semiconductor or a manufacturing method thereof.

In this specification and the like, a semiconductor device means all types of devices that can function by utilizing semiconductor characteristics, and a transistor, a semiconductor circuit, a memory device, an imaging device, a display device, an electro-optical device, an electronic device, and the like are all semiconductor devices.

2. Description of the Related Art

A technique in which a transistor is formed using a semiconductor thin film has attracted attention. The transistor is used in a wide range of electronic devices such as an integrated circuit (IC) and a display device. Note that a silicon-based semiconductor material is widely known as a material for a semiconductor thin film applicable to a transistor, and as another material, an oxide semiconductor has attracted attention (e.g., Non-Patent Documents 1 to 3).

For example, a transistor whose active layer includes an amorphous oxide containing indium (In), gallium (Ga), and zinc (Zn) is disclosed in Patent Document 1.

Further, Patent Document 2 discloses that oxygen is released from an oxide semiconductor during a manufacturing process, and oxygen vacancies are formed.

REFERENCE

Patent Document

[Patent Document 1] Japanese Published Patent Application No. 2006-165528
[Patent Document 2] Japanese Published Patent Application No. 2011-222767

Non-Patent Document

[Non-Patent Document 1] T. C. Fung et. al., AM-FPD '08 Digest of Technical Papers, pg. 251
[Non-Patent Document 2] M. Fujii et. al., Jpn. J. Appl. Phys. 48, 2009, 04C091
[Non-Patent Document 3] Hyun-Joong Chung et. al., Electrochemical and Solid-State Letters, 11(3), H51-H54 (2008)

SUMMARY OF THE INVENTION

Oxygen vacancies formed in an oxide semiconductor layer generate localized levels, which causes a reduction in electrical characteristics of a semiconductor device such as a transistor which includes the oxide semiconductor layer.

Further, an interface state derived from an oxygen vacancy is likely to be generated in the oxide semiconductor layer in the vicinity of an interface between the oxide semiconductor layer and an insulating layer which are stacked. An increase in the interface states causes scattering of carriers or capture of carriers, which results in a decrease in field-effect mobility of a transistor or an increase in off-state current. The increase in the interface state density also changes threshold voltage of a transistor, which causes an increase in variation of electrical characteristics. Accordingly, an increase in interface state density leads to deterioration of the electrical characteristics of the transistor and a reduction in reliability of the transistor.

An object of one embodiment of the present invention is to provide an oxide semiconductor in which the density of localized levels is low. Another object of one embodiment of the present invention is to provide a semiconductor device having small variation in electrical characteristics. Another object of one embodiment of the present invention is to provide a highly reliable semiconductor device which has stable electrical characteristics. Another object of one embodiment of the present invention is to provide a semiconductor device which has favorable electrical characteristics. Another object of one embodiment of the present invention is to provide a semiconductor device with low off-state current. Another object of one embodiment of the present invention is to provide a semiconductor device with low power consumption. Another object of one embodiment of the present invention is to provide a semiconductor device which is easily normally off. Another object of one embodiment of the present invention is to provide a novel semiconductor device. Another object of one embodiment of the present invention is to measure the capacitance of an oxide semiconductor.

Note that the descriptions of these problems do not disturb the existence of other problems. Note that in one embodiment of the present invention, there is no need to achieve all the objects. Other objects are apparent from and can be derived from the description of the specification, the drawings, the claims, and the like.

One embodiment of the present invention is a semiconductor device including an island-shaped first oxide layer; an island-shaped oxide semiconductor layer which is over the first oxide layer and in which a channel is formed; a first source electrode and a first drain electrode in contact with the top surface of the oxide semiconductor layer; a second source electrode which is over the first source electrode and is electrically connected to the first source electrode; a second drain electrode which is over the first drain electrode and is electrically connected to the first drain electrode; a second oxide layer over the first source electrode and the first drain electrode; a gate insulating layer over the second source electrode, the second drain electrode, and the second oxide layer; and a gate electrode overlapping with the oxide semiconductor layer with the gate insulating layer provided therebetween. The second oxide layer is in contact with the top surface of the oxide semiconductor layer.

One embodiment of the present invention is a semiconductor device including an insulating layer containing oxygen; an island-shaped first oxide layer in contact with the top surface of the insulating layer containing oxygen; an island-shaped oxide semiconductor layer which is over the first oxide layer and in which a channel is formed; a first source electrode and a first drain electrode in contact with the top surface of the oxide semiconductor layer; a second source electrode electrically connected to the first source electrode; a second drain electrode electrically connected to the first drain electrode; a second oxide layer over the first source electrode, the first drain electrode, the second source electrode, and the second drain electrode; a gate insulating layer over the second oxide layer; and a gate electrode overlapping with the oxide semiconductor layer with the gate insulating layer provided therebetween. The second source electrode, the second drain electrode, and the second oxide layer are in contact with the top surface of the oxide semiconductor layer.

One embodiment of the present invention is a semiconductor device including an insulating layer containing oxygen; an island-shaped first oxide layer in contact with the top surface of the insulating layer containing oxygen; an island-shaped oxide semiconductor layer which is over the first oxide layer and in which a channel is formed; a first source electrode and a first drain electrode in contact with the top surface of the oxide semiconductor layer; a second oxide layer over the first source electrode and the first drain electrode; a second source electrode and a second drain electrode over the second oxide layer; a gate insulating layer over the second source electrode, the second drain electrode, and the second oxide layer; and a gate electrode overlapping with the oxide semiconductor layer with the gate insulating layer provided therebetween. The second source electrode is electrically connected to the first source electrode. The second drain electrode is electrically connected to the first drain electrode Each of the above structures preferably includes a region where the insulating layer containing oxygen is in contact with the second oxide layer outside the oxide semiconductor layer.

Each of the above structures preferably includes a third oxide layer between the insulating layer containing oxygen and the first oxide layer. The third oxide layer preferably contains one or more kinds of metal elements which are the same as metal elements contained in the first oxide layer. At this time, the electron affinity of the third oxide layer is preferably smaller than that of the first oxide layer.

In each of the above structures, at least one of the first oxide layer and the second oxide layer contains one or more kinds of metal elements which are the same as metal elements contained in the oxide semiconductor layer.

In each of the above structures, at least one of the electron affinity of the first oxide layer and the electron affinity of the second oxide layer is smaller than the electron affinity of the oxide semiconductor layer.

Each of the above structures preferably includes a fourth oxide layer in contact with the top surface of the second oxide layer. The fourth oxide layer preferably contains one or more kinds of metal elements which are the same as metal elements contained in the second oxide layer. In particular, the electron affinity of the fourth oxide layer is preferably smaller than that of the second oxide layer.

In each of the above structures, the first source electrode and the first drain electrode are preferably formed using a material which is more easily bonded to oxygen than a material of the second source electrode and second drain electrode is bonded to oxygen. That is, the first source electrode and the first drain electrode are preferably formed using a material having a lower oxidation potential than a material of the second source electrode and second drain electrode.

In each of the above structures, the gate insulating layer preferably includes a hafnium oxide film or an aluminum oxide film. Alternatively, it is preferable that a protective insulating layer be included over the gate electrode, the gate insulating layer include a silicon oxide film or a silicon oxynitride film, and the protective insulating layer include a silicon nitride film or an aluminum oxide film.

One embodiment of the present invention is a measurement device for measuring the capacitance of an oxide semiconductor layer, including a first insulating layer over a first electrode; an oxide semiconductor layer over the first insulating layer; a second electrode over the oxide semiconductor layer; a second insulating layer over the oxide semiconductor layer; and a third electrode over the second insulating layer. The first electrode includes a region overlapping with the oxide semiconductor layer. The first electrode includes a region overlapping with the third electrode. The oxide semiconductor layer includes a region overlapping with the third electrode.

According to one embodiment of the present invention, an oxide semiconductor in which the density of localized levels is low can be provided. According to one embodiment of the present invention, a semiconductor device having small variation in electrical characteristics can be provided. According to one embodiment of the present invention, a highly reliable semiconductor device which has stable electrical characteristics can be provided. According to one embodiment of the present invention, a semiconductor device which has favorable electrical characteristics can be provided.

BRIEF DESCRIPTION OF THE DRAWINGS

FIGS. 3A to 3C illustrate an example of a semiconductor device.

FIGS. 12A, 12B1, and 12B2 are diagrams for explaining sputtering with an AC power source.

FIGS. 36A and 36B each illustrate an example of a display device.

DETAILED DESCRIPTION OF THE INVENTION

Figure 1A:
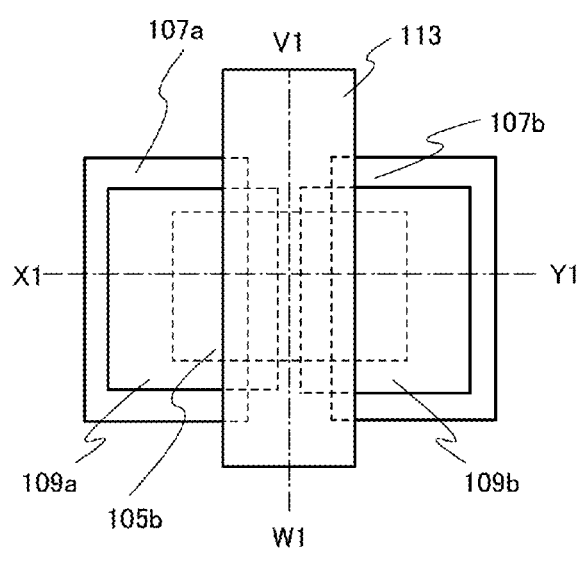
FIGS. 1A to 1D illustrate an example of a semiconductor device.

Embodiments are described in detail with reference to the drawings. Note that the invention is not limited to the following description, and it is easily understood by those skilled in the art that various changes and modifications can be made without departing from the spirit and scope of the invention. Therefore, the invention should not be construed as being limited to the description in the following embodiment modes.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

Note that in this specification and the like, ordinal numbers such as "first" and "second" are used in order to avoid confusion among components and do not limit the number.

Note that in this specification and the like, the term "electrically connected" includes the case where components are connected through an object having any electric function. There is no particular limitation on an object having any electric function as long as electric signals can be transmitted and received between components that are connected through the object. Thus, even when the expression "electrically connected" is used in this specification, there is a case in which no physical connection is made and a wiring is just extended in an actual circuit.

Note that functions of the "source" or "drain" of a transistor may be switched in the case where transistors of different polarities are employed or in the case where the direction of a current flow changes in a circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

(Embodiment 1)

In this embodiment, a semiconductor device of one embodiment of the present invention is described with reference to FIGS. 1A to 1C, FIGS. 2A and 2B, FIGS. 3A and 3B, FIGS. 4A to 4C, FIGS. 5A and 5B, FIGS. 6A and 6B, and FIGS. 7A to 7D.

The semiconductor device of one embodiment of the present invention includes a first oxide layer over an insulating surface; an oxide semiconductor layer over the first oxide layer; a first source electrode and a first drain electrode over the oxide semiconductor layer; a second source electrode over the first source electrode; a second drain electrode over the first drain electrode; a second oxide layer over the first source electrode and the first drain electrode; a gate insulating layer which is over the second source electrode, the second drain electrode, and the second oxide layer and is in contact with the top surface of the second oxide layer; and a gate electrode overlapping with the oxide semiconductor layer with the gate insulating layer provided therebetween. The first source electrode is electrically connected to the second source electrode. The first drain electrode is electrically connected to the second drain electrode. The second oxide layer is in contact with the top surface of the oxide semiconductor layer.

In one embodiment of the present invention, the second oxide layer is provided over the second source electrode and the second drain electrode. In this case, it is preferable that the second source electrode and the second drain electrode be in contact with the top surface of the oxide semiconductor layer. In another embodiment of the present invention, the second source electrode and the second drain electrode are provided over the second oxide layer. In this case, it is preferable that the second source electrode and the second drain electrode be in contact with the top surface of the second oxide layer.

First, a structural example of the semiconductor device of one embodiment of the present invention is given.

<Structural Example 1 of Semiconductor Device>

Figure 1B:
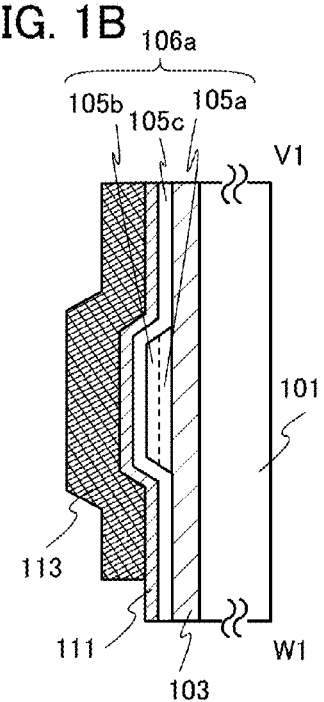
Figure 1C:
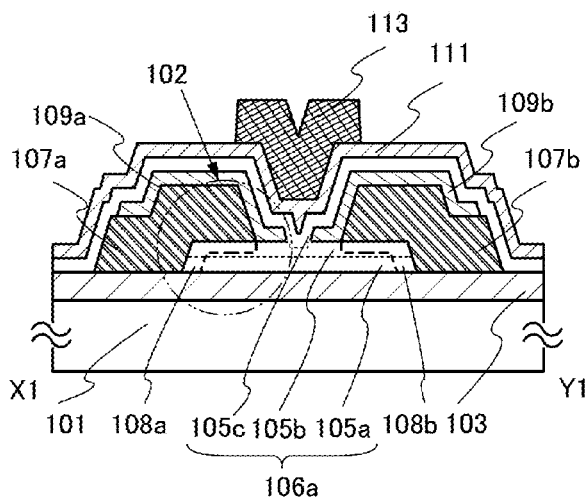
Figure 1D:
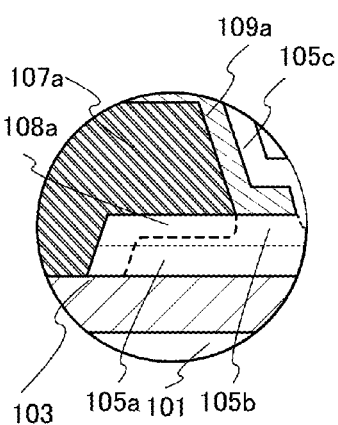

FIG. 1A illustrates a plan view of a transistor of one embodiment of the present invention. FIG. 1B illustrates a cross-sectional view taken along dashed-dotted line V1-W1 in FIG. 1A. FIG. 1C illustrates a cross-sectional view taken along dashed-dotted line X1-Y1 in FIG. 1A. FIG. 1D illustrates an enlarged view of a region 102 illustrated in FIG. 1C. Note that in FIG. 1A, some components are omitted for simplification.

A transistor 100 illustrated in FIGS. 1A to 1C includes an insulating layer 103 over a substrate 101; an oxide layer 105a over the insulating layer 103; an oxide semiconductor layer 105b over the oxide layer 105a; a source electrode 107a and a drain electrode 107b over the oxide semiconductor layer 105b; a source electrode 109a over the source electrode 107a; a drain electrode 109b over the drain electrode 107b; an oxide layer 105c over the source electrode 109a and the drain electrode 109b; a gate insulating layer 111 over the oxide layer 105c; and a gate electrode 113 over the gate insulating layer 111.

A channel is formed in the oxide semiconductor layer 105b. The source electrode 107a and the drain electrode 107b each include a region in contact with side surfaces of the oxide layer 105a and the oxide semiconductor layer 105b. The source electrode 107a, the drain electrode 107b, the source electrode 109a, the drain electrode 109b, and the oxide layer 105c each include a region in contact with the top surface of the oxide semiconductor layer 105b. The gate electrode 113 includes a region overlapping with the oxide semiconductor layer 105b with the gate insulating layer 111 interposed therebetween. The source electrode 107a is electrically connected to the source electrode 109a. The drain electrode 107b is electrically connected to the drain electrode 109b.

In the portion shown by the dashed-dotted line V1-W1 in FIG. 1A, the oxide layer 105a and the oxide semiconductor layer 105b are covered with the oxide layer 105c (FIG. 1B).

In this specification, the oxide layer 105a, the oxide semiconductor layer 105b, and the oxide layer 105c of the transistor 100 may be collectively referred to as a stack 106a. In this specification, the boundaries in the stack are not clear in some cases, and thus are indicated by dashed lines in the drawings.

In part of regions of the stack 106a which overlaps with the source electrode 107a and the drain electrode 107b, a low-resistance region 108a and a low-resistance region 108b are formed (FIGS. 1C and 1D). In FIGS. 1C and 1D, the top surface of the oxide semiconductor layer 105b and the side surfaces of the oxide layer 105a and the oxide semiconductor layer 105b include low-resistance regions. Note that boundaries of the low-resistance regions in the stack are not clear in some cases, and thus are indicated by dashed lines in the drawings.

Note that in the transistor 100, a channel length refers to the distance between the source electrode 109a and the drain electrode 109b. Further, in the transistor 100, a channel refers to a region of the oxide semiconductor layer 105b which is between the source electrode 109a and the drain electrode 109b.

In some cases, an etching region where the top surface of the oxide semiconductor layer 105b is partly etched is formed by forming the source electrode and the drain electrode; however, the etching region is not illustrated in the drawings in some cases for easy understanding.

<Structural Example 2 of Semiconductor Device>

Figure 2A:
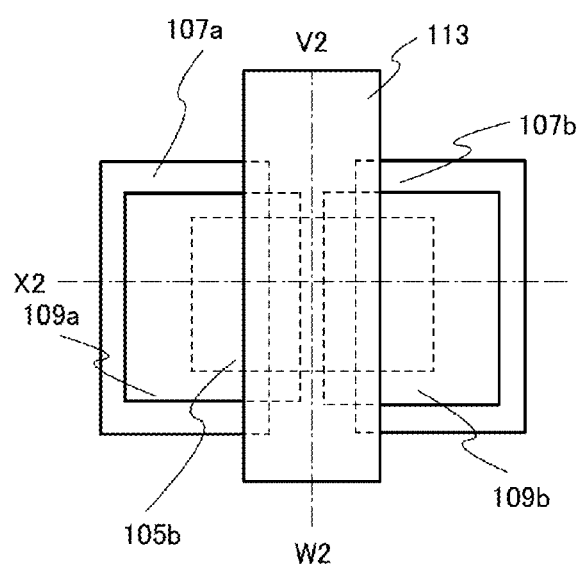
FIGS. 2A to 2C illustrate an example of a semiconductor device.
Figure 2B:
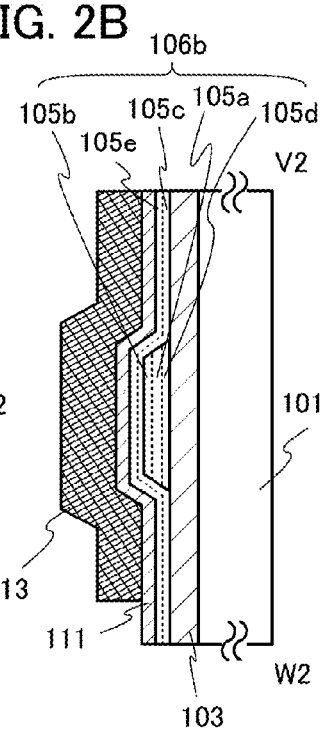
Figure 2C:
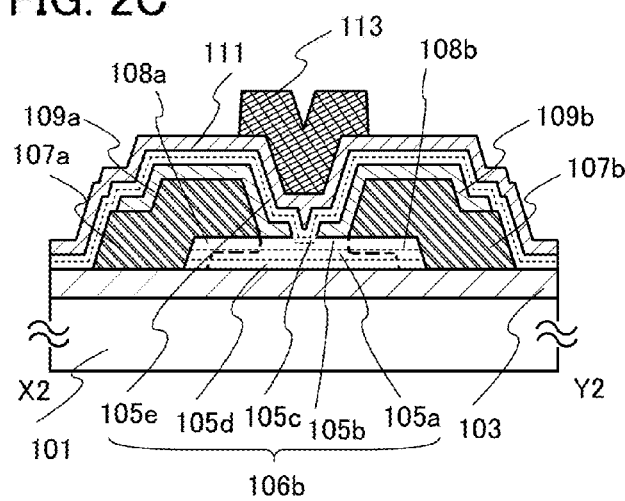

FIG. 2A illustrates a plan view of a transistor of one embodiment of the present invention. FIG. 2B illustrates a cross-sectional view taken along dashed-dotted line V2-W2 in FIG. 2A. FIG. 2C illustrates a cross-sectional view taken along dashed-dotted line X2-Y2 in FIG. 2A. Note that in FIG. 2A, some components are omitted for simplification.

A transistor 120 illustrated in FIGS. 2A to 2C includes the insulating layer 103 over the substrate 101; an oxide layer 105d over the insulating layer 103; the oxide layer 105a over the oxide layer 105d; the oxide semiconductor layer 105b over the oxide layer 105a; the source electrode 107a and the drain electrode 107b over the oxide semiconductor layer 105b; the source electrode 109a over the source electrode 107a; the drain electrode 109b over the drain electrode 107b; the oxide layer 105c over the source electrode 109a and the drain electrode 109b; an oxide layer 105e over the oxide layer 105c; the gate insulating layer 111 over the oxide layer 105e; and the gate electrode 113 over the gate insulating layer 111.

A channel is formed in the oxide semiconductor layer 105b. The source electrode 107a and the drain electrode 107b each include a region in contact with side surfaces of the oxide layer 105d, the oxide layer 105a, and the oxide semiconductor layer 105b. The source electrode 107a, the drain electrode 107b, the source electrode 109a, the drain electrode 109b, and the oxide layer 105c each include a region in contact with the top surface of the oxide semiconductor layer 105b. The gate electrode 113 includes a region overlapping with the oxide semiconductor layer 105b with the gate insulating layer 111 interposed therebetween. The source electrode 107a is electrically connected to the source electrode 109a. The drain electrode 107b is electrically connected to the drain electrode 109b.

In the portion shown by the dashed-dotted line V2-W2 in FIG. 2A, the oxide layer 105d, the oxide layer 105a, and the oxide semiconductor layer 105b are covered with the oxide layer 105c and the oxide layer 105e (FIG. 2B).

In this specification, the oxide layer 105d, the oxide layer 105a, the oxide semiconductor layer 105b, the oxide layer 105c, and the oxide layer 105e of the transistor 120 may be collectively referred to as a stack 106b.

In part of regions of the stack 106b which overlaps with the source electrode 107a and the drain electrode 107b, the low-resistance region 108a and the low-resistance region 108b are formed.

<Structural Example 3 of Semiconductor Device>

FIG. 3A illustrates a plan view of a transistor of one embodiment of the present invention. FIG. 3B illustrates a cross-sectional view taken along dashed-dotted line V3-W3 in FIG. 3A. FIG. 3C illustrates a cross-sectional view taken along dashed-dotted line X3-Y3 in FIG. 3A. Note that in FIG. 3A, some components are omitted for simplification.

A transistor 140 illustrated in FIGS. 3A to 3C includes the insulating layer 103 over the substrate 101; the oxide layer 105a over the insulating layer 103; the oxide semiconductor layer 105b over the oxide layer 105a; the source electrode 107a and the drain electrode 107b over the oxide semiconductor layer 105b; the oxide layer 105c over the source electrode 107a and the drain electrode 107b; the source electrode 109a and the drain electrode 109b over the oxide layer 105c; the gate insulating layer 111 over the oxide layer 105c, the source electrode 109a, and the drain electrode 109b; and the gate electrode 113 over the gate insulating layer 111. The transistor 140 may include an insulating layer 115 over the gate electrode 113 and a conductive layer 117a and a conductive layer 117b over the insulating layer 115.

A channel is formed in the oxide semiconductor layer 105b. The source electrode 107a and the drain electrode 107b each include a region in contact with side surfaces of the oxide layer 105a and the oxide semiconductor layer 105b. The source electrode 107a, the drain electrode 107b, and the oxide layer 105c each include a region in contact with the top surface of the oxide semiconductor layer 105b. The gate electrode 113 includes a region overlapping with the oxide semiconductor layer 105b with the gate insulating layer 111 interposed therebetween. The source electrode 107a is electrically connected to the source electrode 109a through the conductive layer 117a. The drain electrode 107b is electrically connected to the drain electrode 109b through the conductive layer 117b.

In the portion shown by the dashed-dotted line V3-W3 in FIG. 3A, the oxide layer 105a and the oxide semiconductor layer 105b are covered with the oxide layer 105c (FIG. 3B).

In this specification, the oxide layer 105a, the oxide semiconductor layer 105b, and the oxide layer 105c of the transistor 140 may be collectively referred to as the stack 106a.

In part of regions of the stack 106a which overlaps with the source electrode 107a and the drain electrode 107b, the low-resistance region 108a and the low-resistance region 108b are formed.

<Structural Example 4 of Semiconductor Device>

Figure 4A:
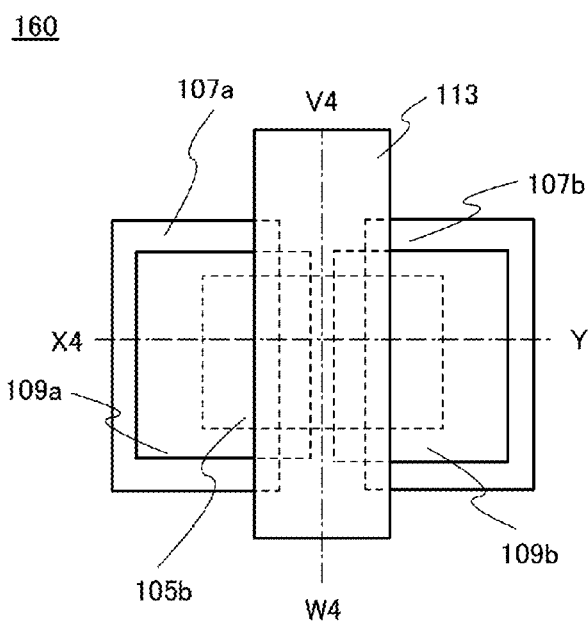
FIGS. 4A to 4C illustrate an example of a semiconductor device.
Figure 4B:
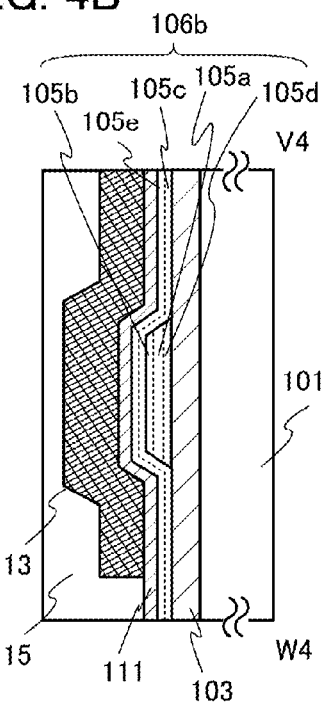
Figure 4C:
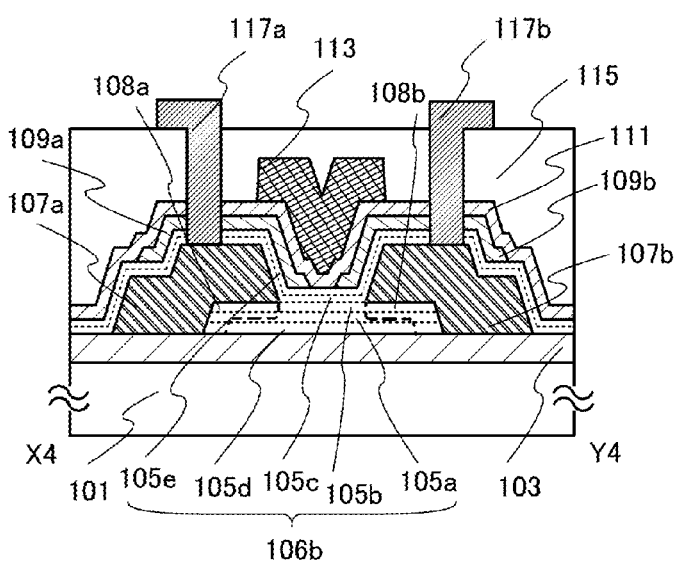

FIG. 4A illustrates a plan view of a transistor of one embodiment of the present invention. FIG. 4B illustrates a cross-sectional view taken along dashed-dotted line V4-W4 in FIG. 4A. FIG. 4C illustrates a cross-sectional view taken along dashed-dotted line X4-Y4 in FIG. 4A. Note that in FIG. 4A, some components are omitted for simplification.

A transistor 160 illustrated in FIGS. 4A to 4C includes the insulating layer 103 over the substrate 101; the oxide layer 105d over the insulating layer 103; the oxide layer 105a over the oxide layer 105d; the oxide semiconductor layer 105b over the oxide layer 105a; the source electrode 107a and the drain electrode 107b over the oxide semiconductor layer 105b; the oxide layer 105c over the source electrode 107a and the drain electrode 107b; the oxide layer 105e over the oxide layer 105c; the source electrode 109a and the drain electrode 109b over the oxide layer 105e; the gate insulating layer 111 over the source electrode 109a, the drain electrode 109b, and the oxide layer 105e; and the gate electrode 113 over the gate insulating layer 111. The transistor 160 may include the insulating layer 115 over the gate electrode 113 and the conductive layer 117a and the conductive layer 117b over the insulating layer 115.

A channel is formed in the oxide semiconductor layer 105b. The source electrode 107a and the drain electrode 107b each include a region in contact with side surfaces of the oxide layer 105d, the oxide layer 105a, and the oxide semiconductor layer 105b. The source electrode 107a, the drain electrode 107b, and the oxide layer 105c each include a region in contact with the top surface of the oxide semiconductor layer 105b. The gate electrode 113 includes a region overlapping with the oxide semiconductor layer 105b with the gate insulating layer 111 interposed therebetween. The source electrode 107a is electrically connected to the source electrode 109a through the conductive layer 117a. The drain electrode 107b is electrically connected to the drain electrode 109b through the conductive layer 117b.

In the portion shown by the dashed-dotted line V4-W4 in FIG. 4A, the oxide layer 105d, the oxide layer 105a, and the oxide semiconductor layer 105b are covered with the oxide layer 105c and the oxide layer 105e (FIG. 4B).

In this specification, the oxide layer 105d, the oxide layer 105a, the oxide semiconductor layer 105b, the oxide layer 105c, and the oxide layer 105e of the transistor 160 may be collectively referred to as the stack 106b.

In part of regions of the stack 106b which overlaps with the source electrode 107a and the drain electrode 107b, the low-resistance region 108a and the low-resistance region 108b are formed.

Next, each of the structural examples is more specifically described.

1) Reducing Concentration of Impurities in Oxide Semiconductor Layer

In order to provide stable electrical characteristics for a transistor whose channel is formed in the oxide semiconductor layer 105b, it is effective to reduce the concentration of impurities in the oxide semiconductor layer 105b.

Each of the above-described semiconductor devices includes the oxide layers 105a and 105c, whereby the entry of components contained in the gate insulating layer 111, the insulating layer 103, the substrate 101, or the like into the oxide semiconductor layer 105b can be suppressed. Specifically, the entry of impurities such as hydrogen, nitrogen, carbon, and silicon into the oxide semiconductor layer 105b is suppressed, whereby variation in electrical characteristics can be suppressed.

In the case where a channel is formed at an interface between the gate insulating film and the oxide semiconductor layer, interface scattering occurs at the interface and the field-effect mobility of the transistor is decreased. In view of the above, it is preferable that the oxide semiconductor layer 105b be not formed in contact with the gate insulating layer 111 and that a channel be apart from the gate insulating layer 111. When the channel of the transistor is apart from the gate insulating layer 111, the transistor can have stable electrical characteristics and a high field-effect mobility.

In particular, it is preferable that an oxide layer which contains one or more kinds of metal elements that are the same as those contained in an oxide semiconductor layer be formed in contact with the oxide semiconductor layer in which a channel is formed. An interface state is not likely to be generated at the interface between the oxide layer and the oxide semiconductor layer which are stacked. Thus, when the oxide semiconductor layer in which a channel is formed is provided between two oxide layers, an interface state is not likely to be generated at each of an upper interface and a lower interface of the oxide semiconductor layer. Specifically, it is preferable that the oxide layers 105a and 105c which each contain one or more kinds of metal elements that are the same as those contained in the oxide semiconductor layer 105b be formed in contact with an upper layer and a lower layer of the oxide semiconductor layer 105b in which a channel is formed.

For the oxide layers 105a and 105c, it is preferable to use a material having a smaller electron affinity than that of the oxide semiconductor layer 105b. With such a structure, electrons which flow in the channel hardly move in the oxide layers in contact with the oxide semiconductor layer 105b and mainly move in the oxide semiconductor layer 105b. Accordingly, even when an interface state exists between the oxide layer and an insulating layer which is formed on the outside of the oxide layer, the state hardly influences the movement of electrons.

That is, although a trap level derived from an impurity or a defect is formed in the vicinity of the interface between the oxide layer and the insulating layer, the oxide semiconductor layer can be separated from the trap level because the oxide layer is provided between the insulating layer and the oxide semiconductor layer.

Like the semiconductor devices of Structural Examples 2 and 4, when an oxide layer is further provided (the oxide layer 105d and the oxide layer 105e are provided) between the insulating layer and the oxide layer in contact with the oxide semiconductor layer, the oxide semiconductor layer can be further separated from the above-described trap level. Note that the oxide layer provided between the insulating layer and the oxide layer in contact with the oxide semiconductor layer preferably contains one or more kinds of metal elements that are the same as those contained in the oxide layer in contact with the oxide semiconductor layer. It is preferable that the oxide layer provided between the insulating layer and the oxide layer in contact with the oxide semiconductor layer have a smaller electron affinity than that of the oxide layer in contact with the oxide semiconductor layer.

2) Reducing Oxygen Vacancies in Oxide Semiconductor Layer

In the case of forming a transistor including an oxide semiconductor, an oxygen vacancy can be given as one of carrier supply sources of the oxide semiconductor. A large number of oxygen vacancies in an oxide semiconductor including a channel formation region of a transistor lead to generation of electrons in the channel formation region, which causes defects in electrical characteristics; for example, the transistor becomes normally-on, leakage current increases, or threshold voltage is shifted due to stress application.

Therefore, in order that a semiconductor device including an oxide semiconductor can have stable electrical characteristics, some measures need to be taken to reduce oxygen vacancies in the oxide semiconductor layer.

Thus, in the semiconductor device of one embodiment of the present invention, oxygen is supplied from the insulating layers containing oxygen provided below and over the oxide semiconductor layer to the oxide semiconductor layer, so that oxygen vacancies are filled.

Each of the insulating layers included in the semiconductor device of one embodiment of the present invention preferably contains oxygen. The insulating layers containing oxygen can supply oxygen to the stack. In particular, the semiconductor device of one embodiment of the present invention preferably includes an insulating layer containing excess oxygen because oxygen vacancies of the stack (or the oxide semiconductor layer) can be reduced by the excess oxygen.

Note that in this specification and the like, "excess oxygen" means oxygen which can be transferred in an oxide layer, an oxide semiconductor layer, an oxide insulating layer (e.g., a silicon oxide film or a silicon oxynitride film), or the like, oxygen which exists in excess of the stoichiometric composition, or oxygen having a function of filling oxygen vacancies (Vo) generated due to lack of oxygen. An insulating layer containing excess oxygen means an insulating layer from which oxygen is released by heat treatment.

Here, a film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in thermal desorption spectrometry (TDS) analysis in which heat treatment is performed such that a temperature of a film surface is higher than or equal to 100° C. and lower than or equal to 700° C., preferably higher than or equal to 100° C. and lower than or equal to 500° C. (converted into the number of oxygen atoms).

The film from which oxygen is released by heat treatment may contain a peroxide radical. For example, the spin density attributed to the peroxide radical is greater than or equal to $5\times10^{17}$ spins/cm$^3$. Note that "a film containing a peroxide radical" refers to "a film having a signal having asymmetry at a g value of around 2.01 in electron spin resonance (ESR)".

The insulating layer containing excess oxygen may be a silicon oxide film containing excess oxygen (SiO$_X$(X>2)), for example. The silicon oxide film containing excess oxygen (SiO$_X$(X>2)) includes a region where the number of oxygen atoms per unit volume is more than twice the number of silicon atoms per unit volume. The number of silicon atoms and the number of oxygen atoms per unit volume are measured by Rutherford backscattering spectrometry (RBS).

3) Suppression of Increase in Contact Resistance Between Oxide Semiconductor Layer, and Source or Drain In the case where an oxide layer is provided in order that a channel of a transistor is apart from a gate insulating layer from the above reason and accordingly, an oxide semiconductor layer is connected to a source or a drain through the oxide layer, a resistance between the source and the drain is increased. However, in each of the above semiconductor devices, the source electrode 107a and the drain electrode 107b are each in contact with the oxide semiconductor layer 105b; thus, an increase in resistance between the source and the drain can be prevented.

A material which is capable of removing oxygen from part of the oxide semiconductor layer 105b (further, the oxide layer) to cause oxygen vacancies is preferably used for at least parts of the source electrode 107a and the drain electrode 107b which are in contact with the oxide semiconductor layer 105b. The carrier concentration of the regions of the oxide semiconductor layer 105b (further, the oxide layer) in which oxygen vacancies are generated is increased, so that the regions become n-type regions (n$^+$ layers). Thus, the regions can serve as low-resistance regions.

Examples of the material which is capable of removing oxygen from the oxide semiconductor layer and the oxide layer to cause oxygen vacancies include tungsten and titanium. Further, materials such as aluminum, copper, molybdenum, chromium, and tantalum and an alloy of any of these which are easily bonded to oxygen and have a lower oxidation potential can be favorably used for the source electrode 107a and the drain electrode 107b. In particular, tungsten having a high melting point is preferably used. Note that the conductive material which is easily bonded to oxygen and has a lower potential includes, in its category, a material to which oxygen is easily diffused.

A conductive material which is easily bonded to oxygen and has a lower oxidation potential as compared to the material included in the stack is preferably used for the source electrode 107a and the drain electrode 107b.

Depending on the materials and thickness of the stack, all the regions of the stack that overlap with the source electrode 107a and the drain electrode 107b serve as the low-resistance region 108a and the low-resistance region 108b in some cases.

When the low-resistance region 108a and the low-resistance region 108b are formed in the oxide semiconductor layer 105b (further, an oxide layer), the contact resistance between the oxide semiconductor layer 105b and each of the source electrode 107a and the drain electrode 107b can be reduced. Accordingly, the electrical characteristics of the transistor, such as the field-effect mobility or variations in the threshold voltage, can be favorable.

In the case of forming a transistor with an extremely short channel length, the n-type region which is formed by the generation of the oxygen vacancies sometimes extends in the channel length direction of the transistor. In this case, the following phenomena and the like occur as for the electrical characteristics of the transistor: the threshold voltage is changed; and the source and the drain are brought into conduction so that on/off state of the transistor cannot be controlled. Accordingly, when a transistor with an extremely short channel length is formed, it is not preferable that the conductive material which is easily bonded to oxygen and has a lower oxidation potential be used for the source electrode and the drain electrode.

Thus, in the semiconductor device of one embodiment of the present invention, a conductive material which is not easily bonded to oxygen and has a higher oxidation potential is used for the source electrode 109a and the drain electrode 109b which determine the channel length. The source electrode 109a is in contact with the stack and is electrically connected to the source electrode 107a. The source electrode 109b is in contact with the stack and is electrically connected to the source electrode 107b.

A conductive material which is not easily bonded to oxygen and has a higher oxidation potential as compared to the material included in the stack is preferably used for the source electrode 109a and the drain electrode 109b. Alternatively, a conductive material which is not easily bonded to oxygen and has a higher oxidation potential as compared to the material included in the source electrode 107a and the drain electrode 107b is preferably used for the source electrode 109a and the drain electrode 109b.

The source electrode 109a extends to, beyond an end portion of the source electrode 107a which is in contact with the stack, a region where the oxide semiconductor layer 105b overlaps with the gate electrode 113. The drain electrode 109b extends to, beyond an end portion of the drain electrode 107b which is in contact with the stack, the region where the oxide semiconductor layer 105b overlaps with the gate electrode 113.

The extended portions of the source electrode 109a and the drain electrode 109b are in contact with the stack. For example, in the transistor 100 in FIG. 1C, the channel length refers to the distance between an end portion of the extended portion of the source electrode 109a which is in contact with the oxide semiconductor layer 105b and an end portion of the extended portion of the drain electrode 109b which is in contact with the oxide semiconductor layer 105b.

As the conductive material which is not easily bonded to oxygen, has a higher oxidation potential, and is used for forming the source electrode 109a and the drain electrode 109b, for example, a conductive nitride such as tantalum nitride or titanium nitride, titanium, or ruthenium is preferably used. Note that the conductive material which is not easily bonded to oxygen and has a higher oxidation potential includes, in its category, a material to which oxygen is not easily diffused. Note that conductive nitride such as tantalum nitride or titanium nitride might occlude hydrogen. Therefore, when conductive nitride is provided in contact with the stack, the hydrogen concentration of the stack can be reduced.

By the use of the above conductive material which is not easily bonded to oxygen and has a higher oxidation potential for the source electrode 109a and the drain electrode 109b, generation of oxygen vacancies in the channel can be suppressed, so that change of the channel into an n-type can be suppressed. Accordingly, even a transistor with an extremely short channel length can have favorable electrical characteristics.

In the case where the source electrode and the drain electrode are formed using only the conductive material which is not easily bonded to oxygen and has a higher oxidation potential, the contact resistance between the oxide semiconductor layer 105b and each of the source electrode and the drain electrode becomes too high. Thus, it is preferable to form the source electrode 107a and the drain electrode 107b which are in contact with the oxide semiconductor layer 105b and to form the source electrode 109a and the drain electrode 109b which are electrically connected to the source electrode 107a and the drain electrode 107b, respectively.

At this time, it is preferable to lower the contact resistance between the oxide semiconductor layer 105b and each of the source electrode 107a and the drain electrode 107b by the following steps: the contact areas between the oxide semiconductor layer 105b and each of the source electrode 107a and the drain electrode 107b are increased, oxygen vacancies are generated, and thus the low-resistance region 108a and the low-resistance region 108b are formed. Further, it is preferable to make the contact areas between the stack and each of the source electrode 109a and the drain electrode 109b small. This is because if the contact areas between the stack and each of the source electrode 109a and the drain electrode 109b are large, the electrical characteristics of the transistor are degraded in some cases.

The distance between the source electrode 109a and the drain electrode 109b can be shorter than the distance between the source electrode 107a and the drain electrode 107b. For example, even in the case where the distance between the source electrode 109a and the drain electrode 109b is smaller than or equal to 30 nm, favorable electrical characteristics of the transistor can be obtained.

<Another Structural Example of Semiconductor Device>

A semiconductor device of one embodiment of the present invention which has a different structure from that of the above semiconductor device is described. For a structure and an effect which are similar to those of the above semiconductor device, the above description can be referred to.

Figure 5A:
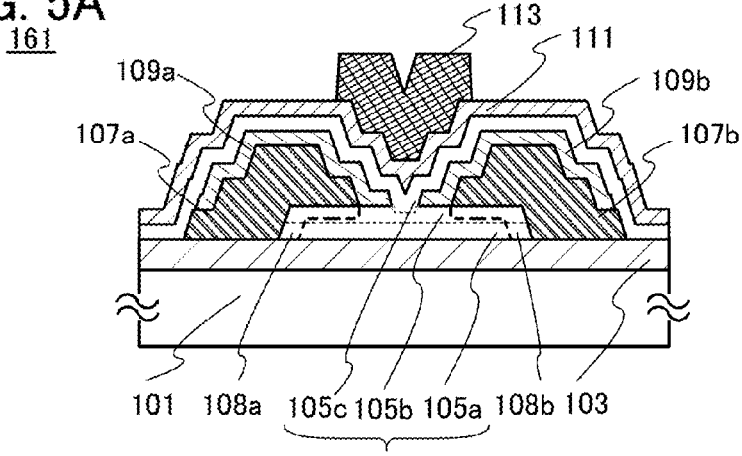
FIGS. 5A to 5C illustrate examples of a semiconductor device.

The transistor 161 illustrated in FIG. 5A has substantially the same structure as the transistor 100 except the cross-sectional shapes of the source electrode 107a and the drain electrode 107b. Specifically, each of the end portions of the source electrode 107a and the drain electrode 107b in the transistor 161 has a step-like shape.

When the cross-section of each of the end portions of the source electrode 107a and the drain electrode 107b (including other electrodes or wirings formed from the same layer) has a step-like shape including a plurality of steps, the coverage of a film covering the source electrode 107a and the drain electrode 107b can be improved. Accordingly, breakdown voltage of the gate insulating layer 111 can be improved. Further, the reliability of the semiconductor device can be improved. The above is not limited to the source electrode 107a and the drain electrode 107b, and by providing a forward taper shape or a step-like shape for a cross section of the end portion of each layer, a phenomenon in that a layer formed to cover the end portion is separated (disconnection) at the end portion can be prevented, so that the coverage becomes favorable.

In one embodiment of the present invention, in the case where each of the end portions of the source electrode 107a and the drain electrode 107b has a step-like shape, there is no limitation on the number of steps. In the transistor 161, for example, the step-like shape includes two steps.

After the source electrode 107a and the drain electrode 107b are formed using a resist mask, the resist mask is reduced in size by oxygen plasma or the like. Then, etching is performed using the reduced resist mask, so that the cross sections of the end portions can have a step-like shape. By reducing the resist mask in size and performing etching a plurality of times, the number of steps can be increased.

Figure 5B:
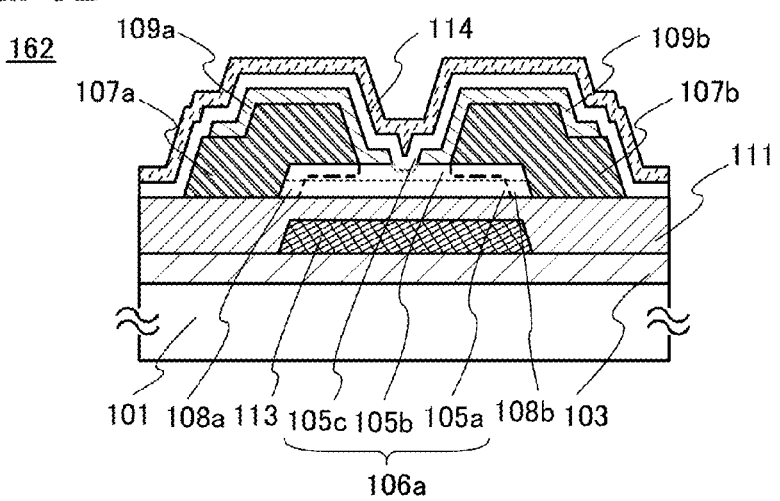

The top gate transistors are described above; however, the transistor of one embodiment of the present invention is not limited to a top gate transistor. FIG. 5B illustrates a bottom gate transistor 162 which is one embodiment of the present invention. The transistor 162 includes the insulating layer 103 over the substrate 101; the gate electrode 113 over the insulating layer 103; the gate insulating layer 111 over the gate electrode 113; the oxide layer 105a over the gate insulating layer 111; the oxide semiconductor layer 105b over the oxide layer 105a; the source electrode 107a and the drain electrode 107b over the oxide semiconductor layer 105b; the source electrode 109a over the source electrode 107a; the drain electrode 109b over the drain electrode 107b; the oxide layer 105c over the source electrode 109a and the drain electrode 109b; and an insulating layer 114 over the oxide layer 105c.

A channel is formed in the oxide semiconductor layer 105b. The source electrode 107a and the drain electrode 107b each include a region in contact with side surfaces of the oxide layer 105a and the oxide semiconductor layer 105b. The source electrode 107a, the drain electrode 107b, the source electrode 109a, the drain electrode 109b, and the oxide layer 105c each include a region in contact with the top surface of the oxide semiconductor layer 105b. The gate electrode 113 includes a region overlapping with the oxide semiconductor layer 105b with the gate insulating layer 111 interposed therebetween. The source electrode 107a is electrically connected to the source electrode 109a. The drain electrode 107b is electrically connected to the drain electrode 109b. FIG. 5B illustrates a case where the oxide layer 105a is formed over the gate insulating layer 111 on which planarization treatment has been performed; however, one embodiment of the present invention is not limited to this.

Figure 5C:
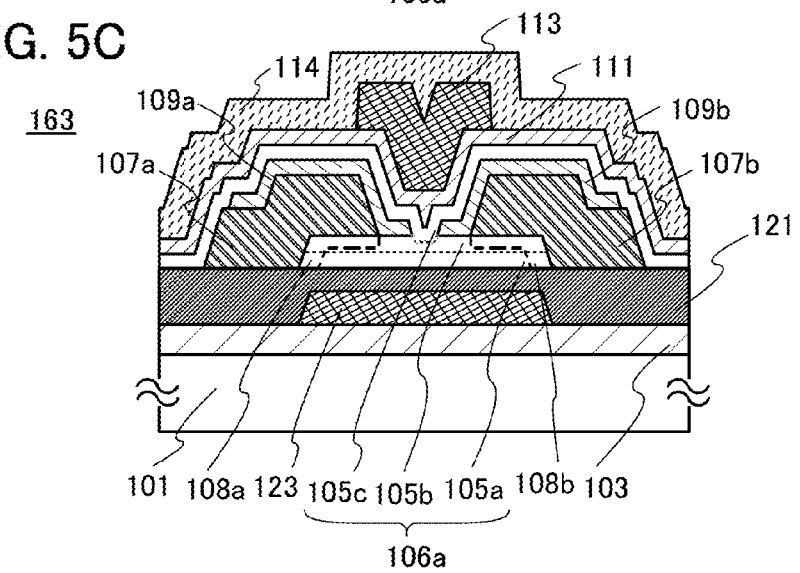

A transistor 163 illustrated in FIG. 5C includes the insulating layer 103 over the substrate 101; a gate electrode 123 over the insulating layer 103; a gate insulating layer 121 over the gate electrode 123; the oxide layer 105a over the gate insulating layer 121; the oxide semiconductor layer 105b over the oxide layer 105a; the source electrode 107a and the drain electrode 107b over the oxide semiconductor layer 105b; the source electrode 109a over the source electrode 107a; the drain electrode 109b over the drain electrode 107b; the oxide layer 105c over the source electrode 109a and the drain electrode 109b; the gate insulating layer 111 over the oxide layer 105c; the gate electrode 113 over the gate insulating layer 111; and the insulating layer 114 over the gate electrode 113.

A channel is formed in the oxide semiconductor layer 105b. The source electrode 107a and the drain electrode 107b each include a region in contact with side surfaces of the oxide layer 105a and the oxide semiconductor layer 105b. The source electrode 107a, the drain electrode 107b, the source electrode 109a, the drain electrode 109b, and the oxide layer 105c each include a region in contact with the top surface of the oxide semiconductor layer 105b. The gate electrode 113 includes a region overlapping with the oxide semiconductor layer 105b with the gate insulating layer 111 interposed therebetween. The gate electrode 123 includes a region overlapping with the oxide semiconductor layer 105b with the gate insulating layer 121 interposed therebetween. The source electrode 107a is electrically connected to the source electrode 109a. The drain electrode 107b is electrically connected to the drain electrode 109b.

In the transistor 163, one of the gate electrode 113 or the second gate electrode 123 can function as a gate electrode, and the other thereof can function as a back gate electrode. In general, the back gate electrode is formed using a conductive layer and positioned so that the channel of the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode, the threshold voltage of the transistor can be changed.

Further, each of the gate electrode and the back gate electrode is formed using a conductive film and thus have a function of preventing an electric field generated in the outside of the transistor from influencing the semiconductor layer in which the channel is formed (in particular, a function of preventing static electricity). That is, the variation in the electrical characteristics of the transistor due to the influence of external electric field such as static electricity can be prevented. By providing the back gate electrode, the amount of change in threshold voltage of the transistor due to the bias-temperature stress test (BT test) can be reduced.

When the back gate electrode is formed using a light-blocking conductive layer, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

In this specification, the oxide layer 105a, the oxide semiconductor layer 105b, and the oxide layer 105c of each of the transistors 161, 162, and 163 may be collectively referred to as the stack 106a. In part of regions of the stack 106a which overlaps with the source electrode 107a and the drain electrode 107b, the low-resistance region 108a and the low-resistance region 108b are formed.

Figure 6:
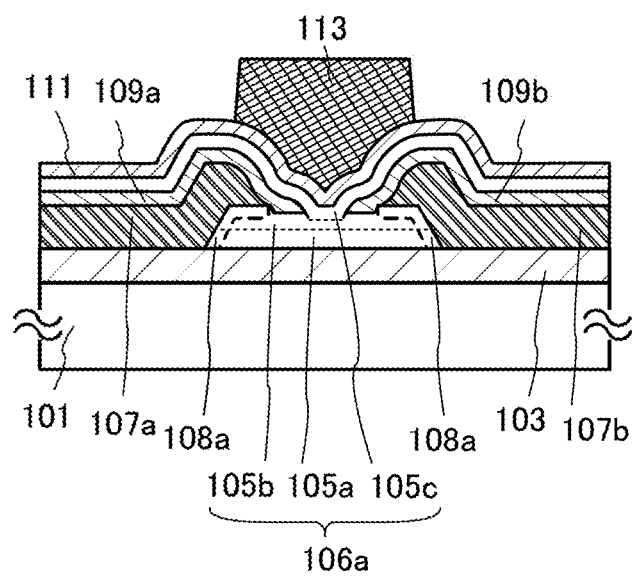
FIG. 6 illustrates an example of a semiconductor device.

A transistor 164 illustrated in FIG. 6 has substantially the same structure as the transistor 100 except the cross-sectional shapes of a source electrode and a drain electrode. Specifically, it is preferable that side surfaces of the source electrode and the drain electrode in the cross section be inclined rather than rise perpendicularly, and be tapered toward the end portions. That is, in the cross-sectional structures of the source electrode and the drain electrode, the source electrode and the drain electrode each have a bottom end portion in contact with the oxide semiconductor layer 105b and an upper end portion that is located outside the bottom end portion, and the bottom end portion or the upper end portion, or both have curvatures. When the side surfaces of the source electrode and the drain electrode have the above shapes, the coverage with the layer formed over the source electrode and the drain electrode (e.g., the oxide layer 105c or the gate insulating layer 111) can be improved. Accordingly, breakdown voltage of the gate insulating layer 111 can be improved. Further, reliability of the semiconductor device can be improved.

The source electrode and the drain electrode which have such cross-sectional shapes can be formed by performing resist mask processing and then etching treatment. The resist mask processing can be performed by electron beam exposure, for example. The etching treatment can be performed with, for example, a dry etching apparatus using inductively-coupled plasma which is a high density plasma source. For example, the etching conditions can be as follows: ICP=2000 W, bias=50 W, pressure=0.67 Pa, $CF_4/O_2$=60/40 sccm, and substrate temperature=40° C.; or ICP=2000 W, bias=50 W, pressure=0.67 Pa, $CF_4$=100 sccm, and substrate temperature=40° C.

<Material of Semiconductor Device>

Each component of the semiconductor device of one embodiment of the present invention is described. For each of the insulating layers, the source electrode, and the drain electrode, the above description can also be referred to. Each component of the semiconductor device may be a single film or a multi-layer film.

[Substrate]

The substrate 101 is not limited to a simple supporting substrate, and may be a substrate where another device such as a transistor is formed. In this case, at least one of the gate electrode, the source electrode, and the drain electrode of the transistor may be electrically connected to the above device.

Although there is no particular limitation on a substrate which can be used as the substrate 101, it is necessary that the substrate have at least heat resistance high enough to withstand heat treatment to be performed later. For example, a glass substrate of barium borosilicate glass, aluminoborosilicate glass, or the like, a ceramic substrate, a quartz substrate, a sapphire substrate, or the like can be used.

A single crystal semiconductor substrate or a polycrystalline semiconductor substrate, such as a silicon substrate or a silicon carbide substrate, or a compound semiconductor substrate, such as a silicon germanium substrate, may be used as the substrate 101. Alternatively, an SOI substrate, a semiconductor substrate over which a semiconductor element is provided, or the like can be used.

Note that a flexible substrate may also be used as the substrate 101. In the case where a flexible substrate is used, the transistor, the capacitor, or the like may be directly formed over the flexible substrate, or the transistor, the capacitor, or the like may be formed over a formation substrate, and then separated from the formation substrate and transferred onto the flexible substrate. To separate and transfer the transistor, the capacitor, or the like from the formation substrate to the flexible substrate, a separation layer may be provided between the formation substrate and the transistor, the capacitor, or the like.

[Insulating Layer]

The insulating layers 103, 114, and 115, the gate insulating layer 111, and the gate insulating layer 121 are described.

The insulating layer 103 functions as a base layer, and can suppress diffusion of an impurity element from the substrate 101. Note that the insulating layer 103 is not necessarily provided as long as insulation between the substrate 101 and the oxide layer to be formed later can be ensured.

The insulating layer 114 functions as a protective insulating layer, and can suppress diffusion of an impurity element from the outside.

The insulating layer 115 has a planarization function and can reduce surface unevenness caused by a transistor. For the insulating layer 115, as well as an inorganic material described later, an organic material such as a polyimide resin, an acrylic resin, or a benzocyclobutene-based resin or a low-dielectric material (low-k material) can be used.

Note that the oxide layers 105c and 105e can be regarded as parts of the gate insulating layer. The oxide layer and the gate insulating layer are stacked, whereby withstand voltage between the gate electrode and each of the source electrode and the drain electrode can be improved. Accordingly, a highly reliable semiconductor device can be obtained.

Each of the insulating layers included in the semiconductor device can be formed with a single layer or a stack of layers using one or more materials selected from aluminum nitride, aluminum oxide, aluminum nitride oxide, aluminum oxynitride, magnesium oxide, gallium oxide, silicon nitride, silicon oxide, silicon nitride oxide, silicon oxynitride, germanium oxide, yttrium oxide, zirconium oxide, lanthanum oxide, neodymium oxide, hafnium oxide, tantalum oxide, and the like. In this specification, nitride oxide refers to a material containing a larger quantity of nitrogen than that of oxygen, and oxynitride refers to a material containing a larger quantity of oxygen than that of nitrogen. Note that content of each element can be measured by RBS or the like, for example.

The insulating layer in contact with the stack may have a two-layer structure, and an insulating layer from which oxygen is released by heating can be used as one of the two insulating layers which is in contact with the stack. It is preferable to use the insulating layer from which oxygen is released by heating as the one of the two insulating layers which is in contact with the stack because oxygen can be supplied to the stack. Further, when an insulating layer which has an effect of blocking oxygen, hydrogen, water, and the like is used as the other of the two insulating layers which is not in contact with the stack, oxygen can be prevented from diffusing from the stack into the outside, and hydrogen, water, and the like can be prevented from entering the stack from the outside. The insulating layer having an effect of blocking oxygen, hydrogen, water, and the like can be formed using a material such as aluminum oxide, aluminum oxynitride, gallium oxide, gallium oxynitride, yttrium oxide, yttrium oxynitride, hafnium oxide, or hafnium oxynitride.

The insulating layer may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide.

Each of the insulating layers included in the semiconductor device can be formed by a sputtering method, a molecular beam epitaxy (MBE) method, a chemical vapor deposition (CVD) method, a pulsed laser deposition (PLD) method, an atomic layer deposition (ALD) method, a metal organic chemical vapor deposition (MOCVD) method, or the like, as appropriate.

The thickness of the insulating layer 103 may be, for example, greater than or equal to 10 nm and less than or equal to 500 nm, preferably greater than or equal to 50 nm and less than or equal to 300 nm. The thickness of the gate insulating layer may be greater than or equal to 1 nm and less than or equal to 400 nm, more preferably greater than or equal to 10 nm and less than or equal to 300 nm, still more preferably greater than or equal to 50 nm and less than or equal to 250 nm. Note that the thickness of the insulating layer 114 may be, for example, greater than or equal to 10 nm and less than or equal to 300 nm, preferably greater than or equal to 30 nm and less than or equal to 200 nm.

The insulating layer 103 and the insulating layer 114 may be, for example, a multi-layer film including a silicon nitride film and a silicon oxide film. A silicon oxide film is formed on the side close to the oxide semiconductor layer (or the stack). In this case, a silicon oxynitride film may be used instead of the silicon oxide film. A silicon nitride oxide film may be used instead of the silicon nitride film.

As the silicon oxide film, a silicon oxide film with a low defect density is preferably used. Specifically, a silicon oxide film which has a spin density of $3\times10^{17}$ spins/cm$^3$ or less, preferably $5\times10^{16}$ spins/cm$^3$ or less corresponding to a signal at a g-factor of 2.001 in ESR is used. The silicon oxide film is preferably a silicon oxide film containing excess oxygen because oxygen can be supplied to the oxide semiconductor layer (or the stack). As the silicon nitride film, a silicon nitride film from which hydrogen and ammonia are less released is used. The amount of released hydrogen or ammonia may be measured by TDS. When the silicon nitride film hardly transmits oxygen, it can suppress oxygen release from the oxide semiconductor layer (or the stack).

Note that when the gate insulating layer is thin, gate leakage due to a tunneling effect or the like might become a problem. In order to solve the problem of gate leakage, the above high-k material is preferably used for the gate insulating layer. By using a high-k material for the gate insulating layer, the thickness thereof can be increased for suppression of gate leakage with favorable electrical characteristics of the gate insulating layer maintained. Note that a stacked-layer structure including a layer containing a high-k material and a layer containing any of silicon oxide, silicon nitride, silicon oxynitride, silicon nitride oxide, aluminum oxide, or the like may be employed.

For example, it is preferable that the gate insulating layer include a hafnium oxide film as a layer which is in contact with the stack because the gate leakage of the semiconductor device can be suppressed. Specifically, in each of the transistors 100 and 140, a hafnium oxide film may be provided as the gate insulating layer 111 in contact with the oxide layer 105c. Alternatively, in each of the transistors 120 and 160, a hafnium oxide film may be provided as the gate insulating layer 111 in contact with the oxide layer 105e. The hafnium oxide film may be formed by an MOCVD method.

Further, it is preferable to reduce hydrogen contained in the stack by providing an aluminum oxide film over the stack and making hydrogen contained in the stack diffused to the aluminum oxide film. In other words, it is preferable to provide an aluminum oxide film over the stack and perform gettering of hydrogen contained in the stack by the aluminum oxide film. In particular, the aluminum oxide film is preferably an insulating film containing excess oxygen.

Further, it is preferable to use a silicon oxide film formed by a sputtering method as the gate insulating layer 111, and it is preferable to use an aluminum oxide film, a silicon nitride film, or a silicon nitride oxide film formed by a sputtering method as the insulating layer 114. In particular, the silicon oxide film is preferably an insulating film containing excess oxygen.

In the stack included in the semiconductor device of one embodiment of the present invention, hydrogen, nitrogen, carbon, silicon, and metal elements except for the main components are impurities. In order to reduce the concentration of impurities in the stack, it is preferable to reduce the concentration of impurities in the gate insulating layer and the insulating layer 103 which are adjacent to the stack.

[Stack]

The stack 106a includes the oxide layer 105a, the oxide semiconductor layer 105b over the oxide layer 105a, and the oxide layer 105c over the oxide semiconductor layer 105b. The stack 106b includes the oxide layer 105d, the oxide layer 105a over the oxide layer 105d, the oxide semiconductor layer 105b over the oxide layer 105a, the oxide layer 105c over the oxide semiconductor layer 105b, and the oxide layer 105e over the oxide layer 105c.

Each of the oxide layers 105a, 105c, 105d, and 105e may be an oxide layer having an insulating property or an oxide layer having a semiconductor property (an oxide semiconductor layer).

Each of the oxide layers and the oxide semiconductor layer included in the stack includes In, Ga, or both. Typical examples are an In—Ga oxide (an oxide containing In and Ga), an In—Zn oxide (an oxide containing In and Zn), and an In-M-Zn oxide (an oxide containing In, an element M, and Zn: the element M is one or more kinds of elements selected from Al, Ti, Ga, Y, Zr, La, Ce, Nd, and Hf). The oxide layers and the oxide semiconductor layer may further include Sn, Sc, Gd, or the like.

The contents of indium, gallium, and the like in the oxide layers and the oxide semiconductor layer which are included in the stack can be compared with each other by time-of-flight secondary ion mass spectrometry (ToF-SIMS) or X-ray photoelectron spectrometry (XPS). The interfaces between the oxide semiconductor layer and the oxide layers can be observed by a scanning transmission electron microscopy (STEM).

Note that since the oxide semiconductor layer 105b has an energy gap that is 2 eV or more, preferably 2.5 eV or more, further preferably 3 eV or more, the leakage current when the transistor is off (hereinafter, also referred to as an off-state current) can be reduced.

The oxide layers 105a and 105c which are in contact with the oxide semiconductor layer 105b are each preferably formed using a material containing one or more kinds of metal elements that are the same as those contained in the oxide semiconductor layer 105b. With the use of such a material, an interface state at interfaces between the oxide semiconductor layer 105b and each of the oxide layers 105a and 105c is less likely to be generated. Accordingly, carriers are not likely to be scattered or captured at the interfaces, which results in an improvement in field-effect mobility of the transistor. Further, variation in threshold voltage of the transistor can be reduced.

Similarly, the oxide layer 105d which is in contact with the oxide layer 105a is preferably formed using a material containing one or more kinds of metal elements that are the same as those contained in the oxide layer 105a. With the use of such a material, an interface state at an interface between the oxide layer 105a and the oxide layer 105d is less likely to be generated.

Similarly, the oxide layer 105e which is in contact with the oxide layer 105c is preferably formed using a material containing one or more kinds of metal elements that are the same as those contained in the oxide layer 105c. With the use of such a material, an interface state at an interface between the oxide layer 105c and the oxide layer 105e is less likely to be generated.

The oxide layer 105a and the oxide semiconductor layer 105b are formed successively without exposure to the air so as to be kept in an inert gas atmosphere, an oxidation gas atmosphere, or a reduced pressure, whereby interface states between the oxide layer 105a and the oxide semiconductor layer 105b can be less likely to be generated. The same applies to the formation of the oxide layer 105d and the oxide layer 105a and the formation of the oxide layer 105c and the oxide layer 105e.

When the oxide layer 105c or the oxide layer 105e is provided over the source electrode and the drain electrode, it is difficult for impurities such as water from the outside to reach the oxide semiconductor layer 105b.

The thickness of each oxide layer is, for example, greater than or equal to 3 nm and less than or equal to 100 nm, preferably greater than or equal to 3 nm and less than or equal to 50 nm. The thickness of the oxide semiconductor layer 105b ranges from 3 nm to 200 nm, preferably from 3 nm to 100 nm, more preferably from 3 nm to 50 nm.

When each of the oxide layer 105a and the oxide semiconductor layer 105b is an In-M-Zn oxide, the oxide layer 105a contains In, M, and Zn at an atomic ratio of $x_1:y_1:z_1$, and the oxide semiconductor layer 105b contains In, M, and Zn at an atomic ratio of $x_2:y_2:z_2$, the oxide layer 105a and the oxide semiconductor layer 105b are formed such that $y_1/x_1$ is larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide layer 105a and the oxide semiconductor layer 105b are formed such that $y_1/x_1$ is 1.5 times or more as large as $y_2/x_2$. Further preferably, the oxide layer 105a and the oxide semiconductor layer 105b are formed such that $y_1/x_1$ is twice or more as large as $y_2/x_2$. Still further preferably, the oxide layer 105a and the oxide semiconductor layer 105b are formed such that $y_1/x_1$ is three times or more as large as $y_2/x_2$. When the oxide layer 105a has the above structure, the oxide layer 105a can be a layer in which oxygen vacancies are less likely to occur than in the oxide semiconductor layer 105b.

When each of the oxide semiconductor layer 105b and the oxide layer 105c is an In-M-Zn oxide, the oxide semiconductor layer 105b contains In, M, and Zn at an atomic ratio of $x_2:y_2:z_2$, and the oxide layer 105c contains In, M, and Zn at an atomic ratio of $x_3:y_3:z_3$, the oxide semiconductor layer 105b and the oxide layer 105c are formed such that $y_3/x_3$ is larger than $y_2/x_2$. Preferably, the oxide semiconductor layer 105b and the oxide layer 105c are formed such that $y_3/x_3$ is 1.5 times or more as large as $y_2/x_2$. Further preferably, the oxide semiconductor layer 105b and the oxide layer 105c are formed such that $y_3/x_3$ is twice or more as large as $y_2/x_2$. Still further preferably, the oxide semiconductor layer 105b and the oxide layer 105c are formed such that $y_3/x_3$ is three times or more as large as $y_2/x_2$. When the oxide layer 105c has the above structure, the oxide layer 105c can be a layer in which oxygen vacancies are less likely to occur than in the oxide semiconductor layer 105b.

Similarly, in the case where each of the oxide layer 105a and the oxide layer 105d is an In-M-Zn oxide, when the oxide layer 105a contains In, M, and Zn at an atomic ratio of $x_1:y_1:z_1$ and the oxide layer 105d contains In, M, and Zn at an atomic ratio of $x_4:y_4:z_4$, the oxide layer 105a and the oxide layer 105d are formed such that $y_4/x_4$ is greater than $y_1/x_1$. It is preferable to form the oxide layer 105a and the oxide layer 105d such that $y_4/x_4$ is 1.5 times or more, 2 times or more, or 3 times or more, as much as $y_1/x_1$.

Similarly, in the case where each of the oxide layer 105c and the oxide layer 105e is an In-M-Zn oxide, when the oxide layer 105c contains In, M, and Zn at an atomic ratio of $x_3:y_3:z_3$ and the oxide layer 105e contains In, M, and Zn at an atomic ratio of $x_5:y_5:z_5$, the oxide layer 105c and the oxide layer 105e are formed such that $y_5/x_5$ is greater than $y_3/x_3$. It is preferable to form the oxide layer 105c and the oxide layer 105e such that $y_5/x_5$ is 1.5 times or more, 2 times or more, or 3 times or more, as much as $y_3/x_3$.

In the case where the oxide layer 105a, 105c, 105d or 105e is an In-M-Zn oxide, when the summation of In and M is assumed to be 100 atomic %, it is preferable that the proportion of In be less than 50 atomic % and the proportion of M be greater than or equal to 50 atomic %. It is more preferable that the proportion of In be less than 25 atomic % and the proportion of M be greater than or equal to 75 atomic %. In the case of using an In-M-Zn oxide as the oxide semiconductor layer 105b, when the summation of In and M is assumed to be 100 atomic %, it is preferable that the proportion of In be less than 25 atomic % and the proportion of M be greater than or equal to 75 atomic %. It is more preferable that the proportion of In be less than 34 atomic % and the proportion of M be greater than or equal to 66 atomic %.

For example, for each of the oxide layers 105a and 105c containing In, Ga, or both, an In—Ga—Zn oxide layer including In, Ga, and Zn at an atomic ratio of 1:3:2, 1:3:4, 1:6:2, 1:6:4, 1:6:10, 1:9:6, or 1:9:0 can be used; and for the oxide semiconductor layer 105b, an In—Ga—Zn oxide including In, Ga, and Zn at an atomic ratio of 1:1:1 or 3:1:2 can be used. For example, an In—Ga—Zn oxide including In, Ga, and Zn at an atomic ratio of 1:3:2, 1:3:4, 1:6:2, 1:6:4, 1:6:10, 1:9:6, or 1:9:0 can be used for each of the oxide layers 105a, 105c, 105d, and 105e containing In, Ga, or both; and an In—Ga—Zn oxide including In, Ga, and Zn at an atomic ratio of 1:1:1 or 3:1:2 can be used for the oxide semiconductor layer 105b. Note that the atomic ratio of each of the oxide layers 105a, 105c, 105d, and 105e and the oxide semiconductor layer 105b may vary within a range of ±20% of the above atomic ratio.

The atomic ratio is not limited to the above, and the atomic ratio may be appropriately set in accordance with needed semiconductor characteristics.

In order to give stable electrical characteristics to the transistor including the stack, it is preferable that oxygen vacancies and the impurity concentration in the oxide semiconductor layer 105b be reduced so that the oxide semiconductor layer 105b can be regarded as an intrinsic or substantially intrinsic semiconductor layer. Further, it is preferable that the channel formation region of the oxide semiconductor layer 105b be regarded as an intrinsic or substantially intrinsic semiconductor layer.

In the oxide semiconductor layer 105b in which the channel of the transistor is formed, defects, typically oxygen vacancies, are preferably reduced as much as possible. For example, it is preferable that the spin density (the density of defects in the oxide semiconductor) at a g-value of 1.93 in electron spin resonance spectroscopy in which a magnetic field is applied in parallel to the film surface be reduced to lower than or equal to the lower detection limit of measurement equipment. When the defects, typically the oxygen vacancies, in the oxide semiconductor are reduced as much as possible, the transistor can be prevented from being normally on, leading to improvement in the electrical characteristics and the reliability of a semiconductor device. In addition, power consumption of the semiconductor device can be reduced.

The shift of the threshold voltage of a transistor in the negative direction may be caused by not only oxygen vacancies but also hydrogen (including a hydrogen compound such as water) contained in an oxide semiconductor. Hydrogen contained in the oxide semiconductor reacts with oxygen bonded to a metal atom to be water, and in addition, defects (oxygen vacancies) are formed in a lattice from which oxygen is released (or a portion from which oxygen is released). In addition, the reaction of part of hydrogen and oxygen causes generation of electrons serving as carriers. Thus, a transistor including an oxide semiconductor which contains hydrogen is likely to be normally on.

In the oxide semiconductor layer 105b, hydrogen, nitrogen, carbon, silicon, and metal elements except for the main components are impurities. In order to reduce the concentration of impurities in the oxide semiconductor layer 105b, it is also preferable to reduce the concentration of impurities in the oxide layers 105a and 105c which are close to the oxide semiconductor layer 105b to a value almost equal to that in the oxide semiconductor layer 105b. It is preferable that the concentration of impurities in the oxide layers 105d and 105e be also reduced to a value almost equal to that in the oxide semiconductor layer 105b.

For example, hydrogen and nitrogen in the oxide semiconductor layer 105b form donor levels, which increase a carrier density. Particularly when silicon is contained in the oxide semiconductor layer 105b at a high concentration, an impurity level due to silicon is formed in the oxide semiconductor layer 105b. In some cases, the impurity level becomes a trap, which deteriorates electrical characteristics of the transistor.

Thus, in one embodiment of the present invention, the carrier density of the oxide semiconductor layer 105b is smaller than $1\times10^{17}/cm^3$, smaller than $1\times10^{15}/cm^3$, or smaller than $1\times10^{13}/cm^3$.

In one embodiment of the present invention, the concentration of hydrogen in all of or a part of the oxide semiconductor layer 105b, which is measured by secondary ion mass spectrometry (SIMS), is set to lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

In one embodiment of the present invention, the concentration of nitrogen in all of or a part of the oxide semiconductor layer 105b, which is measured by SIMS, is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In one embodiment of the present invention, the concentration of carbon in all of or a part of the oxide semiconductor layer 105b, which is measured by SIMS, is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In one embodiment of the present invention, the concentration of silicon in all of or a part of the oxide semiconductor layer 105b, which is measured by SIMS, is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In one embodiment of the present invention, the amount of each of the following gas molecules (atoms) released from the second oxide semiconductor layer 105b can be less than or equal to $1 \times 10^{19}$/cm$^3$, preferably less than or equal to $1 \times 10^{18}$/cm$^3$, which is measured by TDS analysis: a gas molecule (atom) having a m/z of 2 (e.g., hydrogen molecule), a gas molecule (atom) having a m/z of 18, a gas molecule (atom) having a m/z of 28, and a gas molecule (atom) having a m/z of 44.

Further, in one embodiment of the present invention, the concentration of an alkali metal or an alkaline earth metal of the oxide semiconductor layer 105b is lower than or equal to $1 \times 10^{18}$ atoms/cm$^3$, preferably lower than or equal to $2 \times 10^{16}$ atoms/cm$^3$, when measured by SIMS. When an alkali metal or an alkaline earth metal is bonded to an oxide semiconductor, carriers are generated in some cases. This might lead to an increase in off-state current of the transistor.

When the oxide semiconductor layer 105b is highly purified by reducing impurities (such as hydrogen, nitrogen, an alkali metal, and an alkaline earth metal) as much as possible, the transistor becomes an enhancement-type transistor and can be prevented from having normally-on characteristics, so that the off-state current of the transistor can be significantly reduced. Accordingly, a semiconductor device having favorable electrical characteristics can be manufactured. Further, a semiconductor device with improved reliability can be manufactured.

A structure of an oxide semiconductor film is described below.

An oxide semiconductor film is classified roughly into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of c-axis aligned crystal parts.

In a transmission electron microscope (TEM) image of the CAAC-OS film, a clear boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom film has a morphology reflected by a surface over which the CAAC-OS film is formed (hereinafter, a surface over which the CAAC-OS film is formed is referred to as a formation surface) or the top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of the top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of the top surface. Thus, for example, in the case where a shape of the CAAC-OS film is changed by etching or the like, the c-axis might not be necessarily parallel to a normal vector of a formation surface or a normal vector of the top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having a low impurity concentration. The impurity means an element other than the main components of the oxide semiconductor film, such as hydrogen, carbon, silicon, or a transition metal element. In particular, an element (e.g., silicon) having higher strength of bonding to oxygen than a metal element included in the oxide semiconductor film takes oxygen away in the oxide semiconductor film to disrupt the atomic arrangement in the oxide semiconductor film, which causes a lowering of the crystallinity of the oxide semiconductor film. A heavy metal such as iron or nickel, argon, carbon dioxide, or the like has a large atomic radius (or molecular radius), and thus disrupts the atomic arrangement in the oxide semiconductor film when included in the oxide semiconductor film, which causes a lowering of the crystallinity of the oxide semiconductor film. Note that the impurity included in the oxide semiconductor film serves as a carrier trap or a carrier generation source in some cases.

The CAAC-OS film is an oxide semiconductor film having a low density of defect states. For example, oxygen vacancies in the oxide semiconductor film serve as carrier traps or serve as carrier generation sources when hydrogen is trapped therein.

The state in which impurity concentration is low and the density of defect states is low (few oxygen vacancies) is referred to as "highly purified intrinsic" or "substantially highly purified intrinsic". A highly purified intrinsic or substantially highly purified intrinsic oxide semiconductor film has few carrier generation sources, and thus has a low carrier density. Thus, a transistor including the oxide semiconductor film rarely has a negative threshold voltage (is rarely normally-on). A highly purified intrinsic or substantially highly purified intrinsic oxide semiconductor film has few carrier traps. Thus, the transistor including the oxide semiconductor film has a small variation in electrical characteristics and accordingly has high reliability. Charges trapped by the carrier traps in the oxide semiconductor film take a long time to be released and may behave like fixed charges. Thus, the transistor including the oxide semiconductor film with a high impurity concentration and a high density of defect states has unstable electrical characteristics in some cases.

In a transistor using the CAAC-OS film, a change in electrical characteristics due to irradiation with visible light or ultraviolet light is small.

In order that the oxide semiconductor layer 105b is the CAAC-OS film, the surface where the oxide semiconductor layer 105b is formed is preferably amorphous. When the surface where the oxide semiconductor layer 105b is formed is crystalline, the crystallinity of the oxide semiconductor layer 105b is easily disordered and the CAAC-OS film is not easily formed.

A surface where the oxide semiconductor layer 105b is formed may have a crystalline structure similar to that of a CAAC-OS film. In the case where the surface where the oxide semiconductor layer 105b is formed has a structure similar to that of the CAAC-OS film, the oxide semiconductor layer 105b easily becomes the CAAC-OS film.

Accordingly, in order that the oxide semiconductor layer 105b is a CAAC-OS film, it is preferable that the oxide layer 105a be amorphous or have a crystalline structure similar to that of a CAAC-OS film.

In addition, when the oxide semiconductor layer 105b is the CAAC-OS film, the oxide layer 105c formed over the oxide semiconductor layer 105b tends to have a crystalline structure similar to that of the CAAC-OS film. Note that the oxide layer 105c does not necessarily have the crystalline structure but may have an amorphous structure.

In the transistor including the stack, the oxide semiconductor layer 105b is a layer in which a channel is formed; thus, it is preferable that the oxide semiconductor layer 105b have high crystallinity so that the transistor can have stable electrical characteristics.

Next, a polycrystalline oxide semiconductor film is described.

In an image obtained with a TEM, for example, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of $2\theta$ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film is described.

In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a boundary between crystal parts is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In an image obtained with a TEM, crystal parts cannot be found in the amorphous oxide semiconductor film.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor film can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may be a stacked film including two or more films of an amorphous oxide semiconductor film, a microcrystalline oxide semiconductor film, and a CAAC-OS film, for example.

Note that the oxide semiconductor film may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

[Gate Electrode, Source Electrode, and Drain Electrode]

Electrodes included in the semiconductor device are described. Specifically, the gate electrodes 113 and 123, the source electrodes 107*a* and 109*a*, and the drain electrodes 107*b* and 109*b* are described.

As a conductive material for forming the electrodes included in the semiconductor device (the gate electrode, the source electrode, and the drain electrode), a metal element selected from aluminum, chromium, copper, silver, gold, platinum, tantalum, nickel, titanium, molybdenum, tungsten, hafnium, vanadium, niobium, manganese, magnesium, zirconium, beryllium, and the like; an alloy containing any of these metal elements as a component; an alloy containing any of these metal elements in combination; or the like can be used. Alternatively, a semiconductor typified by polycrystalline silicon including an impurity element such as phosphorus, or silicide such as nickel silicide may be used. There is no particular limitation on a formation method of the conductive film, and a variety of formation methods such as an evaporation method, a CVD method, a sputtering method, and a spin coating method can be employed.

The electrodes included in the semiconductor device can also be formed using a conductive material containing oxygen, such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a stacked-layer structure formed using the above conductive material containing oxygen and a material containing the above metal element.

For the electrodes included in the semiconductor device, for example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, or a three-layer structure in which a titanium film, an aluminum film, and a titanium film are stacked in this order can be used. Alternatively, a film, an alloy film, or a nitride film which contains aluminum and one or more elements selected from titanium, tantalum, tungsten, molybdenum, chromium, neodymium, and scandium may be used.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode and the gate insulating layer. These layers each have a work function of 5 eV or higher and the electron affinity of each of these layers is larger than that of an oxide semiconductor; thus, the threshold voltage of the transistor including an oxide semiconductor in a semiconductor layer in which a channel is formed can be shifted in a positive direction. Accordingly, what is called a normally-off switching element can be obtained. For example, in the case of providing an In—Ga—Zn-based oxynitride semiconductor film between the gate electrode and the gate insulating film, an In—Ga—Zn-based oxynitride semiconductor film whose nitrogen concentration is higher than at least the nitrogen concentration of the oxide semiconductor layer 105*b*, specifically, an In—Ga—Zn-based oxynitride semiconductor film whose nitrogen concentration is higher than or equal to 7 at. % is provided.

Note that the thickness of the gate electrode may be greater than or equal to 10 nm and less than or equal to 500 nm, preferably greater than or equal to 50 nm and less than or equal to 300 nm. The thickness of the source electrode 107*a* and the drain electrode 107*b* may be greater than or equal to 10 nm and less than or equal to 500 nm, preferably greater than or equal to 50 nm and less than or equal to 300 nm. The thickness of the source electrode 109*a* and the drain electrode 109*b* is preferably greater than or equal to 5 nm and less than or equal to 500 nm, further preferably greater than or equal to 10 nm and less than or equal to 300 nm, still further preferably greater than or equal to 10 nm and less than or equal to 100 nm.

The conductive layer 117*a* electrically connecting the source electrode 107*a* to the source electrode 109*a* and the conductive layer 117*b* electrically connecting the drain electrode 107*b* to the drain electrode 109*b* can be formed using the above-described conductive materials for forming the electrodes included in the semiconductor device.

<<Energy Band Structure of Stack>>

A function and an effect of the stack in this embodiment are described using energy band structure diagrams of FIGS. 7A to 7D.

The stack included in the semiconductor device of one embodiment of the present invention has a well-shaped structure (also referred to as a well structure) in which the bottom of the conduction band of the oxide semiconductor layer is at the deepest energy level and in which a channel is formed in the oxide semiconductor layer. To form such a structure, the depth from the vacuum level to the bottom of the conduction band (also referred to as electron affinity) of the oxide semiconductor layer is preferably greater than that of each oxide layer included in the stack. Specifically, the electron affinity of the oxide semiconductor layer is preferably higher than that of each oxide layer by 0.2 eV or more.

Figure 7A:
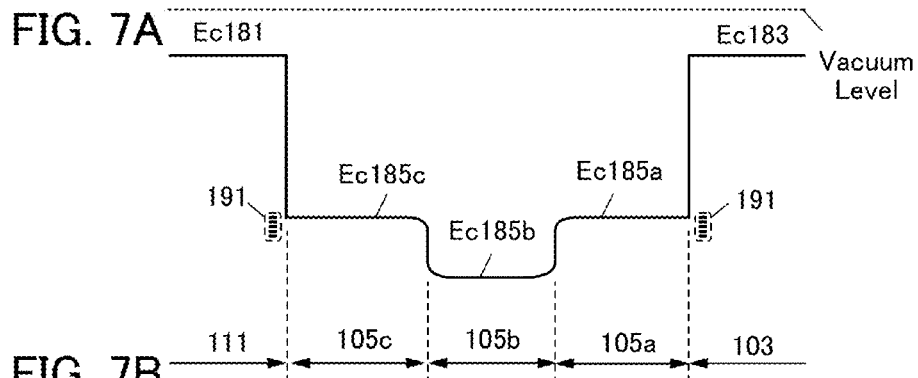
FIGS. 7A to 7D each illustrate an energy band structure of a stack.

FIG. 7A shows an energy band structure from the insulating layer 103 to the gate insulating layer 111 in the semiconductor device of one embodiment of the present invention including the stack 106*a*. In FIG. 7A, Ec183, Ec185*a*, Ec185*b*, Ec185*c*, and Ec181 are the energies of bottoms of the conduction bands in the insulating layer 103, the oxide layer 105*a*, the oxide semiconductor layer 105*b*, the oxide layer 105*c*, and the gate insulating layer 111, respectively.

Figure 7B:
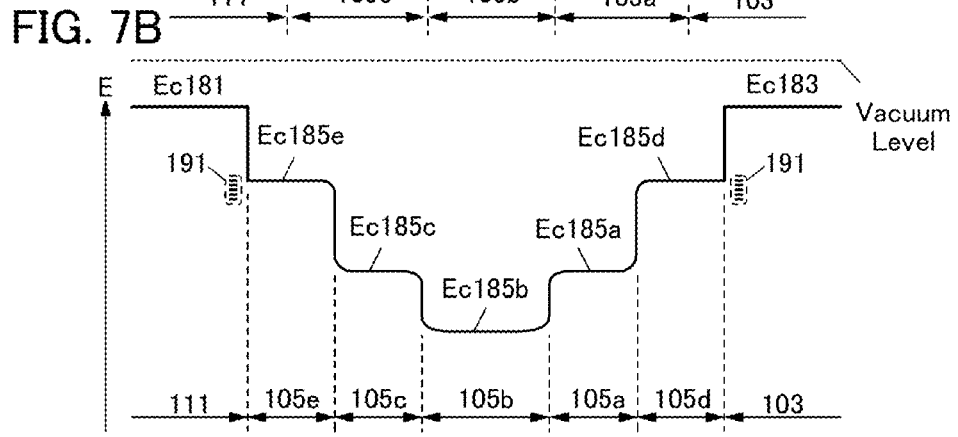

FIG. 7B shows an energy band structure from the insulating layer 103 to the gate insulating layer 111 in the semiconductor device of one embodiment of the present invention including the stack 106*b*. In FIG. 7B, Ec183, Ec185*d*, Ec185*a*, Ec185*b*, Ec185*c*, Ec185*e*, and Ec181 are the energies of bottoms of the conduction bands in the insulating layer 103, the oxide layer 105*d*, the oxide layer 105*a*, the oxide semiconductor layer 105b, the oxide layer 105c, the oxide layer 105e, and the gate insulating layer 111, respectively.

Here, an energy difference between the vacuum level and the bottom of the conduction band (also referred to as electron affinity) corresponds to a value obtained by subtracting an energy gap from an energy difference between the vacuum level and the top of the valence band (also referred to as an ionization potential). Note that the energy gap can be measured using a spectroscopic ellipsometer (UT-300 manufactured by HORIBA JOBIN YVON). The energy difference between the vacuum level and the top of the valence band can be measured using an ultraviolet photoelectron spectroscopy (UPS) device (VersaProbe manufactured by ULVAC-PHI, Inc.).

The insulating layer 103 and the gate insulating layer 111 are insulators; therefore, Ec183 and Ec181 are closer to the vacuum level than Ec185a, Ec185b, Ec185c, Ec185d, and Ec185e are (in other words, Ec183 and Ec181 have smaller electron affinities than those of Ec185a, Ec185b, Ec185c, Ec185d, and Ec185e).

In FIGS. 7A and 7B, Ec185a is closer to the vacuum level than Ec185b is. Specifically, Ec185a is located closer to the vacuum level than Ec185b is by 0.05 eV or more, 0.07 eV or more, 0.1 eV or more, or 0.15 eV or more and 2 eV or less, 1 eV or less, 0.5 eV or less, or 0.4 eV or less.

In FIGS. 7A and 7B, Ec185c is closer to the vacuum level than Ec185b is. Specifically, Ec185c is located closer to the vacuum level than Ec185b is by 0.05 eV or more, 0.07 eV or more, 0.1 eV or more, or 0.15 eV or more and 2 eV or less, 1 eV or less, 0.5 eV or less, or 0.4 eV or less.

In FIG. 7B, Ec185d is closer to the vacuum level than Ec185a is. Specifically, Ec185d is located closer to the vacuum level than Ec185a is by 0.05 eV or more, 0.07 eV or more, 0.1 eV or more, or 0.15 eV or more and 2 eV or less, 1 eV or less, 0.5 eV or less, or 0.4 eV or less.

In FIG. 7B, Ec185e is closer to the vacuum level than Ec185c is. Specifically, Ec185e is located closer to the vacuum level than Ec185c is by 0.05 eV or more, 0.07 eV or more, 0.1 eV or more, or 0.15 eV or more and 2 eV or less, 1 eV or less, 0.5 eV or less, or 0.4 eV or less.

Further, in each of FIGS. 7A and 7B, the energy of the bottom of the conduction band between the oxide layer 105a and the oxide semiconductor layer 105b and the energy of the bottom of the conduction band between the oxide semiconductor layer 105b and the oxide layer 105c are continuously changed. In other words, no state or few states exist at these interfaces. Further, in FIG. 7B, the energy of the bottom of the conduction band between the oxide layer 105d and the oxide layer 105a and the energy of the bottom of the conduction band between the oxide layer 105c and the oxide layer 105e are continuously changed. That is, no interface state or few interface states exist at these interfaces.

Accordingly, electrons transfer mainly through the oxide semiconductor layers 105b in the stacks 106a and 106b having energy band structures like those in the FIGS. 7A and 7B. Therefore, even when an interface state exists at an interface with the insulating layer that is the outside of the stack, the interface state hardly influences the transfer of the electrons. In addition, since no interface state or few interface states exist between the layers included in the stack, the transfer of electrons is not interrupted in the region. Accordingly, the oxide semiconductor layer 105b has high electron mobility.

Note that although trap levels 191 due to impurities or defects might be formed in the vicinity of the interface between the oxide layer 105a and the insulating layer 103 and in the vicinity of the interface between the oxide layer 105c and the gate insulating layer 111 as illustrated in FIG. 7A, the oxide semiconductor layer 105b can be separated from the trap levels owing to the existence of the oxide layer 105a and the oxide layer 105c.

Similarly, although the trap levels 191 due to impurities or defects might be formed in the vicinity of the interface between the oxide layer 105d and the insulating layer 103 and in the vicinity of the interface between the oxide layer 105e and the gate insulating layer 111 as illustrated in FIG. 7B, the oxide semiconductor layer 105b can be separated from the trap levels owing to the existence of the oxide layer 105a, the oxide layer 105c, the oxide layer 105d, and the oxide layer 105e.

However, in FIG. 7A, when the energy difference between Ec185a and Ec185b or the energy difference between Ec185c and Ec185b is small, an electron in the oxide semiconductor layer 105b might reach the trap level by passing over the energy difference. Electrons are trapped in the trap level, whereby a negative fixed charge is caused at the interface with the insulating film, whereby the threshold voltage of the transistor is shifted in the positive direction.

Therefore, each of the energy differences between Ec185a and Ec185b and between Ec185c and Ec185b is preferably set to be larger than or equal to 0.1 eV, further preferably larger than or equal to 0.15 eV, in which case a change in the threshold voltage of the transistor can be reduced and the transistor can have favorable electrical characteristics.

Similarly, in FIG. 7B, when the energy difference between Ec185d and Ec185b or the energy difference between Ec185e and Ec185b is small, an electron in the oxide semiconductor layer 105b might reach the trap level by passing over the energy difference.

Each of the energy differences between Ec185d and Ec185b and between Ec185e and Ec185b is preferably set to be larger than or equal to 0.1 eV, further preferably larger than or equal to 0.15 eV, in which case a change in the threshold voltage of the transistor can be reduced and the transistor can have favorable electrical characteristics.

As the stack 106a having such an energy band structure shown in FIG. 7A, for example, a stack including the oxide layer 105a and the oxide layer 105c which are formed using an In—Ga—Zn oxide including In, Ga, and Zn at an atomic ratio of 1:3:2, 1:6:4, or 1:9:6 and the oxide semiconductor layer 105b which is formed using an In—Ga—Zn oxide including In, Ga, and Zn at an atomic ratio of 1:1:1 or 3:1:2 can be given.

That is, in the case where each layer of the stack is formed using an In-M-Zn oxide, for a layer whose energy of the bottom of the conduction band is to be close to the vacuum level, an In-M-Zn oxide in which the proportion of the element M is higher than In is used.

Figure 7C:
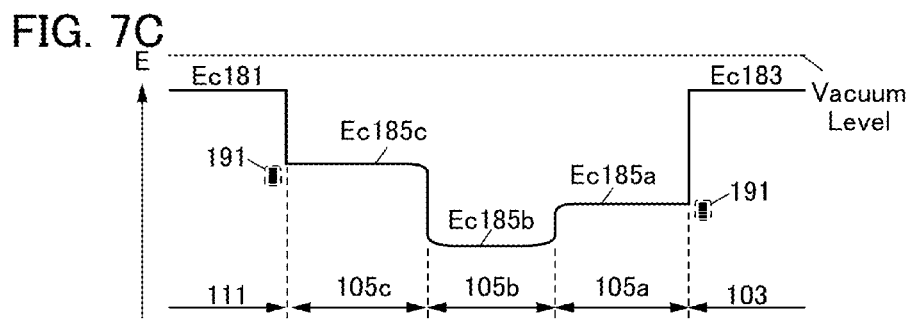
Figure 7D:
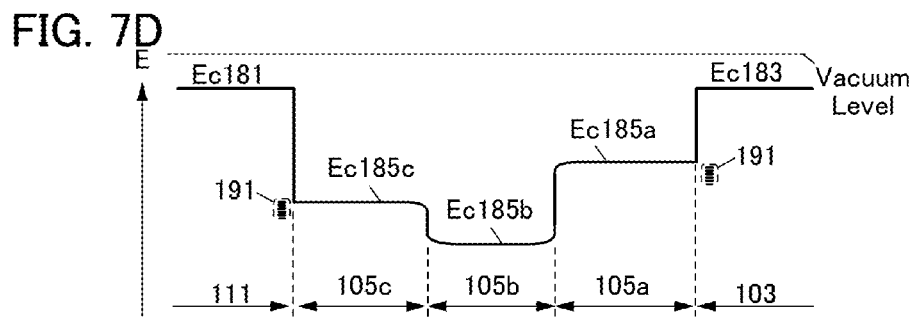

As shown in FIGS. 7C and 7D, the oxide layer 105a may be different from the oxide layer 105c in the height of the energy of the bottom of the conduction band.

As the stack 106a having such an energy band structure shown in FIG. 7C, for example, a stack including the oxide layer 105c which is formed using an In—Ga—Zn oxide layer including In, Ga, and Zn at an atomic ratio of 1:9:6, the oxide semiconductor layer 105a which is formed using an In—Ga—Zn oxide layer including In, Ga, and Zn at an atomic ratio of 1:3:2 or 1:6:4, and the oxide semiconductor layer 105b which is formed using an In—Ga—Zn oxide layer including In, Ga, and Zn at an atomic ratio of 1:1:1 or 3:1:2 can be given. Further, a stack including the oxide layer 105c which is formed using an In—Ga—Zn oxide layer including In, Ga, and Zn at an atomic ratio of 1:6:4, the oxide semiconductor layer 105a which is formed using an In—Ga—Zn oxide layer including In, Ga, and Zn at an atomic ratio of 1:3:2, and the oxide semiconductor layer 105b which is formed using an In—Ga—Zn oxide layer including In, Ga, and Zn at an atomic ratio of 1:1:1 or 3:1:2 can be given.

As the stack 106a having such an energy band structure shown in FIG. 7D, for example, a stack including the oxide layer 105a which is formed using an In—Ga—Zn oxide layer including In, Ga, and Zn at an atomic ratio of 1:9:6, the oxide layer 105c which is formed using an In—Ga—Zn oxide layer including In, Ga, and Zn at an atomic ratio of 1:3:2 or 1:6:4, and the oxide semiconductor layer 105b which is formed using an In—Ga—Zn oxide layer including In, Ga, and Zn at an atomic ratio of 1:1:1 or 3:1:2 can be given. Further, a stack including the oxide layer 105a which is formed using an In—Ga—Zn oxide layer including In, Ga, and Zn at an atomic ratio of 1:6:4, the oxide layer 105c which is formed using an In—Ga—Zn oxide layer including In, Ga, and Zn at an atomic ratio of 1:3:2, and the oxide semiconductor layer 105b which is formed using an In—Ga—Zn oxide layer including In, Ga, and Zn at an atomic ratio of 1:1:1 or 3:1:2 can be given.

As the stack 106b having such an energy band structure shown in FIG. 7B, for example, a stack including the oxide layers 105d and 105e each of which is formed using an In—Ga—Zn oxide layer including In, Ga, and Zn at an atomic ratio of 1:9:6, the oxide layers 105a and 105c each of which is formed using an In—Ga—Zn oxide layer including In, Ga, and Zn at an atomic ratio of 1:3:2 or 1:6:4, and the oxide semiconductor layer 105b which is formed using an In—Ga—Zn oxide layer including In, Ga, and Zn at an atomic ratio of 1:1:1 or 3:1:2 can be given. Further, a stack including the oxide layers 105d and 105e each of which is formed using an In—Ga—Zn oxide layer including In, Ga, and Zn at an atomic ratio of 1:6:4, the oxide layers 105a and 105c which are formed using an In—Ga—Zn oxide layer including In, Ga, and Zn at an atomic ratio of 1:3:2, and the oxide semiconductor layer 105b which is formed using an In—Ga—Zn oxide layer including In, Ga, and Zn at an atomic ratio of 1:1:1 or 3:1:2 can be given.

Each oxide layer preferably has a wider band gap than that of the oxide semiconductor layer 105b.

This embodiment can be implemented in appropriate combination with the structures described in the other embodiments.

(Embodiment 2)

In this embodiment, a manufacturing method of a semiconductor device according to one embodiment of the present invention is described with reference to FIGS. 8A to 8D, FIGS. 9A and 9B, FIGS. 10A and 10B, FIGS. 11A and 11B, FIGS. 12A to 12C, and FIGS. 13A and 13B.

<Example of Method for Manufacturing Semiconductor Device>

As an example of a method for manufacturing a semiconductor device of one embodiment of the present invention, an example of a method for manufacturing the transistor 100 is described with reference to FIGS. 8A to 8D.

[Formation of Insulating Layer]

First, the insulating layer 103 is formed over the substrate 101. As described above, it is preferable that the insulating layer 103 be a film containing excess oxygen and be formed using a material containing oxygen which can be a source for supplying oxygen to the stack.

In order to make the insulating layer 103 excessively contain oxygen, the insulating layer 103 may be formed in an oxygen atmosphere, for example. Alternatively, the insulating layer 103 may excessively contain oxygen in such a manner that oxygen is introduced into the insulating layer 103 which has been formed. Both the methods may be combined.

For example, oxygen (at least including any of oxygen radicals, oxygen atoms, and oxygen ions) is introduced into the insulating layer 103 which has been formed, whereby a region excessively containing oxygen is formed. As a method for introducing oxygen, an ion implantation method, an ion doping method, a plasma immersion ion implantation method, plasma treatment, or the like may be used.

A gas containing oxygen can be used for oxygen introducing treatment. As the gas containing oxygen, oxygen, dinitrogen monoxide, nitrogen dioxide, carbon dioxide, carbon monoxide, or the like can be used. Further, a rare gas may be contained in the gas containing oxygen in the oxygen introducing treatment.

Here, an example is described in which a glass substrate is used as the substrate 101, and a multi-layer film including a silicon nitride film, a first silicon oxide film, and a second silicon oxide film is used as the insulating layer 103.

First, a silicon nitride film is formed over the substrate 101. The silicon nitride film is preferably formed by a plasma CVD method, which is a kind of CVD method. Specifically, the silicon nitride film may be formed by supplying high-frequency power under the following conditions: the substrate temperature is higher than or equal to 180° C. and lower than or equal to 400° C., preferably higher than or equal to 200° C. and lower than or equal to 370° C.; a deposition gas containing silicon, a nitrogen gas, and an ammonia gas are used; and the pressure is higher than or equal to 20 Pa and lower than or equal to 250 Pa, preferably higher than or equal to 40 Pa and lower than or equal to 200 Pa.

Note that the flow rate of the nitrogen gas is set to 5 times or more and 50 times or less, preferably 10 times or more and 50 times or less the flow rate of the ammonia gas. The use of the ammonia gas facilitates decomposition of the deposition gas containing silicon and the nitrogen gas. This is because an ammonia gas is dissociated by plasma energy and heat energy, and energy generated by the dissociation contributes to decomposition of a molecular bond of the deposition gas containing silicon and a molecular bond of the nitrogen gas.

Through the above method, the silicon nitride film from which the hydrogen gas and the ammonia gas are less likely to be released can be formed. Further, owing to the low hydrogen content, a dense silicon nitride film through which hydrogen, water, and oxygen do not permeate or hardly permeate can be formed.

Next, a first silicon oxide film is formed. The first silicon oxide film is preferably formed by a plasma CVD method. Specifically, high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode under the following conditions: the substrate temperature is higher than or equal to 160° C. and lower than or equal to 350° C., preferably higher than or equal to 180° C. and lower than or equal to 260° C.; a deposition gas containing silicon and an oxidation gas are used; and the pressure is higher than or equal to 100 Pa and lower than or equal to 250 Pa, preferably higher than or equal to 100 Pa and lower than or equal to 200 Pa.

According to the above-described method, the gas decomposition efficiency in plasma is enhanced, oxygen radicals are increased, and oxidation of the gas is promoted; as a result, the first silicon oxide film can contain excess oxygen.

Then, a second silicon oxide film is formed. The second silicon oxide film is preferably formed by a plasma CVD method. Specifically, high-frequency power is supplied to an electrode under the following conditions: the substrate temperature is higher than or equal to 180° C. and lower than or equal to 400° C., preferably higher than or equal to 200° C.

and lower than or equal to 370° C.; a deposition gas containing silicon and an oxidizing gas are used; and the pressure is higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

Note that when the flow rate of the oxidizing gas is 100 times or more the flow rate of the deposition gas containing silicon, the hydrogen content and dangling bonds in the second silicon oxide film can be reduced.

In such a manner, the second silicon oxide film whose defect density is lower than that of the first silicon oxide film is formed. In other words, the second silicon oxide film can have a density of a spin corresponding to a signal with a g factor of 2.001 in ESR less than or equal to $3 \times 10^{17}$ spins/cm$^3$, preferably less than or equal to $5 \times 10^{16}$ spins/cm$^3$.

After the silicon nitride film is formed, treatment for adding oxygen to the silicon nitride film may be performed. Further, after the first silicon oxide film is formed, treatment for adding oxygen to the first silicon oxide film may be performed. Furthermore, after the second silicon oxide film is formed, treatment for adding oxygen to the second silicon oxide film may be performed.

[Formation of Stack 1]

Next, the oxide layer 105a and the oxide semiconductor layer 105b are formed over the insulating layer 103.

The oxide layer 105a and the oxide semiconductor layer 105b each can be formed by a sputtering method, a coating method, a pulsed laser deposition method, a laser ablation method, or the like.

In the case where the oxide layer 105a and the oxide semiconductor layer 105b containing In, Ga, or both are formed by a sputtering method, a high-frequency (RF) power supply device, an alternate current (AC) power supply device, a direct current (DC) power supply device, or the like can be used as appropriate as a power supply device for generating plasma.

As a sputtering gas, a rare gas (typically argon), oxygen, or a mixed gas of a rare gas and oxygen is used as appropriate. In the case of using the mixed gas of a rare gas and oxygen, the proportion of oxygen is preferably higher than that of a rare gas. A gas having a low impurity concentration is used as the sputtering gas. Specifically, a sputtering gas whose dew point is −80° C. or lower, preferably −100° C. or lower, further preferably −120° C. or lower is used.

A target is selected as appropriate in accordance with the compositions of the oxide layer 105a and the oxide semiconductor layer 105b which are to be formed.

Note that heating during the formation of the oxide layer 105a and the oxide semiconductor layer 105b may be performed at a substrate temperature of higher than or equal to 100° C. and lower than or equal to 500° C., preferably higher than or equal to 170° C. and lower than or equal to 350° C.

In this embodiment, the oxide layer 105a which is amorphous and the oxide semiconductor layer 105b which is crystalline are formed by a sputtering method. First, an In—Ga—Zn oxide layer having an atomic ratio of In:Ga:Zn=1:3:2 is formed as the oxide layer 105a over the insulating layer 103. Then, an In—Ga—Zn oxide layer having an atomic ratio of In:Ga:Zn=1:1:1 is formed as the oxide semiconductor layer 105b over the oxide layer 105a.

Further, it is preferable that the oxide semiconductor layer 105b which is crystalline be a CAAC-OS. A method for forming a CAAC-OS is described later.

In a transistor in which a CAAC-OS is used for a semiconductor layer in which a channel is formed, a change in electric characteristics due to irradiation with visible light or ultraviolet light is small. Thus, the transistor in which a CAAC-OS is used for the oxide semiconductor layer including the channel has high reliability.

An oxide semiconductor layer (or the stack) which is formed by a sputtering method contains hydrogen, water, a compound having a hydroxyl group, or the like in some cases. Hydrogen, water, and the like easily form a donor level and thus serve as impurities in the oxide semiconductor. Therefore, in the formation of an oxide semiconductor layer by a sputtering method, the hydrogen concentration of the oxide semiconductor layer is preferably reduced as much as possible. Also in the formation of an oxide layer by a sputtering method, the hydrogen concentration of the oxide layer is preferably reduced as much as possible.

When the leakage rate of the treatment chamber of the sputtering apparatus is set to lower than or equal to $1 \times 10^{-10}$ Pa·m$^3$/second at the formation of the oxide semiconductor layer and the oxide layer, entry of impurities such as an alkali metal or hydride into the oxide semiconductor layer and the oxide layer that is being formed by a sputtering method can be reduced. Further, with the use of an entrapment vacuum pump (e.g., a cryopump) as an evacuation system, counter flow of impurities such as an alkali metal, a hydrogen atom, a hydrogen molecule, water, a compound having a hydroxyl group, and hydride from the evacuation system can be reduced.

When the purity of the target is set to 99.99% or higher, entry of alkali metal, hydrogen atoms, hydrogen molecules, water, a hydroxyl group, hydride, and the like into the oxide semiconductor layer and the oxide layer can be suppressed. In addition, when the target is used, the concentration of alkali metal such as lithium, sodium, or potassium in the oxide semiconductor layer and the oxide layer can be reduced. The silicon concentration of the target is preferably lower than or equal to $1 \times 10^{18}$ atoms/cm$^3$.

In order that impurities such as moisture and hydrogen in the oxide layer 105a and the oxide semiconductor layer 105b are further reduced (dehydration or dehydrogenation are performed) to highly purify the oxide layer 105a and the oxide semiconductor layer 105b, the oxide layer 105a and the oxide semiconductor layer 105b are preferably subjected to heat treatment. For example, the oxide layer 105a and the oxide semiconductor layer 105b are subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere containing an oxidation gas such as oxygen, ozone, or nitrogen oxide at 10 ppm or higher. The inert gas atmosphere refers to an atmosphere containing the oxidation gas at lower than 10 ppm and is filled with nitrogen or a rare gas.

The heat treatment may be performed at a temperature higher than or equal to 250° C. and lower than or equal to 650° C., preferably higher than or equal to 300° C. and lower than or equal to 500° C. The treatment time is 3 minutes to 24 hours. Heat treatment for over 24 hours is not preferable because the productivity is reduced.

There is no particular limitation on a heating apparatus used for the heat treatment, and the apparatus may be provided with a device for heating an object to be processed by heat radiation or heat conduction from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

By the heat treatment, impurities such as hydrogen (water or a compound having a hydroxyl group) can be released from the oxide layer 105a and the oxide semiconductor layer 105b. Thus, the impurities in the oxide layer 105a and the oxide semiconductor layer 105b can be reduced, so that the oxide layer 105a and the oxide semiconductor layer 105b can be highly purified. Further, in particular, hydrogen serving as an unstable carrier source can be detached from the oxide layer 105a and the oxide semiconductor layer 105b; therefore, the negative shift of the threshold voltage of the transistor can be prevented. As a result, the reliability of the transistor can be improved.

By heat treatment performed in an atmosphere containing an oxidation gas, oxygen vacancies in the oxide layer 105a and the oxide semiconductor layer 105b can be reduced at the same time as the release of the impurities. The heat treatment may be performed in such a manner that heat treatment is performed in an inert gas atmosphere, and then another heat treatment is performed in an atmosphere containing an oxidation gas at 10 ppm or more, 1% or more, or 10% or more in order to compensate detached oxygen.

Figure 8A:
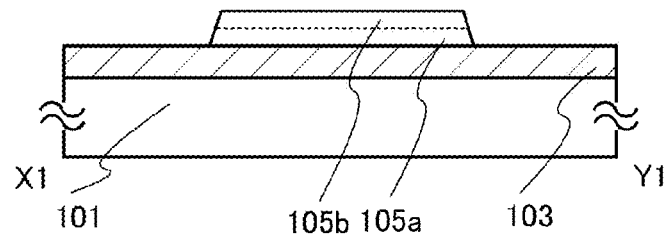
FIGS. 8A to 8D illustrate an example of a manufacturing method of the semiconductor device.

After the oxide layer 105a and the oxide semiconductor layer 105b are formed by a sputtering method, a resist mask is formed over the oxide semiconductor layer 105b and the oxide layer 105a and the oxide semiconductor layer 105b are etched into a desired shape using the resist mask, so that the island-shape oxide layer 105a and the island-shape oxide semiconductor layer 105b are formed (FIG. 8A).

The resist mask used in this embodiment can be formed by a photolithography method, a printing method, an inkjet method, or the like as appropriate. Formation of the resist mask by an inkjet method needs no photomask; thus, manufacturing cost can be reduced.

Note that the etching of the oxide layer 105a and the oxide semiconductor layer 105b may be performed by either one or both of a dry etching method and a wet etching method. In the case where the oxide layer 105a and the oxide semiconductor layer 105b are etched by a wet etching method, a solution obtained by mixing phosphoric acid, acetic acid, and nitric acid, a solution containing oxalic acid, a solution containing phosphoric acid, or the like can be used as the etchant. Alternatively, ITO-07N (produced by KANTO CHEMICAL CO., INC.) may be used.

A chlorine-based gas typified by chlorine ($Cl_2$), boron trichloride ($BCl_3$), silicon tetrachloride ($SiCl_4$), carbon tetrachloride ($CCl_4$), or the like can be used as an etching gas for the dry etching of the oxide layer 105a and the oxide semiconductor layer 105b. As a plasma source in the case where the etching of the oxide layer 105a and the oxide semiconductor layer 105b is performed by a dry etching method, a capacitively coupled plasma (CCP), an ICP, an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated. In the case of the etching according to the dry etching method (hereinafter also referred to as a "dry etching treatment"), the etching conditions (the amount of electric power applied to a coil-shaped electrode, the amount of electric power applied to an electrode on a substrate side, the temperature of the electrode on the substrate side, and the like) are adjusted as appropriate so that the film can be etched into a desired shape.

To etch the oxide layer 105a and the oxide semiconductor layer 105b, dry etching treatment is performed using chlorine ($Cl_2$) and boron trichloride ($BCl_3$) as an etching gas in this embodiment.

Note that part of the insulating layer 103 which does not overlap with the island-shaped oxide layer 105a and the island-shaped oxide semiconductor layer 105b might be etched depending on the etching conditions.

After the etching treatment, the resist mask is removed. Note that the above heat treatment may be performed after the oxide layer 105a and the oxide semiconductor layer 105b are processed into an island shape.

The oxide semiconductor has a band gap of 2 eV or more; therefore, a transistor including an oxide semiconductor in a semiconductor layer in which a channel is formed has an extremely small off-state current. Specifically, in a transistor whose channel length is 3 μm and channel width is 10 μm, the off-state current can be lower than $1\times10^{-20}$ A, preferably lower than $1\times10^{-22}$ A, further preferably lower than $1\times10^{-24}$ A. That is, the on/off ratio can be greater than or equal to 20 digits and less than or equal to 150 digits.

[Formation of Source Electrode and Drain Electrode]

Next, a conductive film to be the source electrode 107a and the drain electrode 107b is formed over the island-shaped oxide layer 105a and the island-shaped oxide semiconductor layer 105b, and a resist mask is formed over the conductive film.

Here, a tungsten film is formed as the conductive film by a sputtering method.

Figure 8B:
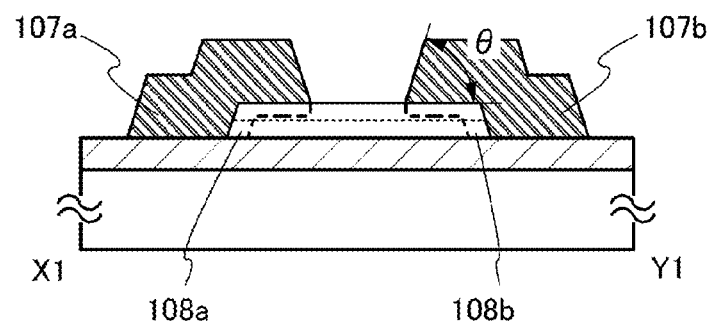

Then, part of the conductive film is selectively etched using the resist mask, so that the source electrode 107a and the drain electrode 107b (including other electrodes and wirings formed from the same film) are formed (see FIG. 8B). The etching of the conductive film may be performed by either one or both of a dry etching method and a wet etching method. After that, the resist mask is removed.

It is preferable that the source electrode 107a and the drain electrode 107b (including other electrodes and wirings formed from the same film) each have an end portion having a tapered shaped. Specifically, the end portion has a taper angle θ of 80° or less, preferably 60° or less, further preferably 45° or less.

Next, a conductive film to be the source electrode 109a and the drain electrode 109b is formed over the source electrode 107a and the drain electrode 107b, and a resist mask is formed over the conductive film.

Here, a tantalum nitride film is formed as the conductive film by a sputtering method.

Figure 8C:
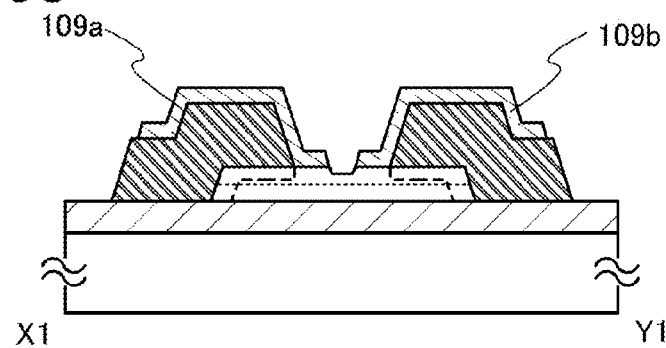

Then, part of the conductive film is selectively etched using the resist mask, so that the source electrode 109a and the drain electrode 109b (including other electrodes and wirings formed from the same film) are formed (see FIG. 8C). After that, the resist mask is removed.

Note that when a transistor having an extremely short channel length is formed, the source electrode 109a and the drain electrode 109b may be formed in such a manner that a resist mask is formed by a method suitable for thin line processing, such as an electron beam exposure, and then etching treatment is performed. Note that by the use of a positive type resist for the resist masks, the exposed region can be minimized and throughput can be thus improved. In the above manner, a transistor having a channel length of 30 nm or less can be formed.
[Formation of Stack 2]

Next, the oxide layer 105c is formed in contact with the source electrode 109a, the drain electrode 109b, and a part of the oxide semiconductor layer 105b. For the oxide layer 105c, the above-described method for forming the oxide layer 105a can be referred to.

In this embodiment, the oxide layer 105c including an amorphous part is formed by a sputtering method. Specifically, as the oxide layer 105c, an In—Ga—Zn oxide layer including In, Ga, and Zn at an atomic ratio of 1:3:2 is formed.
[Formation of Gate Insulating Layer]

Next, the gate insulating layer 111 is formed over the oxide layer 105c. For the gate insulating layer 111, the above-described method for forming the insulating layer 103 can be referred to. As described above, the gate insulating layer 111 is preferably formed using a material containing oxygen which can be a source for supplying oxygen to the stack and be a film containing excess oxygen.

Here, a silicon oxynitride film is formed as the gate insulating layer 111 by a plasma CVD method.
[Formation of Gate Electrode]

Next, a conductive film to be the gate electrode 113 is formed over the gate insulating layer 111, and a resist mask is formed over the conductive film.

Here, as the conductive film, a tantalum nitride film is formed over the gate insulating layer 111 by a sputtering method, and a tungsten film having a greater thickness than that of the tantalum nitride film is formed over the tantalum nitride film.

Figure 8D:
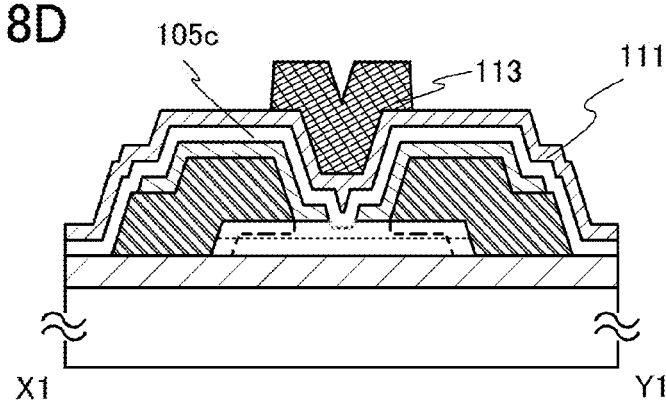

Then, part of the conductive film is selectively etched using the resist mask, so that the gate electrode 113 (including other electrodes and wirings formed from the same film) are formed (see FIG. 8D). The resist mask is removed after the etching.

Next, heat treatment is preferably performed. The heat treatment may be performed at a temperature higher than or equal to 250° C. and lower than or equal to 650° C., preferably higher than or equal to 300° C. and lower than or equal to 500° C. The heat treatment is performed in an inert gas atmosphere, an atmosphere containing an oxidation gas at 10 ppm or more, preferably 1% or more or 10% or more, or under reduced pressure. Alternatively, the heat treatment may be performed in such a manner that heat treatment is performed in an inert gas atmosphere, and then another heat treatment is performed in an atmosphere containing an oxidation gas at 10 ppm or more, 1% or more, or 10% or more in order to compensate detached oxygen. By the heat treatment, excess oxygen is released from the insulating layer containing excess oxygen (any of the insulating layers included in the semiconductor device, such as the insulating layer 103 or the gate insulating layer 111), and the oxygen vacancies of the oxide semiconductor layer (or the stack) can be reduced. Note that in the stack, an oxygen vacancy captures an adjacent oxygen atom, so that the oxygen vacancy seems to move. Thus, excess oxygen can reach the oxide semiconductor layer 105b through the oxide layer 105a, the oxide layer 105c, or the like.

In the above manner, the semiconductor device of one embodiment of the present invention can be formed.
<Method for Forming CAAC-OS>

Three methods for forming an CAAC-OS is described below.

The first method is to form an oxide semiconductor film at a temperature in the range of 100° C. to 450° C. to form, in the oxide semiconductor film, crystal parts in which the c-axes are aligned in the direction parallel with a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface on which the oxide semiconductor film is formed or a normal vector of a surface of the oxide semiconductor film are formed in the oxide semiconductor film.

Here, the first method for forming a CAAC-OS is described.
<<Method for Manufacturing Sputtering Target>>

First, a method for forming the above sputtering target is described with reference to FIGS. 9A and 9B.

Figure 9A:
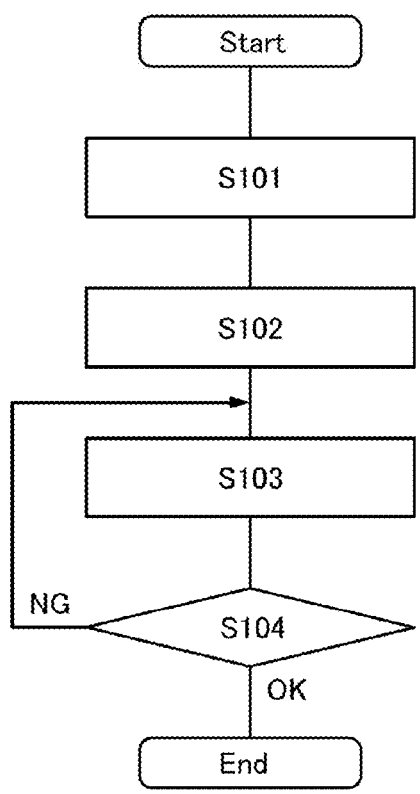
FIGS. 9A and 9B show the procedure for fabricating a target.

FIG. 9A shows formation of an oxide powder containing a plurality of metal elements to be a sputtering target. First, the oxide powder is weighed in a step S101.

A case is described here in which an oxide powder containing In, M, and Zn (also referred to as an In-M-Zn oxide powder) is manufactured as the oxide powder containing a plurality of metal elements. Specifically, an $InO_X$ oxide powder, an $MO_Y$ oxide powder, and a $ZnO_Z$ oxide powder are prepared as raw materials. Note that X, Y, and Z are each a given positive number; for example, X, Y, and Z are 1.5, 1.5, and 1, respectively. It is needless to say that the above oxide powders are an example, and oxide powders can be selected as appropriate in order to obtain a desired composition. Note that M represents Ga, Sn, Hf, Al, La, Ce, Pr, Nd, Sm, Eu, Gd, Tb, Dy, Ho, Er, Tm, Yb, or Lu. Although the case where three kinds of oxide powders are used is shown as an example in this embodiment, one embodiment of the present invention is not limited thereto. For example, this embodiment may be applied to the case where four or more kinds of oxide powders are used or the case where one or two kinds of oxide powders are used.

Next, the $InO_X$ oxide powder, the $MO_Y$ oxide powder, and the $ZnO_Z$ oxide powder are mixed at a predetermined molar ratio.

The predetermined molar ratio of the $InO_X$ oxide powder to the $MO_Y$ oxide powder and the $ZnO_Z$ oxide powder is, for example, 2:2:1, 8:4:3, 3:1:1, 1:1:1, 4:2:3, 1:1:2, 3:1:4, 1:3:2, 1:3:4, 1:3:6, 1:3:8, 1:3:10, 1:3:12, 1:6:4, 1:6:6, 1:6:8, 1:6:10, 1:6:12, 1:6:14, 1:6:16, 1:6:20, or 3:1:2. With such a molar ratio, a sputtering target including a polycrystalline oxide with high crystallinity can be obtained easily later.

Next, in a step S102, an In-M-Zn oxide is obtained by performing first baking on the $InO_X$ oxide powder, the $MO_Y$ oxide powder, and the $ZnO_Z$ oxide powder which are mixed in a predetermined molar ratio.

Note that the first baking is performed in an inert atmosphere, an oxidation atmosphere, or a reduced-pressure atmosphere at a temperature higher than or equal to 400° C. and lower than or equal to 1700° C., preferably higher than or equal to 900° C. and lower than or equal to 1500° C. The first baking is performed for longer than or equal to 3 minutes and shorter than or equal to 24 hours, preferably longer than or equal to 30 minutes and shorter than or equal to 17 hours, more preferably longer than or equal to 30 minutes and shorter than or equal to 5 hours, for example. When the first baking is performed under the above conditions, secondary reactions other than the main reaction can be suppressed, and the concentration of impurities in the In-M-Zn oxide can be reduced. Accordingly, the crystallinity of the In-M-Zn oxide can be increased.

The first baking may be performed plural times at different temperatures and/or in different atmospheres. For example, the In-M-Zn oxide may be first held at a first temperature in a first atmosphere and then at a second temperature in a second atmosphere. Specifically, it is preferable that the first atmosphere be an inert atmosphere or a reduced-pressure atmosphere and the second atmosphere be an oxidation atmosphere. This is because oxygen vacancies are generated in the In-M-Zn oxide when impurities contained in the In-M-Zn oxide are reduced in the first atmosphere. Therefore, it is preferable that oxygen vacancies in the obtained In-M-Zn oxide be reduced in the second atmosphere. The concentration of impurities contained in the In-M-Zn oxide is decreased and oxygen vacancies are reduced, whereby the crystallinity of the In-M-Zn oxide can be increased.

Next, the In-M-Zn oxide powder is obtained by grinding the In-M-Zn oxide in a step S103.

The In-M-Zn oxide has a high proportion of crystals with surface structures of planes parallel to the a-b plane. Therefore, the obtained In-M-Zn oxide powder includes many flat plate-like crystal grains whose top and bottom surfaces are parallel to the a-b plane. Moreover, the crystal of the In-M-Zn oxide is in many cases a hexagonal crystal; therefore, in many cases, the above flat plate-like crystal grains each have the shape of a hexagonal cylinder whose top and bottom surfaces are approximately equilateral hexagons each having internal angles of 120°.

Next, the grain size of the obtained In-M-Zn oxide powder is checked in a step 104. Here, the average grain size of the In-M-Zn oxide powder is checked to be less than or equal to 3 µm, preferably less than or equal to 2.5 µm, further preferably less than or equal to 2 µm. Note that the step S104 may be omitted and only the In-M-Zn oxide powder whose grain size is less than or equal to 3 µm, preferably less than or equal to 2.5 µm, further preferably less than or equal to 2 µm may be sifted using a grain size filter. The average grain size of the In-M-Zn oxide powder can be certainly less than or equal to 3 µm, preferably less than or equal to 2.5 µm, further preferably less than or equal to 2 µm by sifting the In-M-Zn oxide powder to have the grain size which is less than or equal to 3 µm, preferably less than or equal to 2.5 µm, further preferably less than or equal to 2 µm.

In the case where the average grain size of the In-M-Zn oxide powder exceeds a predetermined size in the step S104, the procedure returns to the step S103 and the In-M-Zn oxide powder is ground again.

In the above manner, the In-M-Zn oxide powder whose average grain size is less than or equal to 3 µm, preferably less than or equal to 2.5 µm, further preferably less than or equal to 2 µm can be obtained. Note that the average grain size of the obtained In-M-Zn oxide powder is less than or equal to 3 µm, preferably less than or equal to 2.5 µm, further preferably less than or equal to 2 µm, which enables the grain size of a crystal grain included in a sputtering target that is to be formed later to be reduced.

Figure 9B:
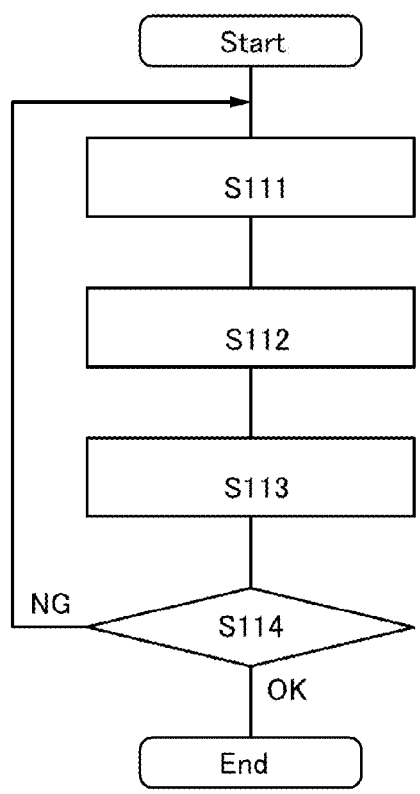

Next, FIG. 9B shows a method for manufacturing a sputtering target using the In-M-Zn oxide powder obtained as shown in the flow chart in FIG. 9A.

In a step S111, the In-M-Zn oxide powder is made to spread over a mold and molded. Here, molding refers to spreading powder or the like over a mold to obtain a uniform thickness. Specifically, the In-M-Zn oxide powder is introduced to the mold, and then vibration is externally applied so that the In-M-Zn oxide powder is molded. Alternatively, the In-M-Zn oxide powder is introduced to the mold, and then molding is performed using a roller or the like so as to obtain a uniform thickness. Note that in the step S111, slurry in which the In-M-Zn oxide powder is mixed with water, a dispersant, and a binder may be molded. In that case, the slurry is poured into the mold and then molded by sucking the mold from the bottom. After that, drying treatment is performed on a molded body after the mold is sucked. The drying treatment is preferably natural drying because the molded body is less likely to be cracked. After that, the molded body is subjected to heat treatment at a temperature higher than or equal to 300° C. and lower than or equal to 700° C., so that residual moisture or the like which cannot be taken out by natural drying is removed.

When the In-M-Zn oxide powder including many flat plate-like crystal grains whose top and bottom surfaces are parallel to the a-b plane is spread over the mold and molded, the crystal grains are arranged with the planes which are parallel to the a-b plane thereof facing upward. Therefore, the proportion of the surface structures of planes parallel to the a-b plane can be increased in such a manner that the obtained In-M-Zn oxide powder is made to spread over the mold and molded. Note that the mold may be formed of a metal or an oxide and the upper shape thereof is rectangular or rounded.

Next, first pressure treatment is performed on the In-M-Zn oxide powder in a step S112. After that, in a step S113, second baking is performed to obtain a plate-like In-M-Zn oxide. The second baking is performed under conditions and methods similar to those of the first baking. The crystallinity of the In-M-Zn oxide can be increased by performing the second baking.

Note that the first pressure treatment may be performed in any manner as long as the In-M-Zn oxide powder can be pressed. For example, a weight which is formed of the same kind of material as the mold can be used. Alternatively, the In-M-Zn oxide powder may be pressed under high pressure using compressed air. Besides, the first pressure treatment can be performed using various techniques. Note that the first pressure treatment may be performed at the same time as the second baking.

Planarization treatment may be performed after the first pressure treatment. As the planarization treatment, chemical mechanical polishing (CMP) treatment or the like can be employed.

The plate-like In-M-Zn oxide thus obtained becomes a polycrystalline oxide with high crystallinity.

Next, the thickness of the obtained plate-like In-M-Zn oxide is checked in a step S114. When the thickness of the plate-like In-M-Zn oxide is less than a desired thickness, the procedure returns to the step S111 and the In-M-Zn oxide powder is made to spread over the plate-like In-M-Zn oxide and molded. When the plate-like In-M-Zn oxide has a desired thickness in the step S114, the plate-like In-M-Zn oxide is used as a sputtering target. The description of steps following the step S111 when the thickness of the plate-like In-M-Zn oxide is less than a desired thickness is given below.

Next, in the step S112, second pressure treatment is performed on the plate-like In-M-Zn oxide and the In-M-Zn oxide powder over the plate-like In-M-Zn oxide. Then, in the step S113, third baking is performed, whereby a plate-like In-M-Zn oxide whose thickness is increased by the thickness of the In-M-Zn oxide powder is obtained. A plate-like In-M-

Zn oxide with an increased thickness is obtained through crystal growth with the use of the plate-like In-M-Zn oxide as a seed crystal; therefore, the plate-like In-M-Zn oxide is a polycrystalline oxide with high crystallinity.

Note that the second baking is performed under conditions and methods similar to those of the first baking. The second pressure treatment is performed under conditions and methods similar to those of the first pressure treatment. Note that the second pressure treatment may be performed at the same time as the third baking.

The thickness of the obtained plate-like In-M-Zn oxide is checked again in the step S114.

Through the above steps, the thickness of the plate-like In-M-Zn oxide can be gradually increased while the crystal alignment is improved.

By repeating these steps of increasing the thickness of a plate-like In-M-Zn oxide n times (n is a natural number), the plate-like In-M-Zn oxide having a desired thickness (t), for example, greater than or equal to 2 mm and less than or equal to 20 mm, preferably greater than or equal to 3 mm and less than or equal to 20 mm can be obtained. The plate-like In-M-Zn oxide is used as a sputtering target.

After that, planarization treatment may be performed.

Note that fourth baking may be performed on the obtained sputtering target. The fourth baking is performed under conditions and methods similar to those of the first baking. A sputtering target including a polycrystalline oxide with much higher crystallinity can be obtained by performing the fourth baking.

In the above manner, the sputtering target which includes a polycrystalline oxide containing a plurality of crystal grains can be formed. The plurality of crystal grains have cleavage planes parallel to the a-b plane and a small average grain size.

Note that the sputtering target formed in such a manner can have a high density. When the density of the sputtering target is increased, the density of a film to be deposited can also be increased. Specifically, the relative density of the sputtering target can be higher than or equal to 90%, preferably higher than or equal to 95%, more preferably higher than or equal to 99%. Note that the relative density of the sputtering target refers to a ratio between the density of the sputtering target and the density of a substance which is free of porosity and has the same composition as the sputtering target.

<<Cleavage Plane of Crystal of In—Ga—Zn Oxide>>

Next, a cleavage plane of a crystal of an In—Ga—Zn oxide (In:Ga:Zn=1:1:1 [atomic ratio]) is described with reference to FIGS. 10A and 10B.

Figure 10A:
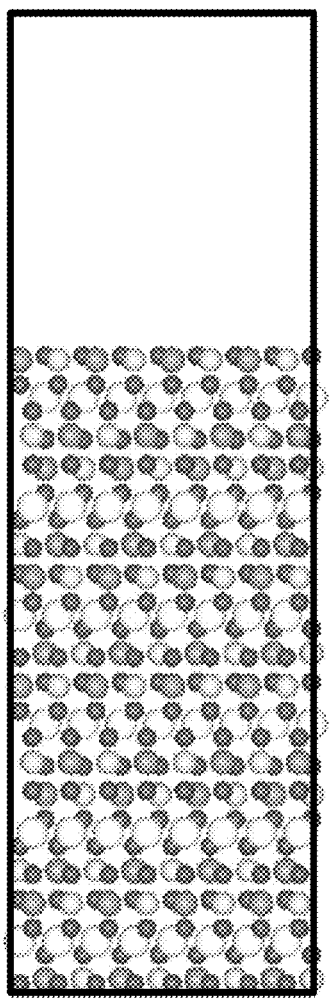
FIGS. 10A and 10B show a cleavage plane of an oxide semiconductor.

FIG. 10A illustrates an example of a crystal structure of an In—Ga—Zn oxide viewed from a direction parallel to the a-b plane of the crystal. FIG. 10B illustrates the crystal structure after ion collision during sputtering.

Figure 10B:
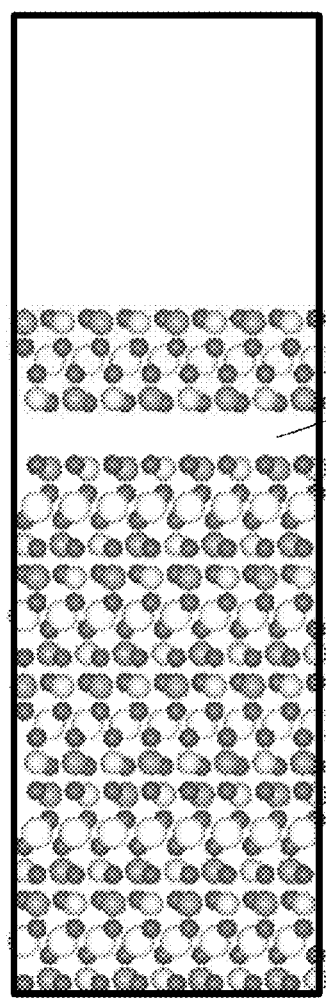

For example, cleavage of the crystal included in the In—Ga—Zn oxide occurs between a layer including a gallium atom and/or zinc atom and an oxygen atom, and a layer including a gallium atom and/or zinc atom, and an oxygen atom, which are illustrated in FIG. 10B. This is because oxygen atoms which have negative charges exist in the layer in a close distance from each other. In this manner, the cleavage plane is parallel to the a-b plane.

That is, it can be seen that, when an ion collides with the surface of a sputtering target including a crystal grain of an In—Ga—Zn oxide, the crystal grain included in the In—Ga—Zn oxide is cleaved along a plane parallel to the a-b plane of the crystal, and flat plate-like sputtered particles whose top and bottom surfaces are parallel to the a-b plane are separated from the sputtering target.

Moreover, in the crystal of the In—Ga—Zn oxide illustrated in FIGS. 10A and 10B, metal atoms are arranged in a regular triangular or regular hexagonal configuration when seen from the direction perpendicular to the a-b plane; therefore, the flat plate-like crystal grain is likely to have the shape of a hexagonal cylinder whose regular hexagonal plane has internal angles of 120°.

<<Sputtering Target>>

The relative density of the sputtering target is higher than or equal to 90%, higher than or equal to 95%, or higher than or equal to 99%.

Further, the density of the sputtering target is preferably high: for example, the concentration of silicon in the target is set to be lower than $1\times10^{19}$ atoms/cm$^3$, preferably lower than $5\times10^{18}$ atoms/cm$^3$, more preferably lower than $1\times10^{18}$ atoms/cm$^3$. The concentration of carbon in the target is set to lower than $1\times10^{19}$ atoms/cm$^3$, preferably lower than $5\times10^{18}$ atoms/cm$^3$, more preferably lower than $1\times10^{18}$ atoms/cm$^3$.

When silicon or carbon is contained in the sputtering target at a high concentration, the crystallinity of the formed semiconductor film can be lowered.

The polycrystalline oxide included in the sputtering target is at least an oxide containing, for example, In, M (M is Ga, Sn, Hf, Al, La, Ce, Pr, Nd, Sm, Eu, Gd, Tb, Dy, Ho, Er, Tm, Yb, or Lu), and Zn.

Moreover, the atomic ratio of In to M and Zn contained in the polycrystalline oxide is preferably close to the stoichiometric composition. When the atomic ratio of In to M and Zn contained in the polycrystalline oxide becomes close to the stoichiometric composition, the crystallinity of the polycrystalline oxide can be increased. Note that as described with "close", the atomic ratio and the stoichiometric composition may deviate within the range of ±10%.

The crystal grain included in the polycrystalline oxide containing In, M, and Zn includes a cleavage plane between a first plane containing M and Zn and a second plane containing M and Zn.

<<Model of Deposition of Sputtered Particles>>

Next, a model of the deposition of sputtered particles at the time of forming an oxide layer or an oxide semiconductor layer by a sputtering method is described with reference to FIGS. 11A and 11B, FIGS. 12A, 12B1, 12B2, and 12C, and FIGS. 13A and 13B.

Figure 11A:
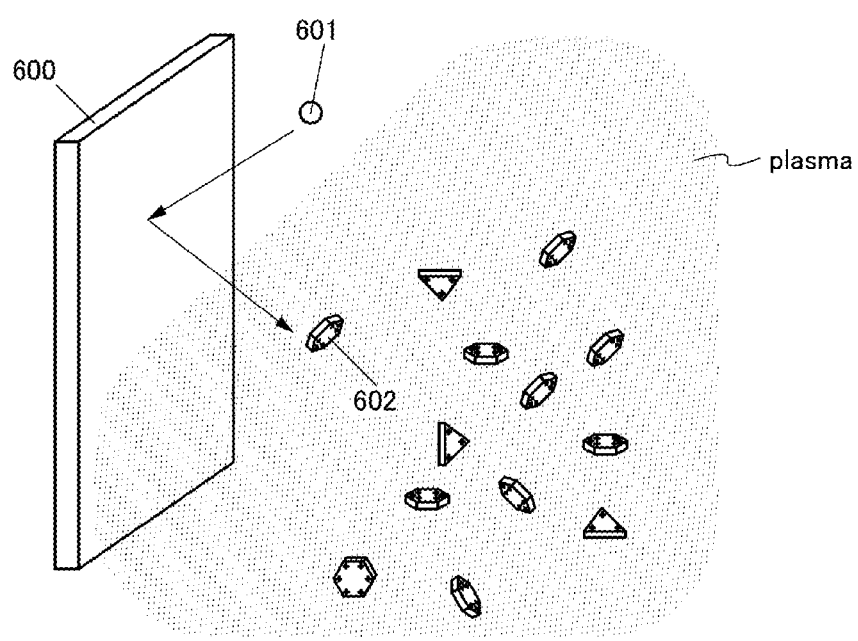
FIGS. 11A and 11B are schematic views illustrating sputtered particles separated from a sputtering target.
Figure 11B:
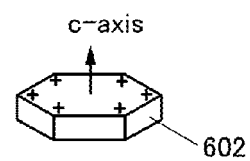

FIG. 11A is a schematic diagram illustrating a situation where an ion 601 collides with a sputtering target 600, and a sputtered particle 602 is separated. Note that the sputtered particle 602 may have a hexagonal cylinder shape whose hexagonal plane is parallel to the a-b plane or a triangular prism shape whose triangular plane is parallel to the a-b plane. In such a case, a direction perpendicular to the hexagonal plane or the triangular plane is a c-axis direction (see FIG. 11B). Although it depends on the kind of oxide, the diameter (equivalent circle diameter) of a plane parallel to the a-b plane is about greater than or equal to 1 nm and less than or equal to 30 nm or about greater than or equal to 1 nm and less than or equal to 10 nm. As the ion 601, an oxygen cation is used. Further, in addition to the oxygen cation, an argon cation may be used. Instead of the argon cation, a cation of another rare gas may be used.

With use of an oxygen cation as the ion 601, plasma damage at the film formation can be alleviated. Thus, when the ion 601 collides with the surface of the sputtering target 600, a deterioration in crystallinity of the sputtering target 600 can be suppressed or a change of the sputtering target 600 into an amorphous state can be suppressed.

It is preferable that the separated sputtered particles 602 be positively charged. However, there is no particular limitation on the timing at which the sputtered particles 602 are positively charged. Specifically, the sputtered particle 602 is in some cases positively charged by being exposed to plasma. Alternatively, the sputtered particle 602 is in some cases positively charged by receiving an electric charge at the collision of the ion 601. Further alternatively, the sputtered particle 602 is in some cases positively charged in such a manner that the ion 601 which is an oxygen cation is bonded with a side, top, or bottom surface of the sputtered particle 602.

In the sputtered particle 602, the corners of the hexagonal plane are positively charged, whereby positive charges of the hexagonal plane repel each other. Thus, flat-plate shapes of the sputtered particles 602 can be maintained.

It is preferable to use a DC power source to positively charge the corners of the hexagonal plane of the sputtered particle 602. Note that an RF power source or an AC power source can be used. Note that it is difficult to use an RF power source for a sputtering apparatus which is capable of deposition to a large-sized substrate. In addition, a DC power source is preferred to an AC power source from the viewpoint below.

Figure 12A:
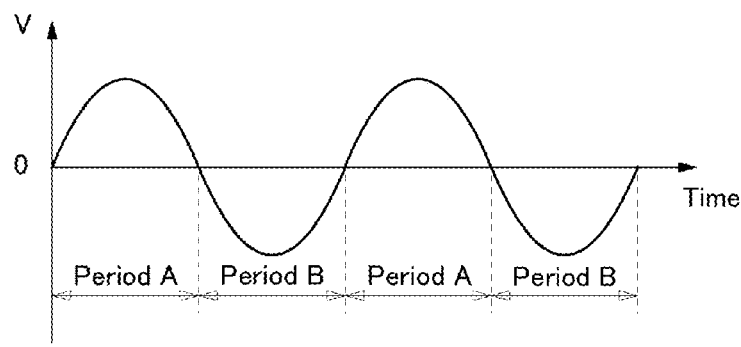
Figure 12A:
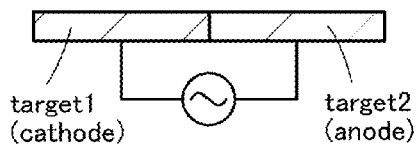
Figure 12A:
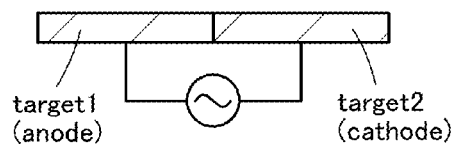
Figure 12C:
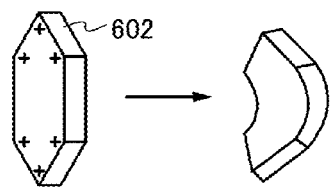
FIG. 12C is a diagram for explaining a sputtered particle.

In the AC power source, adjacent targets alternately have a cathode potential and an anode potential. In a period A shown in FIG. 12A, a target 1 functions as a cathode and a target 2 functions as an anode as illustrated in FIG. 12B1. In a period B shown in FIG. 12A, the target 1 functions as an anode and the target 2 functions as a cathode as illustrated in FIG. 12B2. The total time of the period A and the period B is 20 msec to 50 msec and the period A and the period B are repeated at a constant frequency.

In the case where the sputtered particle 602 is positively charged, positive charges in the sputtered particle 602 repel each other, whereby flat-plate shapes of the sputtered particles 602 can be maintained. However, in the case where the AC power source is used, there is time during which an electric field is not applied instantaneously; therefore, some charges of the sputtered particle 602 are lost and the structure of the sputtered particle might be broken (see FIG. 12C). Thus, a DC power source is preferred to an AC power source.

A situation of the deposition of sputtered particles on a deposition surface at the time of forming an oxide semiconductor layer by a sputtering method is described below with reference to FIGS. 13A and 13B. Note that FIG. 13A illustrates the case where film formation is performed while a substrate is heated, whereas FIG. 13B illustrates the case where film formation is performed while a substrate is not heated.

Figure 13A:
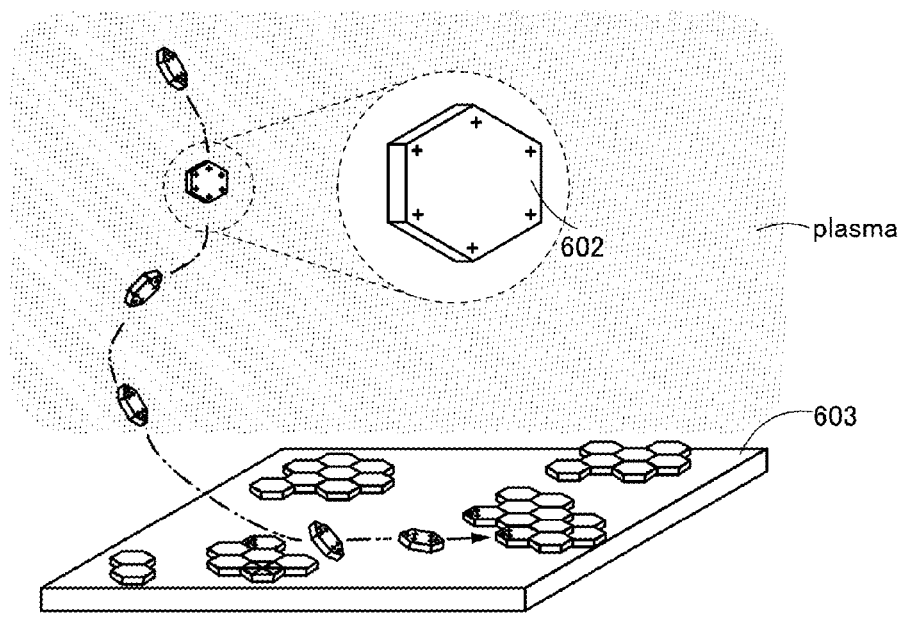
FIGS. 13A and 13B show the deposition states of sputtered particles with and without substrate heating.
Figure 13B:
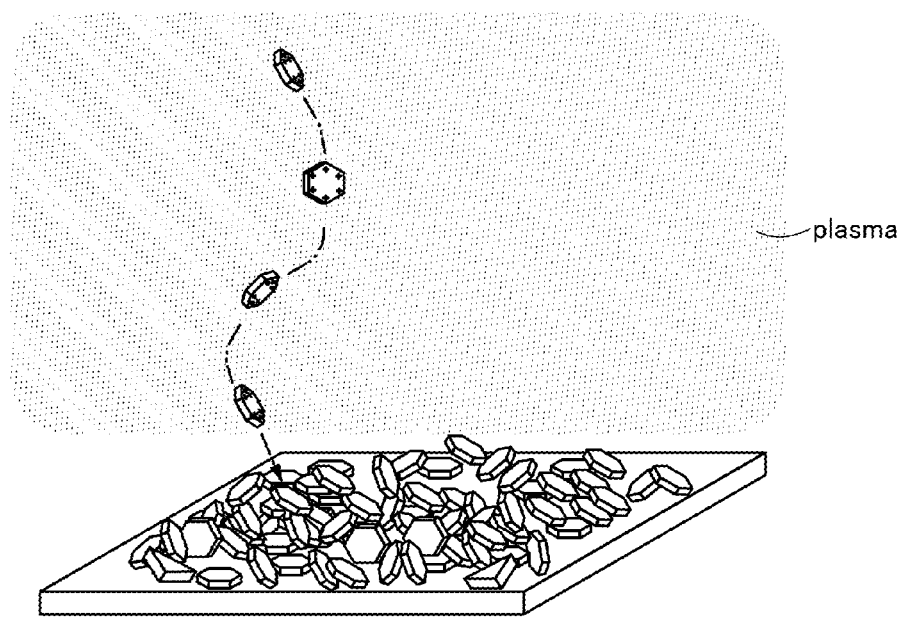

As illustrated in FIG. 13A, in the case where the substrate is heated, one sputtered particle 602 moves to a region of a deposition surface 603 where other sputtered particles 602 have not been deposited yet, and migration of the sputtered particles 602 occurs, whereby the sputtered particle 602 is bonded to the side of the sputtered particles which are already deposited. In this manner, the sputtered particles 602 are spread with flat plate planes facing upward. Further, c-axes of crystals of the deposited sputtered particles 602 are aligned in a direction perpendicular to the deposition surface 603; accordingly, a CAAC-OS film is formed. Moreover, an oxide film which is obtained by the deposition has a uniform thickness and a uniform crystal orientation.

The CAAC-OS film which is obtained by such a mechanism has high crystallinity even on an amorphous surface, a surface of an amorphous insulating film, a surface of an amorphous oxide film, or the like. Note that the deposition surface 603 preferably has an insulating property. With the deposition surface 603 having an insulating property, the sputtered particles 602 which are deposited on the deposition surface 603 are unlikely to loose positive charges. However, in the case where the deposition rate of the sputtered particles 602 is less than the rate at which a positive charge is lost, the deposition surface 603 may have conductivity. The deposition surface 603 preferably has an amorphous surface or an amorphous insulating surface.

By reducing the amount of impurities entering the CAAC-OS film during the sputtering, the crystal state can be prevented from being broken by the impurities. For example, impurities (e.g., hydrogen, water, or carbon dioxide) which exist in the deposition chamber may be reduced. Furthermore, impurities in a deposition gas may be reduced. Specifically, a deposition gas with a dew point of $-80°$ C. or lower, preferably $-100°$ C. or lower, more preferably $-120°$ C. or lower is used. Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

With the use of a sputtering target in the way as described above, an oxide film having a uniform thickness and a uniform crystal orientation can be formed. The oxide film can be favorably used as each of the oxide layers or the oxide semiconductor layer of the stack included in the semiconductor device of one embodiment of the present invention.

As illustrated in FIG. 13B, in the case where the substrate is not heated, the sputtered particles 602 are piled up irregularly on the deposition surface 603. Thus, the sputtered particles 602 are deposited randomly also in a region where other sputtered particles 602 are already deposited. That is, an oxide film which is obtained by the deposition has neither a uniform thickness nor a uniform crystal orientation. The oxide film which is obtained in such a manner is a microcrystalline oxide film because the crystallinity of flat plate-like sputtered particles 602 is maintained to some extent.

As described above, the diameter of a plane of the sputtered particle 602 which is parallel to the a-b plane is about greater than or equal to 1 nm and less than or equal to 30 nm or about greater than or equal to 1 nm and less than or equal to 10 nm. The crystal part included in the formed oxide film may be smaller in size than the sputtered particle 602. For example, the crystal part is less than or equal to 10 nm or less than or equal to 5 nm in some cases. An oxide film including such a crystal part is referred to as a nanocrystalline oxide film.

The nanocrystalline oxide film is macroscopically equivalent to a film having disordered atomic arrangement. For this reason, in some cases, a peak indicating an orientation is not observed in X-ray diffraction (XRD) analysis which is performed on a large area of a measurement sample (for example, in which the beam diameter is larger than that of the sputtered particle 602). Further, in some cases, an electron diffraction pattern obtained by using an electron beam with a diameter larger than that of the sputtered particle 602 is a halo pattern. In this case, for example, a nanocrystalline oxide film is measured with an electron beam having a beam diameter much smaller than the sputtered particle 602, whereby a spot (bright spot) can be observed in the obtained nanobeam electron diffraction pattern.

The nanocrystalline oxide film can also be favorably used as each of the oxide layers or the oxide semiconductor layer of the stack of the semiconductor device of one embodiment of the present invention.

After the oxide semiconductor layer (or the stack) is formed, heat treatment is preferably performed in order to remove hydrogen or moisture in the layer. For example, for dehydration or dehydrogenation, heat treatment may be performed at 450° C. under a nitrogen atmosphere for one hour. Further, in order to reduce oxygen vacancies in the oxide semiconductor layer (or the stack), for example, heat treatment may be further performed at 450° C. under a mixed atmosphere of nitrogen and oxygen for one hour.

Various films such as a metal film, a semiconductor film, and an inorganic insulating film included in the semiconductor device of one embodiment of the present invention can be formed by a sputtering method or a plasma CVD method, and may be formed by another method such as a thermal chemical vapor deposition (CVD) method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

Various films such as a metal film, a semiconductor film, and an inorganic insulating film can be formed by a thermal CVD method such as an MOCVD method or an ALD method. For example, in the case where an InGaZnO$_X$ (X>0) film is formed, trimethylindium, trimethylgallium, and diethylzinc are used. Note that the chemical formula of trimethylindium is In(CH$_3$)$_3$. The chemical formula of trimethylgallium is Ga(CH$_3$)$_3$. The chemical formula of diethylzinc is Zn(CH$_3$)$_2$. Without limitation to the above combination, triethylgallium (chemical formula: Ga(C$_2$H$_5$)$_3$) can be used instead of trimethylgallium and dimethylzinc (chemical formula: Zn(C$_2$H$_5$)$_2$) can be used instead of diethylzinc.

For example, in the case where a hafnium oxide film is formed, two kinds of gases, i.e., ozone (O$_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is Hf[N(CH$_3$)$_2$]$_4$. Examples of another material liquid include tetrakis(ethylmethylamide)hafnium.

For example, in the case where an aluminum oxide film is formed, two kinds of gases, e.g., H$_2$O as an oxidizer and a source gas which is obtained by vaporizing liquid containing a solvent and an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionato).

For example, in the case where a silicon oxide film is formed, hexachlorodisilane is adsorbed on a deposition surface, chlorine contained in the adsorbate is removed, and radicals of an oxidizing gas (e.g., O$_2$ or dinitrogen monoxide) are supplied to react with the adsorbate.

For example, in the case where a tungsten film is formed using a deposition apparatus employing ALD, a WF$_6$ gas and a B$_2$H$_6$ gas are sequentially introduced plural times to form an initial tungsten film, and then a WF$_6$ gas and an H$_2$ gas are introduced at a time, so that a tungsten film is formed. Note that an SiH$_4$ gas may be used instead of a B$_2$H$_6$ gas.

For example, in the case where an oxide semiconductor film, e.g., an InGaZnO$_X$ (X>0) film is formed using a deposition apparatus employing ALD, an In(CH$_3$)$_3$ gas and an O$_3$ gas are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer or a GaZnO layer may be formed by mixing of these gases. Note that although an H$_2$O gas which is bubbled with an inert gas such as Ar may be used instead of an O$_3$ gas, it is preferable to use an O$_3$ gas, which does not contain H. Instead of a Ga(CH$_3$)$_3$ gas, a Ga(C$_2$H$_5$)$_3$ gas may be used. Instead of an In(CH$_3$)$_3$ gas, an In(C$_2$H$_5$)$_3$ may be used. A Zn(CH$_3$)$_2$ gas may be used.

This embodiment can be implemented in appropriate combination with the structures described in the other embodiments.

(Embodiment 3)

In this embodiment, an oxide semiconductor is mainly described. First, an oxide semiconductor is compared with a silicon semiconductor. Next, the localized level of an oxide semiconductor film is described. Further, the electron diffraction pattern of an oxide semiconductor film is described.

<Comparison of Oxide Semiconductor with Silicon Semiconductor>

Table 1 shows a comparison between an oxide semiconductor (OS) and a silicon semiconductor (Si) which are each in a crystalline state.

TABLE 1

|  | Amorphous | Nonocrystalline | Polycrystalline | Continuous crystal | Single crystal |
|---|---|---|---|---|---|
| OS | a-OS<br>a-OS:H | nc-OS<br>μc-OS | polycrystalline OS | CAAC-OS | single crystal OS |
| Nanobeam electron diffraction pattern | halo | ring + spot | spot | spot | spot |
| Crystal parts | — | nm to μm | discntinuous | continuously connected | — |
| DOS | high | slightly low | — | low | extremely low |
| Density | low | medium | — | high | — |
| Si | a-Si<br>a-Si:H | nc-Si<br>μc-Si | Polycrystalline Si | CG silicon | Single crystal Si |

For the crystalline states of an oxide semiconductor, for example, as shown in Table 1, an amorphous oxide semiconductor (a-OS, a-OS:H), a microcrystalline oxide semiconductor (nc-OS, μc-OS), a polycrystalline oxide semiconductor (polycrystalline OS), a continuous crystal oxide semiconductor (CAAC-OS), a single crystal oxide semiconductor (single crystal OS), and the like can be given. For the crystalline states of silicon, for example, as shown in Table 1, an amorphous silicon (a-Si, a-Si:H), a microcrystalline silicon (nc-Si, μc-Si), a polycrystalline silicon (polycrystalline Si), a continuous crystal silicon (CAAC-Si), a single crystal silicon (single crystal Si), and the like can be given.

When the oxide semiconductors in the above crystal states are subjected to electron diffraction (nanobeam electron diffraction) using an electron beam whose diameter is reduced to less than or equal to 10 nmϕ, the following electron diffraction patterns (nanobeam electron diffraction patterns) can be observed. A halo pattern is observed in the amorphous oxide semiconductor. Spots and/or a ring pattern are/is observed in the microcrystalline oxide semiconductor. Spots are observed each in the polycrystalline oxide semiconductor, the continuous crystal oxide semiconductor, and the crystal oxide semiconductor.

According to the nanobeam electron diffraction pattern, a crystal part in the microcrystalline oxide semiconductor has a diameter of nanometers (nm) to micrometers (μm). The polycrystalline oxide semiconductor has discontinuous grain boundaries between crystal parts. No boundary is observed between crystal parts in the continuous crystal oxide semiconductor and the crystal parts are connected continuously.

The density of the oxide semiconductor in each crystal state is described. The amorphous oxide semiconductor has a low density. The microcrystalline oxide semiconductor has a medium density. The continuous crystal oxide semiconductor has a high density. That is, the density of the continuous crystal oxide semiconductor is higher than that of the microcrystalline oxide semiconductor, and the density of the microcrystalline oxide semiconductor is higher than that of the amorphous oxide semiconductor.

A feature of density of states (DOS) existing in the oxide semiconductor in each crystal state is described. The DOS of the amorphous oxide semiconductor is high. The DOS of the microcrystalline oxide semiconductor is slightly low. The DOS of the continuous crystal oxide semiconductor is low. The DOS of the single crystal oxide semiconductor is extremely low. That is, the DOS of the single crystal oxide semiconductor is lower than that of the continuous crystal oxide semiconductor, the DOS of the continuous crystal oxide semiconductor is lower than that of the microcrystalline oxide semiconductor, and the DOS of the microcrystalline oxide semiconductor is lower than that of the amorphous oxide semiconductor.

<Localized Level of Oxide Semiconductor Film>

Next, the localized level of an oxide semiconductor film is described. Specifically, the results of evaluating the nanocrystalline oxide semiconductor film and the CAAC-OS film by a constant photocurrent method (CPM) are described.

The measurement samples each include an oxide semiconductor film provided over a glass substrate, a pair of electrodes in contact with the oxide semiconductor film, and an insulating film covering the oxide semiconductor film and the pair of electrodes.

First, the results of evaluating the nanocrystalline oxide semiconductor film by CPM measurement are described.

Next, a method of forming the nanocrystalline semiconductor film included in each measurement sample is described.

A first oxide semiconductor film was formed by a sputtering method under the following conditions: an In—Ga—Zn-oxide (In:Ga:Zn=1:1:1 [atomic ratio]) target was used, an argon gas with a flow rate of 30 sccm and an oxygen gas with a flow rate of 15 sccm were used as a deposition gas, the pressure was 0.4 Pa, the substrate temperature was room temperature, and a DC power of 0.5 kW was applied. Note that the first oxide semiconductor film is a nanocrystalline oxide semiconductor film.

The first oxide semiconductor film was heated at 450° C. in a nitrogen atmosphere for one hour and then heated at 450° C. in an oxygen atmosphere for one hour, whereby hydrogen contained in the first oxide semiconductor film was released and oxygen was supplied to the first oxide semiconductor film to form a second oxide semiconductor film. Note that the second oxide semiconductor film is a nanocrystalline oxide semiconductor film.

Next, CPM measurement was performed on the measurement sample including the first oxide semiconductor film and the measurement sample including the second oxide semiconductor film. Specifically, the amount of light with which a surface of each measurement sample between terminals is irradiated is adjusted so that a photocurrent value is kept constant while voltage is applied between the pair of electrodes provided in contact with the oxide semiconductor film, and then an absorption coefficient was derived from the amount of irradiation light in an intended wavelength range.

Figure 14A:
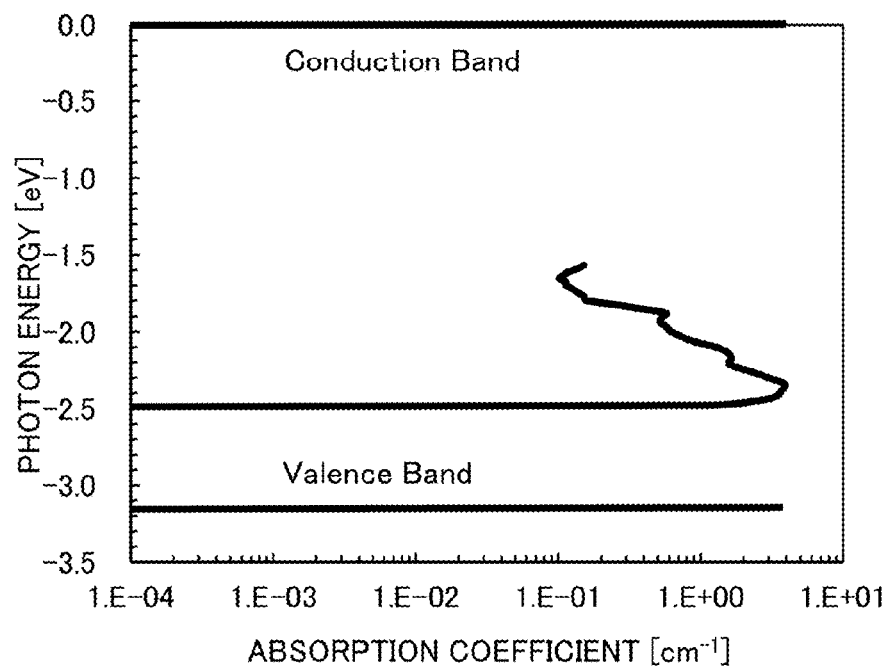
FIGS. 14A and 14B each show the results of CPM measurement of an oxide semiconductor film.
Figure 14B:
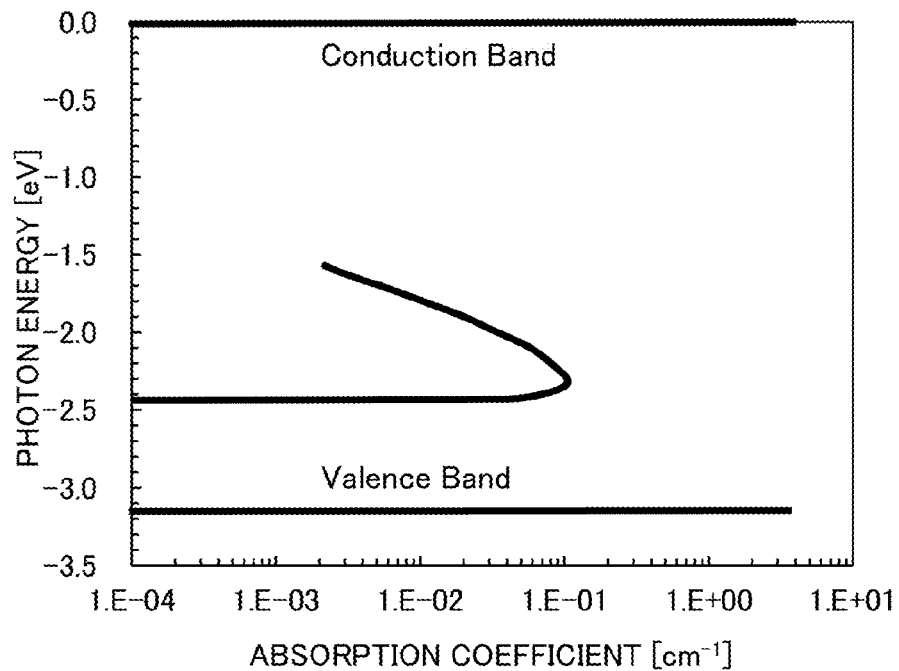

FIGS. 14A and 14B show absorption coefficients each obtained by removing an absorption coefficient due to the band tail from the absorption coefficient obtained by the CPM measurement performed on each sample, that is, absorption coefficients due to defects. In each of FIGS. 14A and 14B, the horizontal axis represents the absorption coefficient and the vertical axis represents the photon energy. On the vertical axis in each of FIGS. 14A and 14B, the bottom of the conduction band and the top of the valence band of the oxide semiconductor film are 0 eV and 3.15 eV, respectively. Curves in FIGS. 14A and 14B each represent the relation between the absorption coefficient and the photon energy, which corresponds to defect levels.

FIG. 14A shows measurement results of the measurement sample including the first oxide semiconductor film. The absorption coefficient due to the defect states of the sample is $5.28 \times 10^{-1}$ cm$^{-1}$. FIG. 14B shows measurement results of the measurement sample including the second oxide semiconductor film. The absorption coefficient due to the defect states of the sample is $1.75 \times 10^{-2}$ cm$^{-1}$.

Thus, the heat treatment can reduce defects included in the oxide semiconductor film.

Note that the film density of each of the first oxide semiconductor film and the second oxide semiconductor film was measured by X-ray reflectometry (XRR). The film densities of the first oxide semiconductor film and the second oxide semiconductor film are 5.9 g/cm$^3$ and 6.1 g/cm$^3$, respectively.

Thus, the heat treatment can increase the film density of the oxide semiconductor film.

That is, the above reveals that when the film density of the oxide semiconductor film is higher, the oxide semiconductor film has fewer defects.

Next, the results of evaluating the CAAC-OS film by CPM measurement are described.

Next, a method of forming the CAAC-OS film included in the measurement sample is described.

A third oxide semiconductor film was formed by a sputtering method under the following conditions: an In—Ga—Zn-oxide (In:Ga:Zn=1:1:1 [atomic ratio]) target was used, an argon gas with a flow rate of 30 sccm and an oxygen gas with a flow rate of 15 sccm were used as a deposition gas, the pressure was 0.4 Pa, the substrate temperature was 400° C., and a DC power of 0.5 kW was applied. Next, the third oxide semiconductor film was heated at 450° C. in a nitrogen atmosphere for one hour and then heated at 450° C. in an oxygen atmosphere for one hour, whereby hydrogen contained in the third oxide semiconductor film was released and oxygen was supplied to the third oxide semiconductor film. Note that the third oxide semiconductor film is a CAAC-OS film.

Next, CPM measurement was performed on the measurement sample including the third oxide semiconductor film. Specifically, the amount of light with which a surface of the sample is irradiated is adjusted so that a photocurrent value is kept constant while voltage is applied between the pair of electrodes provided in contact with the oxide semiconductor film, and then an absorption coefficient was derived from the amount of irradiation light in an intended wavelength range.

Figure 15:
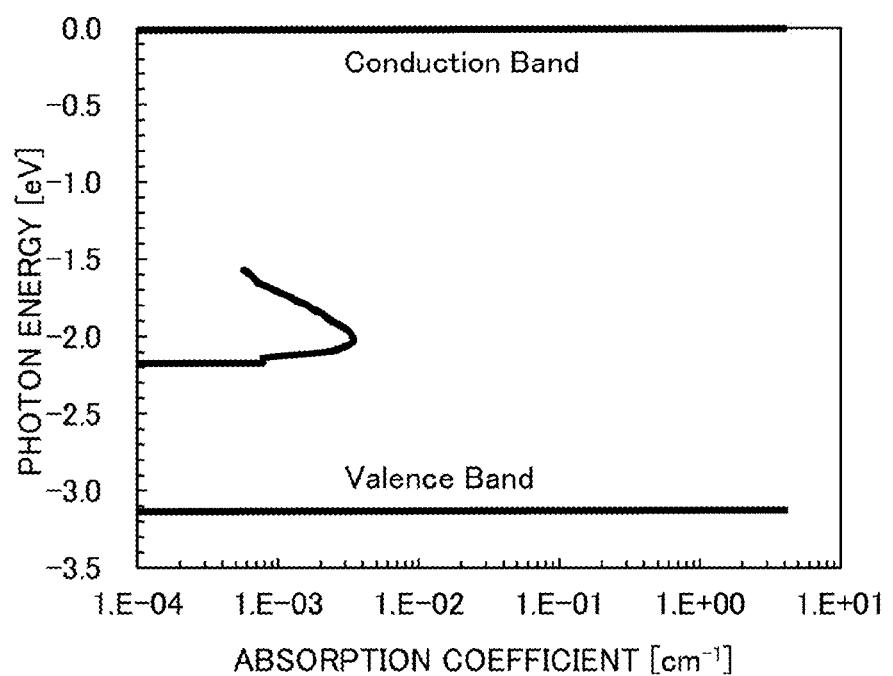
FIG. 15 shows the results of CPM measurement of an oxide semiconductor film.

An absorption coefficient shown in FIG. 15 was obtained by removing an absorption coefficient due to the band tail from the absorption coefficient obtained by the CPM measurement performed on the sample. That is, an absorption coefficient due to defects is shown in FIG. 15. In FIG. 15, the horizontal axis represents the absorption coefficient and the vertical axis represents the photon energy. On the vertical axis in FIG. 15, the bottom of the conduction band and the top of the valence band of the third oxide semiconductor film are 0 eV and 3.15 eV, respectively. A curve in FIG. 15 represents the relation between the absorption coefficient and the photon energy, which corresponds to defect levels.

According to the curve shown in FIG. 15, the absorption coefficient due to defect states is $5.86 \times 10^{-4}$ cm$^{-1}$. That is, the CAAC-OS film has an absorption coefficient due to defect states lower than $1 \times 10^{-3}$ cm$^{-1}$, preferably lower than $1 \times 10^{-4}$ cm$^{-1}$, and has a low density of defect states.

Note that the film density of the oxide semiconductor film was measured by X-ray reflectometry. The film density of the oxide semiconductor film is 6.3 g/cm$^3$. That is, the CAAC-OS film has a high film density.

<Electron Diffraction Pattern of CAAC-OS Film>

Next, the electron diffraction pattern of a CAAC-OS film is described with FIG. 16, FIGS. 17A to 17D, FIG. 18, FIGS. 19A and 19B, FIGS. 20A to 20D, FIGS. 21A and 21B, FIGS. 22A to 22D, FIGS. 23A and 23B, and FIGS. 24A to 24D.

The CAAC-OS film used in this embodiment is an In—Ga—Zn-based oxide film which is formed by a sputtering method using a deposition gas containing oxygen and a target of an In—Ga—Zn oxide (having an atomic ratio of In:Ga:Zn=1:1:1). The above embodiment can be referred to for detailed description of a manufacturing method and the like of the CAAC-OS film.

Figure 19A:
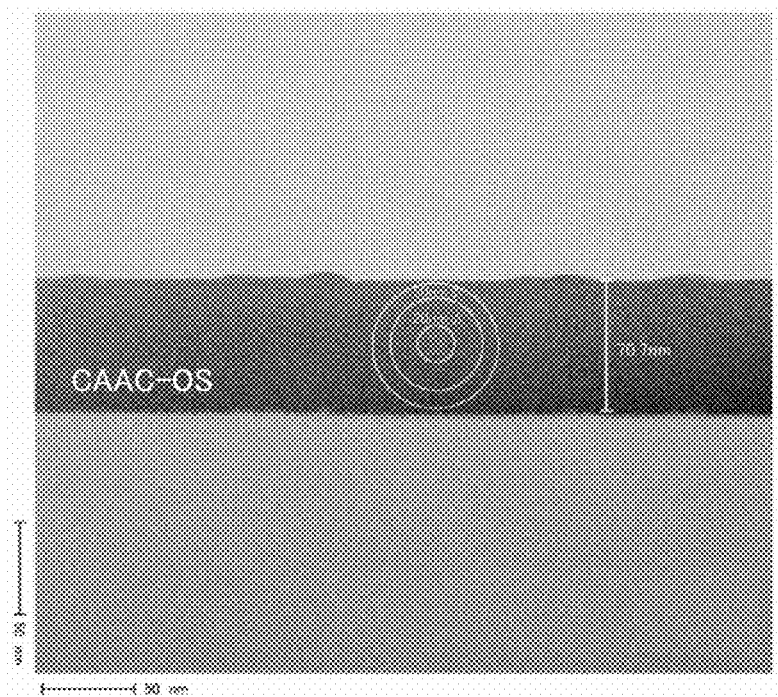
FIGS. 19A and 19B is a cross-sectional TEM image and an X-ray diffraction spectrum of the CAAC-OS film.
Figure 19B:
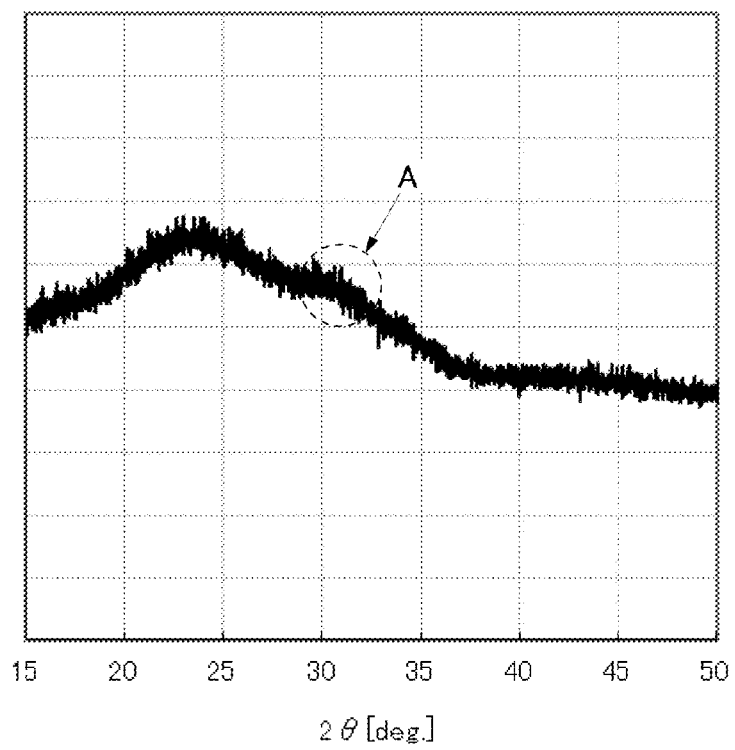
Figure 20A:
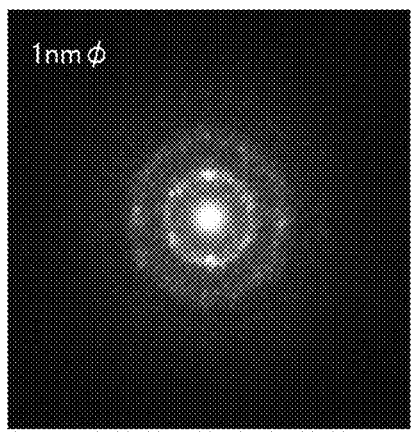
FIGS. 20A to 20D show electron diffraction patterns of the CAAC-OS film.
Figure 20B:
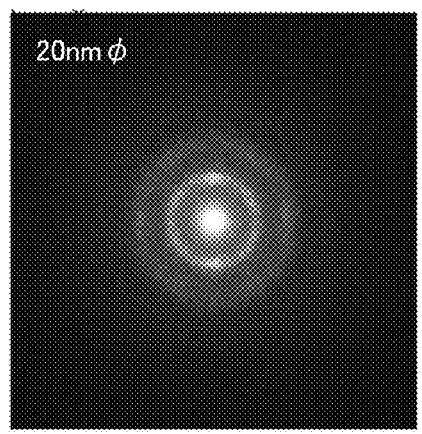
Figure 20C:
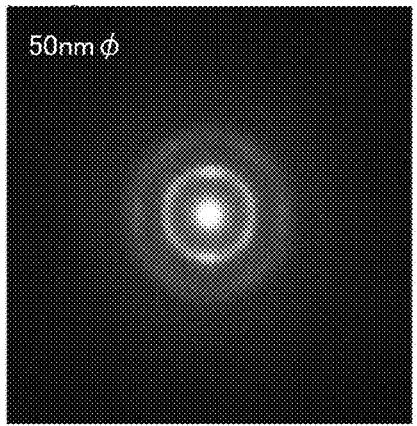
Figure 20D:
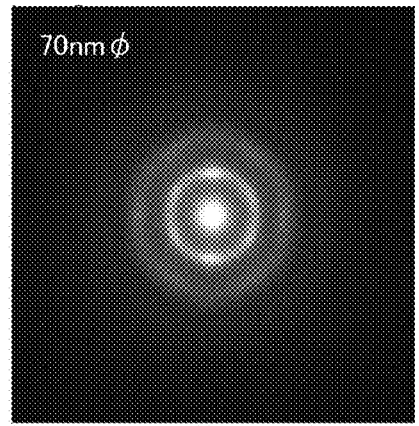

FIG. 19A is a cross-sectional TEM image of a CAAC-OS film. FIG. 19B is an X-ray diffraction spectrum of the CAAC-OS film.

A CAAC-OS film may have a variety of forms, and Peak A which indicates a crystal component appears around 2θ=31° as shown in FIG. 19B, but the peak does not appear clearly in some cases.

The cross-sectional TEM image shown in FIG. 19A was taken with a transmission electron microscope ("H-9000NAR" manufactured by Hitachi High-Technologies Corporation) at an acceleration voltage of 300 kV and a magnification of 2,000,000.

FIGS. 20A to 20D show results of electron diffraction in regions in the CAAC-OS film with various electron-beam diameters. The regions are indicated by concentric circles in FIG. 19A. The electron diffraction patterns shown in FIGS. 20A to 20D were obtained with a transmission electron microscope ("HF-2000" manufactured by Hitachi High-Technologies Corporation) at an acceleration voltage of 200 kV and electron-beam diameters of 1 nmϕ, 20 nmϕ, 50 nmϕ, and 70 nmϕ. Note that a measurement area of the electron diffraction with a beam diameter of about 1 nmϕ is greater than or equal to 5 nmϕ and less than or equal to 10 nmϕ.

In the case of an electron-beam diameter of 1 nmϕ, a pattern formed by clear spots (bright points) can be observed. As the electron-beam diameter is increased, the spots become unclear but a diffraction pattern can be observed; therefore, the whole film is a CAAC-OS film or a film including a CAAC-OS film.

Figure 21A:
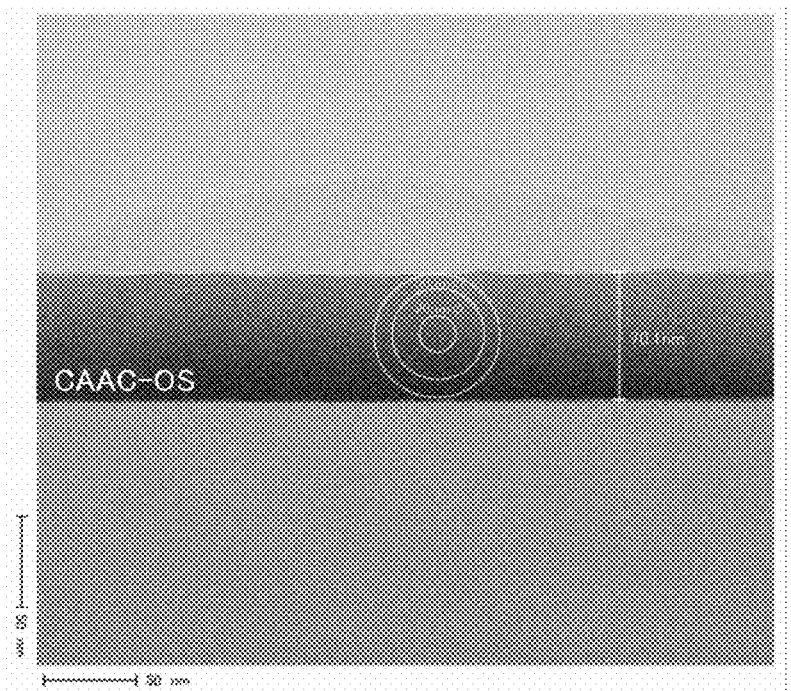
FIGS. 21A and 21B are a cross-sectional TEM image and an X-ray diffraction spectrum of the CAAC-OS film.
Figure 21B:
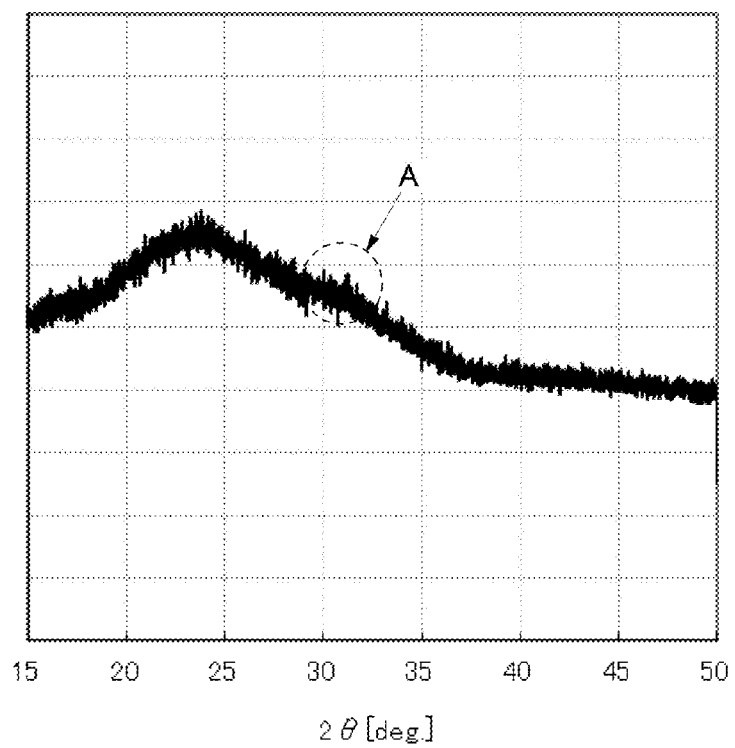
Figure 22A:
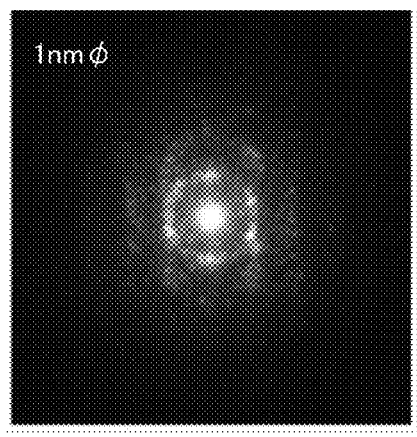
FIGS. 22A to 22D show electron diffraction patterns of the CAAC-OS film.
Figure 22B:
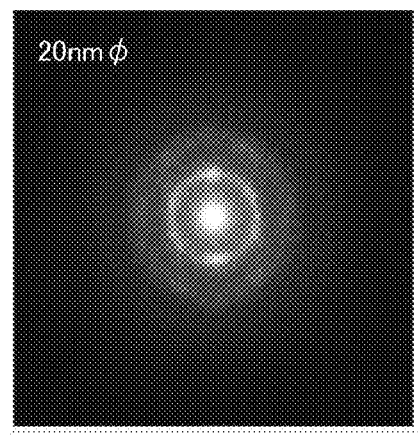
Figure 22C:
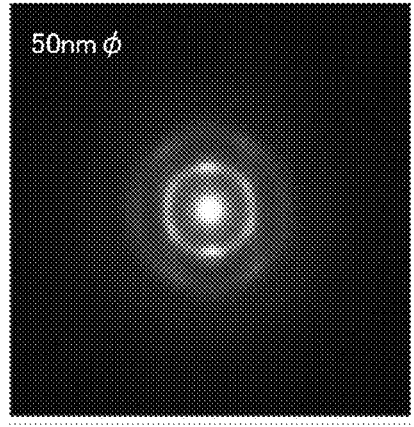
Figure 22D:
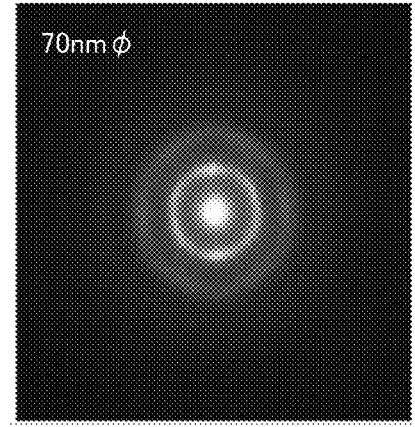

FIGS. 21A and 21B are a cross-sectional TEM image and an X-ray diffraction spectrum of the CAAC-OS film which is used for the cross-sectional TEM observation of FIG. 19A and which is subjected to annealing at 450° C.

FIGS. 22A to 22D show results of electron diffraction in regions in the CAAC-OS film with electron-beam diameters of 1 nmϕ, 20 nmϕ, 50 nmϕ, and 70 nmϕ. The regions are indicated by concentric circles in FIG. 21A. As in the results shown in FIGS. 20A to 20D, in the case of an electron-beam diameter of 1 nmϕ, a pattern formed by clear spots can be observed. Further, as the electron-beam diameter is increased, the spots become unclear but a diffraction pattern can be observed; therefore, the whole film is a CAAC-OS film or a film including a CAAC-OS film.

Figure 23A:
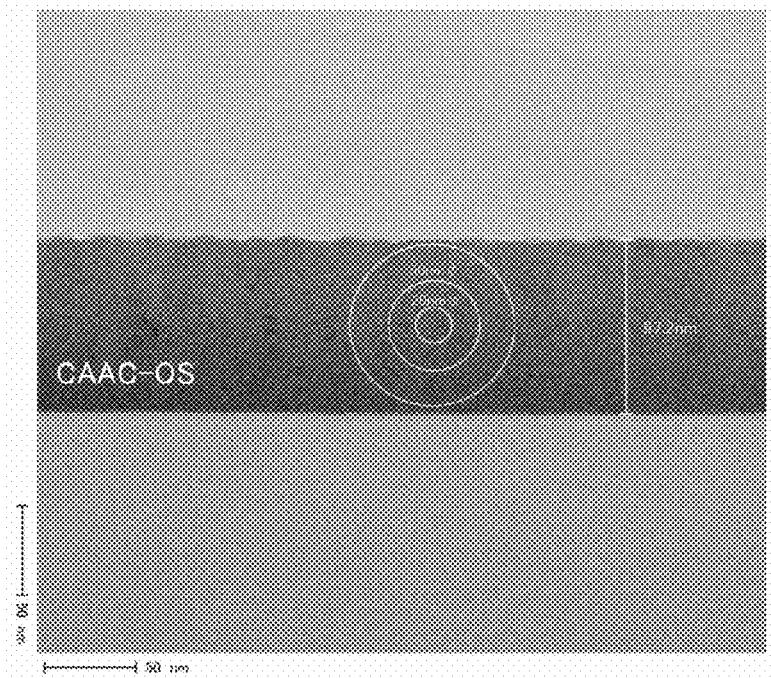
FIGS. 23A and 23B is a cross-sectional TEM image and an X-ray diffraction spectrum of a CAAC-OS film.
Figure 23B:
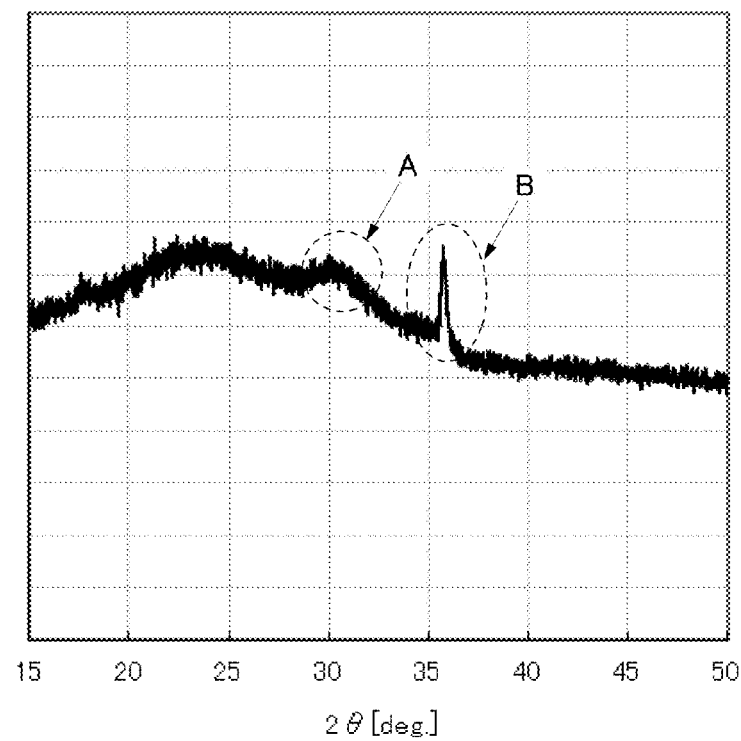
Figure 24A:
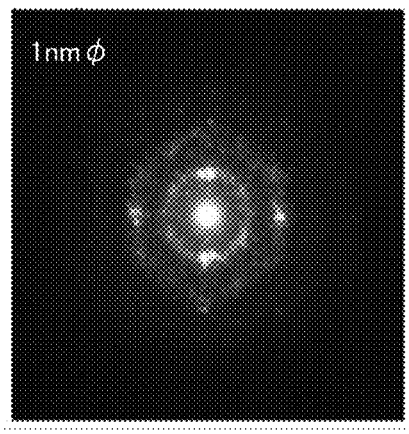
FIGS. 24A to 24D show electron diffraction patterns of the CAAC-OS film.
Figure 24B:
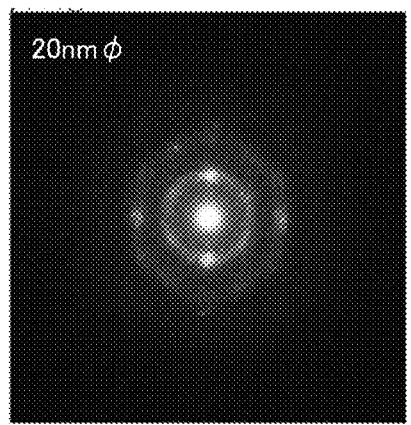
Figure 24C:
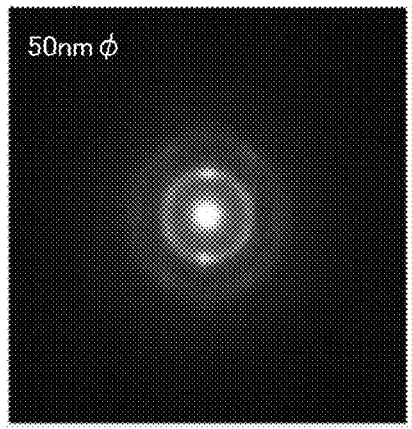
Figure 24D:
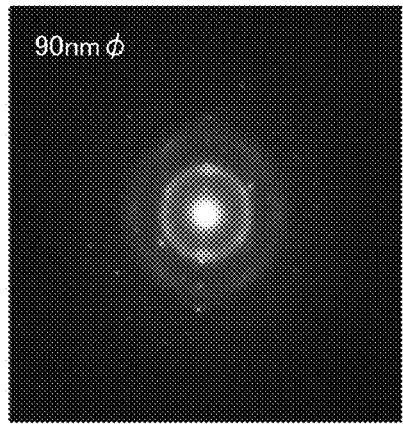

FIGS. 23A and 23B are a cross-sectional TEM image and an X-ray diffraction spectrum of a CAAC-OS film different from the CAAC-OS film used for the cross-sectional TEM observation of FIG. 19A.

In the CAAC-OS film, as shown in FIG. 23B, as well as Peak A indicating a crystal component around 2θ=31°, Peak B which is derived from a spinel crystal structure appears in some cases.

FIGS. 24A to 24D show results of electron diffraction in regions in the CAAC-OS film with electron-beam diameters of 1 nmφ, 20 nmφ, 50 nmφ, and 90 nmφ.

The regions are indicated by concentric circles in FIG. 23A. In the case of an electron-beam diameter of 1 nmφ, a pattern formed by clear spots can be observed. As the electron-beam diameter is increased, the spots become unclear but a diffraction pattern can be observed. Further, in the case of a beam diameter of 90 nmφ, clearer spots can be observed. Accordingly, the whole film is a CAAC-OS film or a film including a CAAC-OS film.

Figure 16:
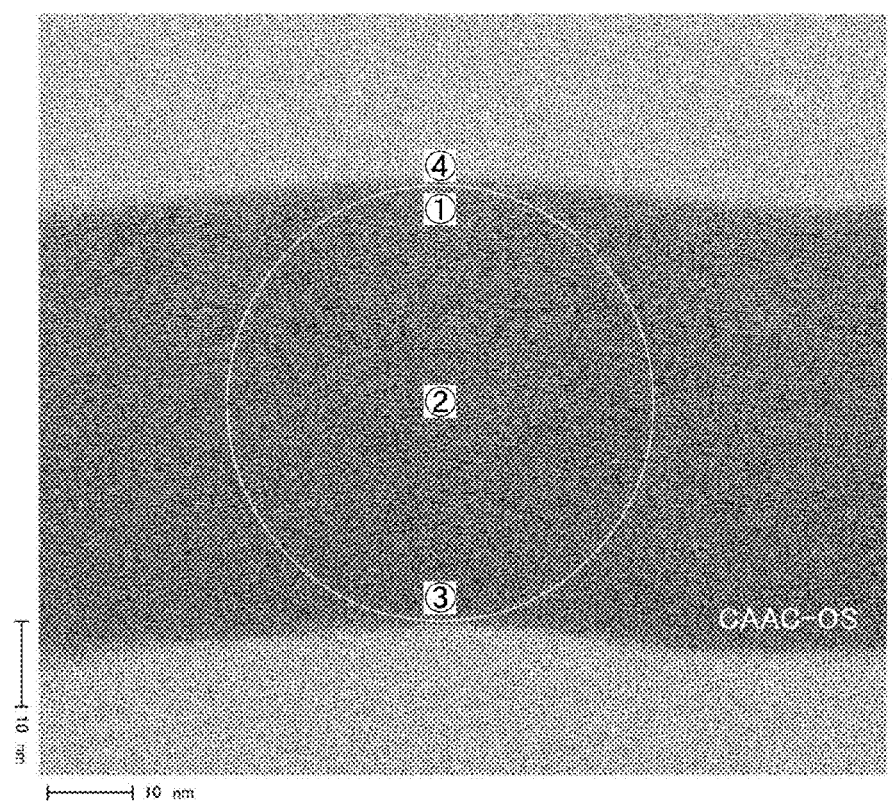
FIG. 16 is a cross-sectional TEM image of a CAAC-OS film.

FIG. 16 is a cross-sectional TEM image of a CAAC-OS film different from the CAAC-OS film used for the cross-sectional TEM observation of FIG. 19A and the cross-sectional TEM observation of FIG. 23A. FIGS. 17A to 17D show electron diffraction patterns obtained by electron diffraction performed on Points 1 to 4 in FIG. 16, respectively.

The electron diffraction patterns shown in FIGS. 17A to 17D were obtained with a transmission electron microscope which is the same as that for FIGS. 20A to 20D at an acceleration voltage of 200 kV and electron-beam diameters of about 1 nmφ or about 50 nmφ.

Figure 17A:
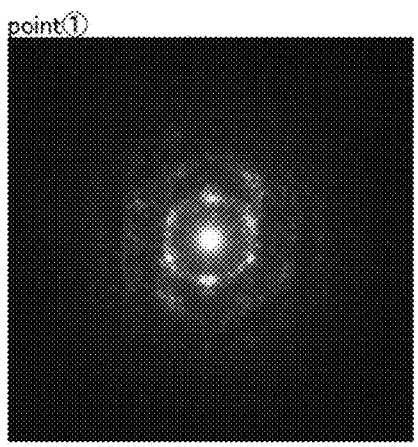
FIGS. 17A to 17D show electron diffraction patterns of the CAAC-OS film.
Figure 17B:
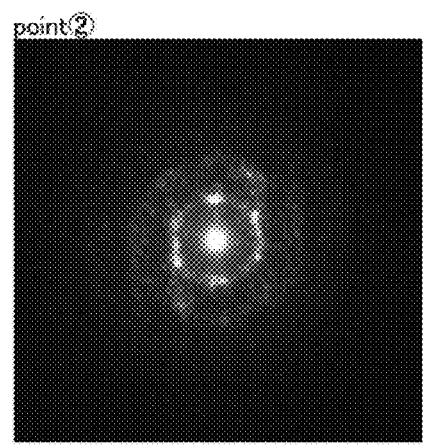
Figure 17C:
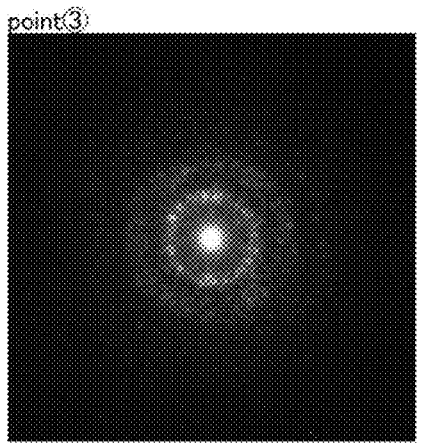
Figure 17D:
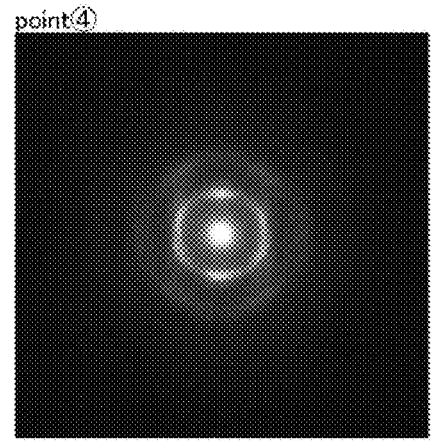

FIGS. 17A, 17B, and 17C are electron diffraction patterns of Point 1 (on the surface side of the film), Point 2 (the center of the film), and Point 3 (on the base side of the film), respectively. These electron diffraction patterns were obtained with a beam diameter of about 1 nmφ. FIG. 17D is an electron diffraction pattern of Point 4 (the whole film), and the electron diffraction pattern was obtained with a beam diameter of about 50 nmφ.

A pattern formed by spots is observed in each of the electron diffraction patterns of Point 1 (on the surface side of the film) and Point 2 (the center of the film), and a slightly broken pattern is observed in Point 3 (on the base side of the film). This indicates that the crystal state varies in the thickness direction in the CAAC-OS film. Note that a pattern formed by spots is observed in Point 4 (the whole film), which indicates that the whole film is a CAAC-OS film or a film including a CAAC-OS film.

Figure 18:
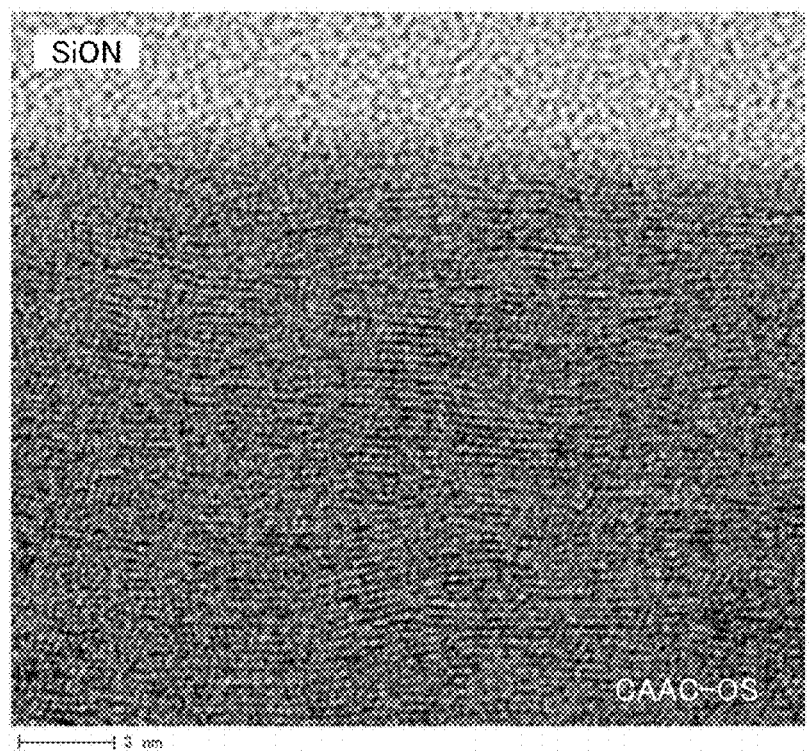
FIG. 18 is a cross-sectional TEM image of the CAAC-OS film.

FIG. 18 is an enlarged view of a portion in the vicinity of Point 1 (on the surface side of the film) in FIG. 16. In FIG. 18, a clear lattice image which shows alignment of the CAAC-OS film extends to the interface with an SiON film that is an interlayer insulating film.

<Electron Diffraction Pattern of Nanocrystalline Oxide Semiconductor Film>

Next, electron diffraction patterns of nanocrystalline oxide semiconductor films are described with reference to FIGS. 25A to 25D, FIGS. 26A and 26B, FIGS. 27A to 27C, FIG. 28, FIG. 29, FIGS. 30A and 30B, and FIG. 31.

An electron diffraction pattern obtained by nanobeam electron diffraction of a nanocrystalline oxide semiconductor film is neither a halo pattern indicating an amorphous state nor a pattern with spots (bright points) having regularity indicating a crystalline state in which crystals are aligned with a specific plane. That is, the nanocrystalline oxide semiconductor film is an oxide semiconductor film whose electron diffraction pattern has spots not having directionality.

Figure 25A:
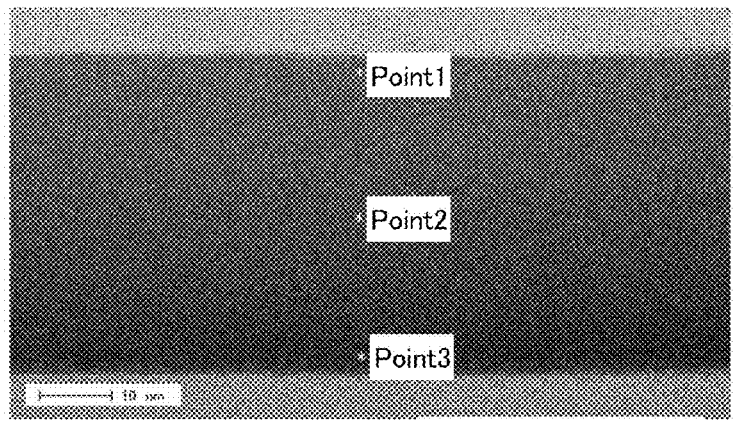
FIGS. 25A to 25D are a cross-sectional TEM image and electron diffraction patterns of a nanocrystalline oxide semiconductor film.
Figure 25B:
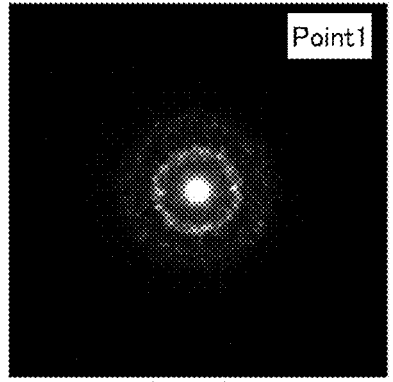
Figure 25C:
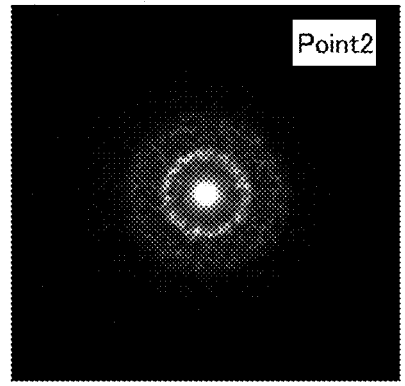
Figure 25D:
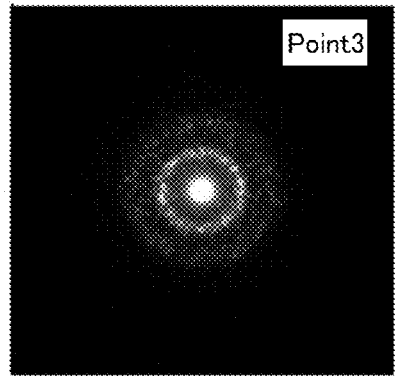

FIG. 25A is a cross-sectional TEM image of a nanocrystalline oxide semiconductor film. FIGS. 25B, 25C, and 25D show electron diffraction patterns obtained by nanobeam electron diffraction performed on Points 1, 2, and 3 in FIG. 25A, respectively.

A sample in which an In—Ga—Zn-based oxide film was formed, as an example of the nanocrystalline oxide semiconductor film in FIGS. 25A to 25D, over a quartz glass substrate to a thickness of 50 nm was used. The nanocrystalline oxide semiconductor film shown in FIGS. 25A to 25D was formed under the following conditions: an oxide target containing In, Ga, and Zn at an atomic ratio of 1:1:1 was used, the atmosphere was an oxygen atmosphere (flow rate of 45 sccm), the pressure was 0.4 Pa, a DC power of 0.5 kW was applied, and the substrate temperature was room temperature. Then, the width of the formed nanocrystalline oxide semiconductor film was reduced to 100 nm or less (e.g., 40 nm±10 nm), and a cross-sectional TEM image and nanobeam electron diffraction patterns were obtained.

FIG. 25A is the cross-sectional TEM image of the nanocrystalline oxide semiconductor film which was taken with a transmission electron microscope ("H-9000NAR" manufactured by Hitachi High-Technologies Corporation) at an acceleration voltage of 300 kV and at a magnification of 2,000,000. FIGS. 25B to 25D show the electron diffraction patterns obtained by nanobeam electron diffraction with a beam diameter of about 1 nmφ, with a transmission electron microscope ("HF-2000" manufactured by Hitachi High-Technologies Corporation) at an acceleration voltage of 200 kV. Note that the measurement area of the nanobeam electron diffraction with a beam diameter of about 1 nmφ is greater than or equal to 5 nmφ and less than or equal to 10 nmφ.

As shown in FIG. 25B, in the nanobeam electron diffraction pattern of the nanocrystalline oxide semiconductor film, a plurality of circumferentially arranged spots are observed. In other words, in the pattern of the nanocrystalline oxide semiconductor film, a plurality of circumferentially (concentrically) distributed spots are observed, or a plurality of circumferentially distributed spots form a plurality of concentric circles.

In FIG. 25C showing the central portion of the nanocrystalline oxide semiconductor film in the thickness direction and in FIG. 25D showing the vicinity of an interface between the nanocrystalline oxide semiconductor film and the quartz glass substrate, a plurality of circumferentially distributed spots are observed as in FIG. 25B. In FIG. 25C, the distance from a main spot to each of the circumferentially distributed spots is in a range from 3.88/nm to 4.93/nm, or from 0.203 nm to 0.257 nm when converted into interplanar spacing.

The nanobeam electron diffraction patterns shown in FIGS. 25B to 25D indicate that the nanocrystalline oxide semiconductor film includes a plurality of crystal parts whose surface orientations are random and whose sizes are different from each other.

Figure 26A:
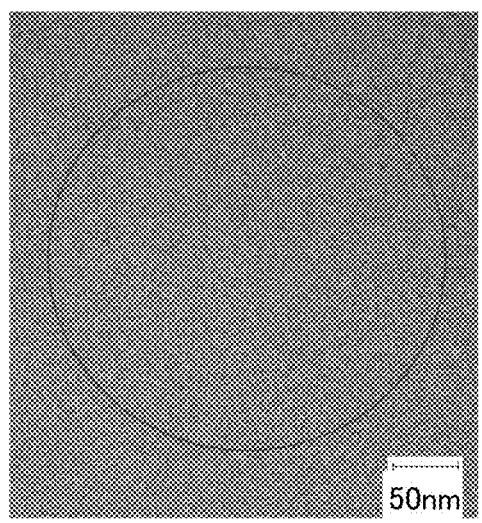
FIGS. 26A and 26B are a plane TEM image and an electron diffraction pattern of a nanocrystalline oxide semiconductor film.
Figure 26B:
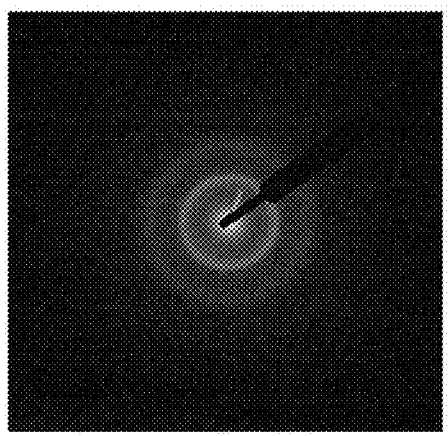

FIG. 26A is a plane TEM image of a nanocrystalline oxide semiconductor film. FIG. 26B shows an electron diffraction pattern obtained by selected-area electron diffraction performed on a region surrounded by a circle in FIG. 26A.

A sample in which an In—Ga—Zn-based oxide film was formed, as an example of the nanocrystalline oxide semiconductor film shown in FIGS. 26A and 26B, over a quartz glass substrate to a thickness of 30 nm was used. The nanocrystalline oxide semiconductor film shown in FIGS. 26A and 26B was formed under the following conditions: an oxide target containing In, Ga, and Zn at an atomic ratio of 1:1:1 was used, the atmosphere was an oxygen atmosphere (flow rate of 45 sccm), the pressure was 0.4 Pa, a DC power of 0.5 kW was applied, and the substrate temperature was room temperature. Then, the sample was thinned, and the plane TEM image and the selected-area electron diffraction pattern of the nanocrystalline oxide semiconductor film were obtained.

FIG. 26A is the plane TEM image of the nanocrystalline oxide semiconductor film which was taken with a transmission electron microscope ("H-9000NAR" manufactured by Hitachi High-Technologies Corporation) at an acceleration voltage of 300 kV and at a magnification of 500,000. FIG. 26B is the electron diffraction pattern obtained by electron diffraction with a selected area of 300 nm$\phi$. Note that the measurement area is greater than or equal to 300 nm$\phi$ in consideration of electron beam expansion.

As shown in FIG. 26B, the electron diffraction pattern of the nanocrystalline oxide semiconductor film which was obtained by selected-area electron diffraction the measurement area of which is wider than that of the nanobeam electron diffraction is a halo pattern, in which the plurality of spots observed by the nanobeam electron diffraction are not observed.

Figure 27A:
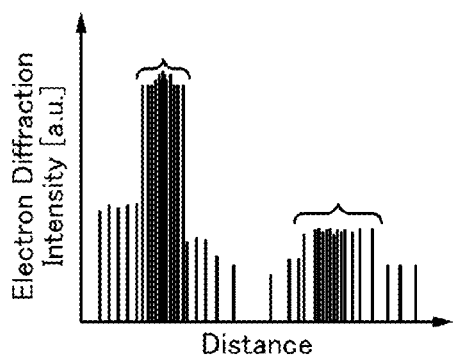
FIGS. 27A to 27C are conceptual diagrams of electron diffraction intensity distribution.
Figure 27B:
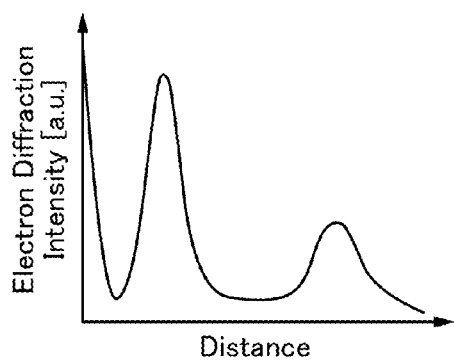
Figure 27C:
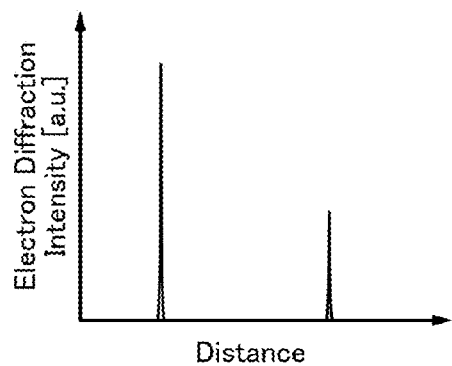

FIGS. 27A to 27C conceptually show diffraction intensity distribution in the electron diffraction patterns shown in FIGS. 25B to 25D and FIG. 26B. FIG. 27A is a conceptual diagram showing diffraction intensity distribution in the nanobeam electron diffraction patterns shown in FIGS. 25B to 25D. FIG. 27B is a conceptual diagram showing diffraction intensity distribution in the selected-area electron diffraction pattern shown in FIG. 26B. FIG. 27C is a conceptual diagram showing diffraction intensity distribution in an electron diffraction pattern of a single crystal structure or a polycrystalline structure.

In each of FIGS. 27A to 27C, the vertical axis represents the electron diffraction intensity (arbitrary unit) indicating distribution of spots or the like and the horizontal axis represents the distance from a main spot.

In FIG. 27C for the single crystal structure or the polycrystalline structure, spots are observed at a specific distance from the main spot, which is based on interplanar spacing (d value) between planes with which crystal parts are aligned.

As shown in each of FIGS. 25B to 25D, a circumferential region formed by the plurality of spots observed in the nanobeam electron diffraction pattern of the nanocrystalline oxide semiconductor film has a relatively large width. Thus, FIG. 27A shows discrete distribution. Further, in the nanobeam electron diffraction pattern, a region with high luminance formed by spots which are not clear is observed in a region between concentric circles.

Further, the electron diffraction intensity distribution in the selected-area electron diffraction pattern of the nanocrystalline oxide semiconductor film is continuous as shown in FIG. 27B. Since FIG. 27B can approximate a result obtained by widely observing the electron diffraction intensity distribution shown in FIG. 27A, the continuous intensity distribution can be considered to result from the overlapping and connection of the plurality of spots.

FIGS. 27A to 27C indicate that the nanocrystalline oxide semiconductor film includes a plurality of crystal parts whose surface orientations are random and whose sizes are different from each other and that the crystal parts are so minute that spots are not observed in the selected-area electron diffraction pattern.

In FIGS. 25B to 25D in which the plurality of spots are observed, the width of the nanocrystalline oxide semiconductor film is 50 nm or less. Further, since the diameter of the electron beam was reduced to 1 nm$\phi$, the measurement area is greater than or equal to 5 nm and less than or equal to 10 nm. Thus, it is assumed that the diameter of the crystal part included in the nanocrystalline oxide semiconductor film is 50 nm or less, for example, 10 nm or less or 5 nm or less.

Figure 28:
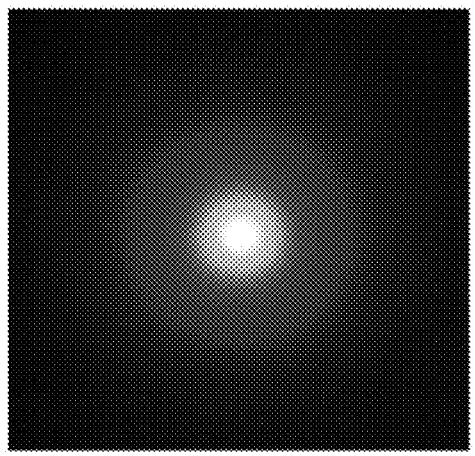
FIG. 28 shows an electron diffraction pattern of a quartz glass substrate.

FIG. 28 shows a nanobeam electron diffraction pattern of a quartz glass substrate. The measurement conditions were similar to those for the electron diffraction patterns shown in FIGS. 25B to 25D.

As shown in FIG. 28, the nanobeam electron diffraction pattern of the quartz glass substrate having an amorphous structure is a halo pattern without specific spots in which the luminance is gradually changed form a main spot. This means that a plurality of circumferentially distributed spots like those observed in the pattern of the nanocrystalline oxide semiconductor film are not observed in the pattern of a film having an amorphous structure even when electron diffraction is performed on a minute region. This indicates that the plurality of circumferentially distributed spots observed in FIGS. 25B to 25D are peculiar to the nanocrystalline oxide semiconductor film.

Figure 29:
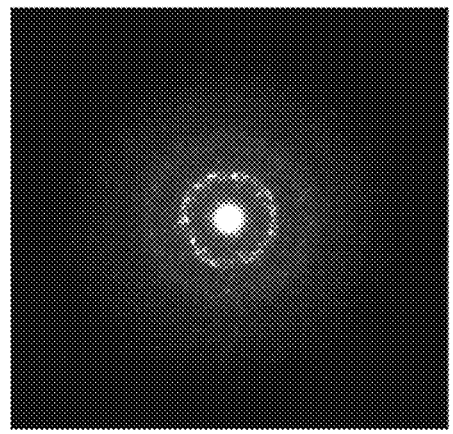
FIG. 29 shows an electron diffraction pattern of the nanocrystalline oxide semiconductor film.

FIG. 29 shows an electron diffraction pattern obtained after one-minute irradiation of Point 2 in FIG. 25A with an electron beam whose diameter was reduced to about 1 nm$\phi$.

As in the electron diffraction pattern shown in FIG. 25C, a plurality of circumferentially distributed spots are observed in the electron diffraction pattern shown in FIG. 29, and there is no significant difference from FIG. 25C. This means that the crystal part observed in the electron diffraction pattern shown in FIG. 25C existed at the time of the formation of the oxide semiconductor film and did not result from irradiation with the electron beam with the reduced diameter.

Figure 30A:
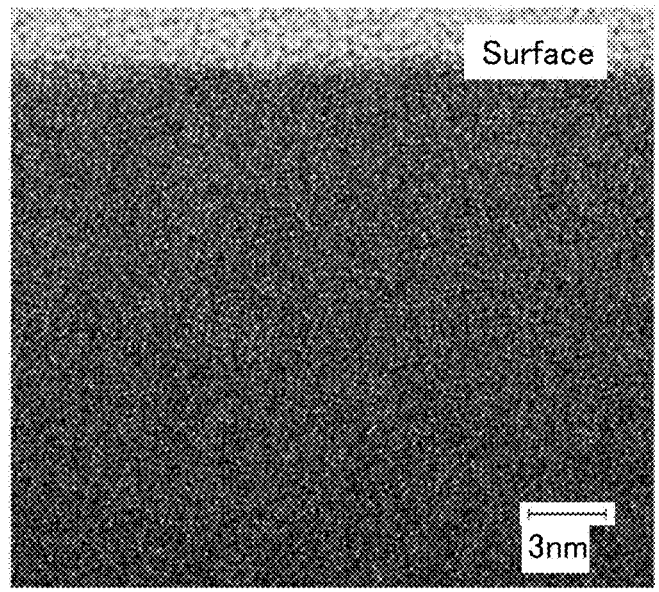
FIGS. 30A and 30B are cross-sectional TEM images of the nanocrystalline oxide semiconductor film.
Figure 30B:
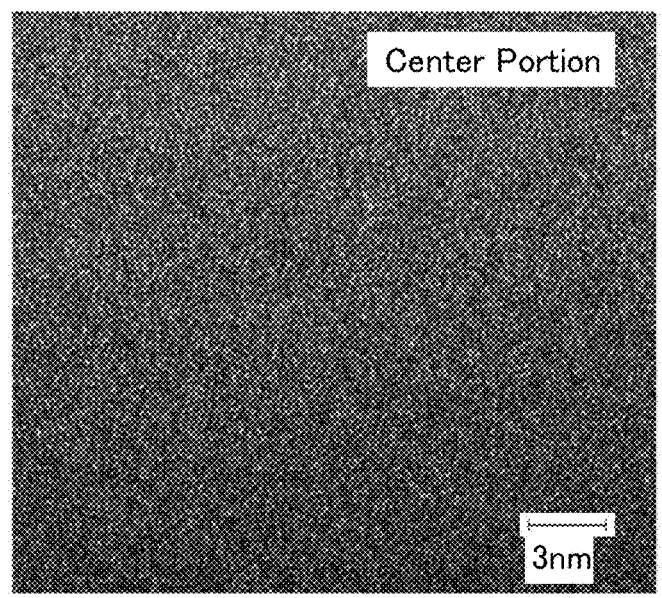

FIGS. 30A and 30B are enlarged images of portions in the cross-sectional TEM image of FIG. 25A. FIGS. 30A and 30B are cross-sectional TEM images of the vicinity of Point 1 (the surface of the nanocrystalline oxide semiconductor film) and Point 2 (the central portion of the nanocrystalline oxide semiconductor film in the thickness direction), respectively, in FIG. 25A, which were observed at an observation magnification of 8,000,000.

According to each of the TEM images of FIGS. 30A and 30B, a crystalline structure cannot be clearly observed in the nanocrystalline oxide semiconductor film.

Figure 31:
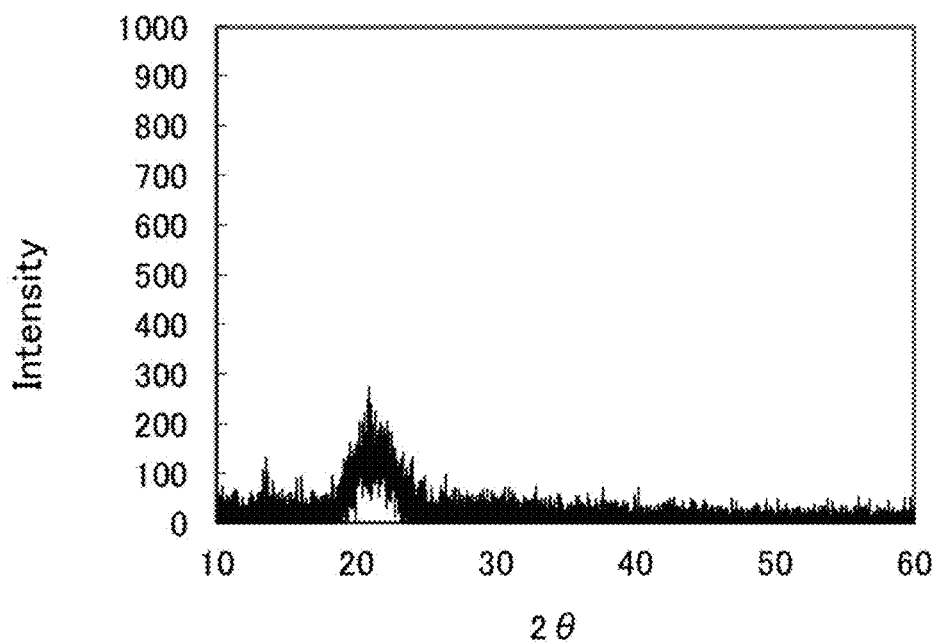
FIG. 31 shows the results of X-ray diffraction analysis of the nanocrystalline oxide semiconductor film.

The samples for the electron diffraction patterns shown in FIGS. 25A to 25D and FIGS. 26A and 26B, in each of which a nanocrystalline oxide semiconductor film was formed over the quartz glass substrate, were analyzed by XRD. FIG. 31 shows an XRD spectrum of the samples measured by an out-of-plane method.

In FIG. 31, the vertical axis represents the X-ray diffraction intensity (arbitrary unit) and the horizontal axis represents the diffraction angle 2θ (degree). Note that the XRD spectrum was measured with an X-ray diffractometer, D8 ADVANCE manufactured by Bruker AXS.

As shown in FIG. 31, a peak corresponding to quartz is observed at around 2θ=20° to 23°; however, a peak corresponding to the crystal part included in the nanocrystalline oxide semiconductor film cannot be observed.

The results in FIGS. 30A and 30B and FIG. 31 also indicate that the crystal part included in the nanocrystalline oxide semiconductor film is minute.

As described above, in the case of the nanocrystalline oxide semiconductor film described in this embodiment, a peak indicating an orientation was not observed by XRD analysis the measurement area of which is wide and the electron diffraction pattern obtained by selected-area electron diffraction the measurement area of which is wide is a halo pattern. This indicates that the nanocrystalline oxide semiconductor film is macroscopically equivalent to a film having disordered atomic arrangement. However, spots can be observed in the nanobeam electron diffraction pattern of the nanocrystalline oxide semiconductor film which was obtained by nanobeam electron diffraction in which the diameter of an electron beam is sufficiently small (e.g., 10 nmϕ or less). Thus, it can be assumed that the nanocrystalline oxide semiconductor film described in this embodiment is a film in which minute crystal parts having random surface orientations (e.g., crystal parts each with a diameter of 10 nm or less, 5 nm or less, or 3 nm or less) cohere. A nanocrystal region including the minute crystal parts is included in the entire region of the nanocrystalline oxide semiconductor film in the thickness direction.

This embodiment can be implemented in appropriate combination with the structures described in the other embodiments.

(Embodiment 4)

In this embodiment, a semiconductor device including the transistor described in the above embodiment is described as an example.

<Electronic Device on which Microcomputer is Mounted>

Any of the above transistors can be used for microcomputers which are mounted on various electronic devices. A structure and operation of an alarm device (in particular, a fire alarm) as an example of an electronic device on which the microcomputer is mounted are described below with reference to FIG. 32 and FIGS. 32A to 32C.

The fire alarm in this specification refers to any system which raises an alarm over fire occurrence instantly and includes, for example, a residential fire alarm, an automatic fire alarm system, and a fire detector used for the automatic fire alarm system in its category.

[Structural Example of Alarm Device]

Figure 32:
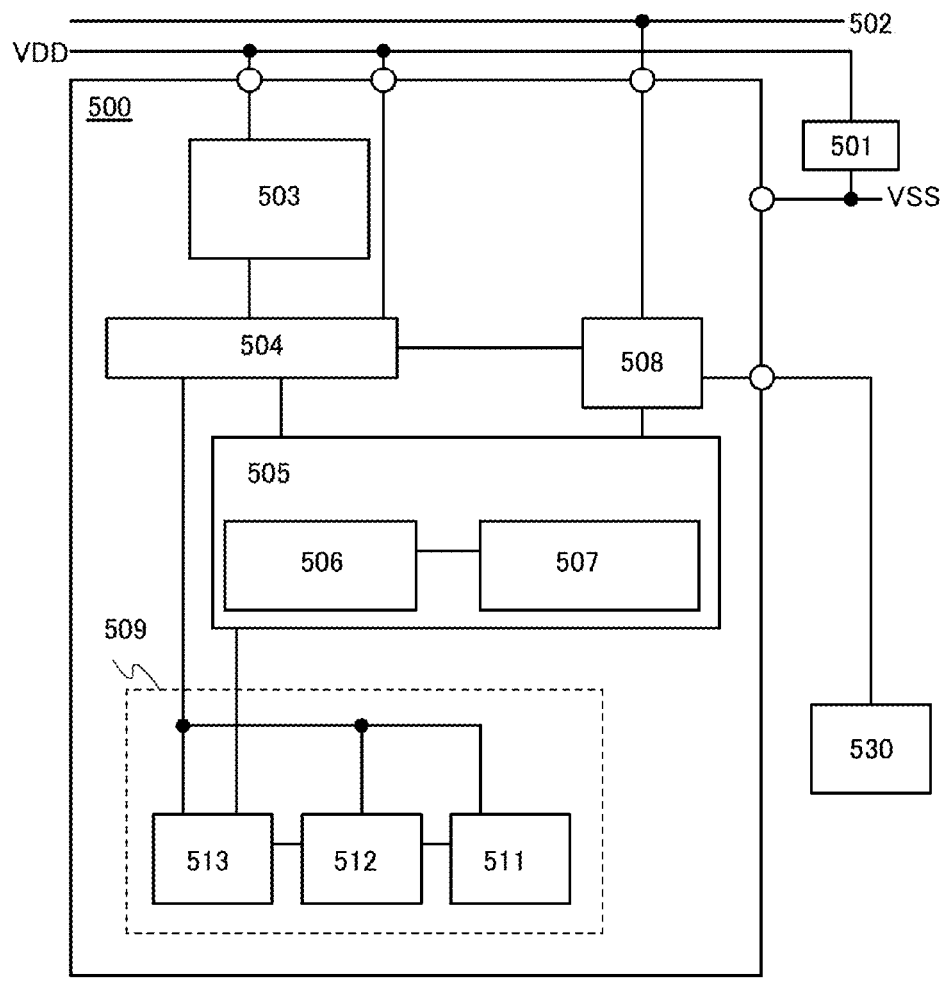
FIG. 32 is a block diagram illustrating an example of a semiconductor device.

An alarm device illustrated in FIG. 32 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a central processing unit (CPU) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 through an interface 508. The interface 508 as well as the CPU 505 is electrically connected to the power gate 504. As a bus standard of the interface 508, for example, an I²C bus or the like can be used. A light-emitting element 530 electrically connected to the power gate 504 via the interface 508 is provided in the alarm system.

The light-emitting element 530 is preferably an element which emits light with high directivity, and for example, a light-emitting element utilizing electroluminescence (EL), an LED, or the like can be used. Light-emitting elements utilizing EL are categorized by whether a light-emitting material is an organic compound or an inorganic compound, and in general, the former is called an organic EL element and the latter is called an inorganic EL element.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby power consumption can be reduced compared with the case where power is continuously supplied to the above structures.

In the case where a transistor is used as the power gate 504, it is preferable to use a transistor which has extremely low off-state current and is used for the nonvolatile memory portion 507, for example, the transistor described in the above embodiment. With the use of such a transistor, leakage current can be reduced when supply of power is stopped by the power gate 504, so that a reduction in power consumption of the alarm device can be achieved.

A direct-current power source 501 may be provided in the alarm system so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. Further, the low potential power supply line VSS is supplied with a low potential L, e.g., a ground potential (GND).

In the case where a battery is used as the direct-current power source 501, for example, a battery case including an electrode electrically connected to the high potential power supply line VDD, an electrode electrically connected to the low potential power supply line VSS, and a housing which can hold the battery may be provided in a housing. Note that the alarm system does not necessarily include the direct-current power source 501 and may have, for example, a structure in which power is supplied from an alternate-current power source provided outside the alarm system through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 509 measures a physical quantity relating to an abnormal situation and transmits a measurement value to the CPU 505. A physical quantity relating to an abnormal situation depends on the usage of the alarm device, and in an alarm device functioning as a fire alarm, a physical quantity relating to a fire is measured. Accordingly, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

The optical sensor 511 includes at least a photoelectric conversion element such as a photodiode.

The photoelectric conversion element can be fabricated with the use of a semiconductor film which can perform photoelectric conversion, and for example, silicon, germanium, or the like can be used. There is a difference between silicon and germanium in wavelengths of absorbed electromagnetic waves. Thus, in the case where silicon is used for the semiconductor film, the photoelectric conversion element serves as a sensor which senses visible light; and in the case where germanium is used for the semiconductor film, the photoelectric conversion element serves as a sensor which senses infrared rays.

In the above manner, the sensor portion 509 including the optical sensor 511 can be incorporated into the microcomputer 500, so that the number of components can be reduced and the size of the housing of the alarm device can be reduced.

In the fire alarm including the above-described IC chip, the CPU 505 in which a plurality of circuits including the above transistor are combined and mounted on one IC chip is used.

[Configuration Example of CPU]

Figure 33A:
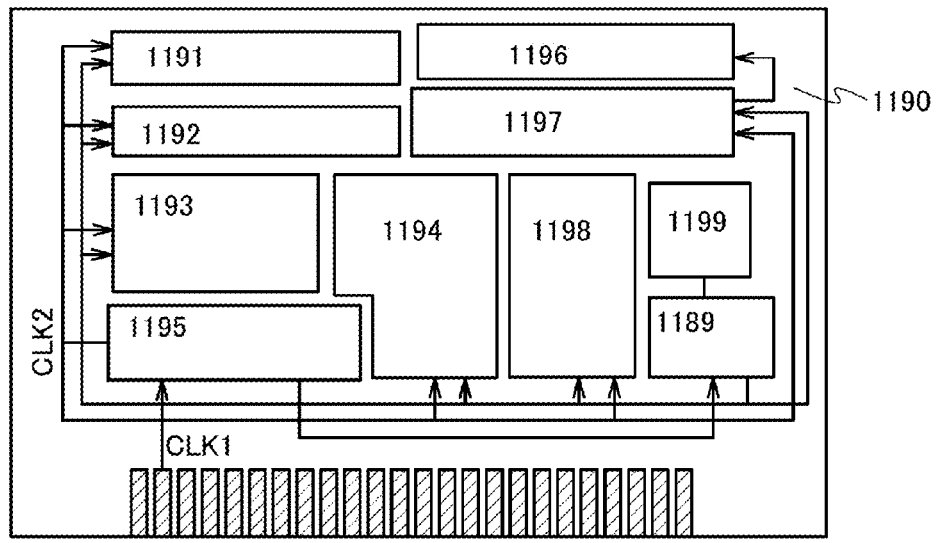
FIGS. 33A to 33C are a block diagram illustrating an example of a semiconductor device.
Figure 33B:
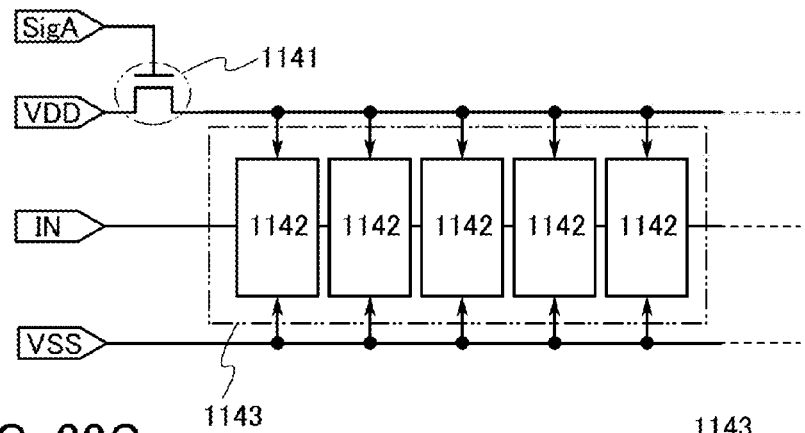
Figure 33C:
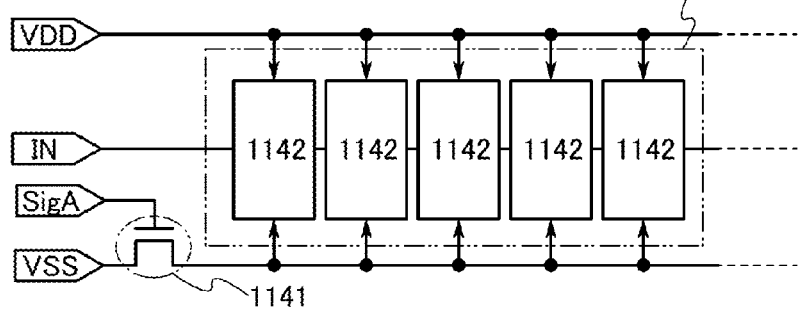

FIGS. 33A to 33C are block diagrams illustrating a specific configuration of a CPU.

The CPU illustrated in FIG. 33A includes an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 33A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 33A, a memory cell is provided in the register 1196. As the memory cell of the register 1196, the transistor described in any of the above embodiments can be used.

In the CPU illustrated in FIG. 33A, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 33B or FIG. 33C. Circuits illustrated in FIGS. 33B and 33C are described below.

FIGS. 33B and 33C each illustrate a memory device in which the transistor described in any of the above embodiments is used as a switching element which controls supply of a power supply potential to a memory cell.

The memory device illustrated in FIG. 33B includes a switching element 1141 and a memory cell group 1143 including a plurality of memory cells 1142. Specifically, as each of the memory cells 1142, the transistor described in any of the above embodiments can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 33B, the transistor described in any of the above embodiments is used as the switching element 1141, and the switching of the transistor is controlled by a signal SigA supplied to a gate electrode layer thereof.

Note that FIG. 33B illustrates the configuration in which the switching element 1141 includes only one transistor; however, without particular limitation thereon, the switching element 1141 may include a plurality of transistors. In the case where a plurality of transistors which function as the switching element 1141 are included, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 33B, the switching element 1141 may control the supply of the low-level power supply potential VSS.

In FIG. 33C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, the transistor can also be applied to an LSI such as a digital signal processor (DSP), a custom LSI, or a field programmable gate array (FPGA).

[Structural Example of Semiconductor Device]

An example of a structure of a semiconductor device which can be applied to a microcomputer using a nonvolatile memory unit is described with reference to FIG. 34.

Figure 34:
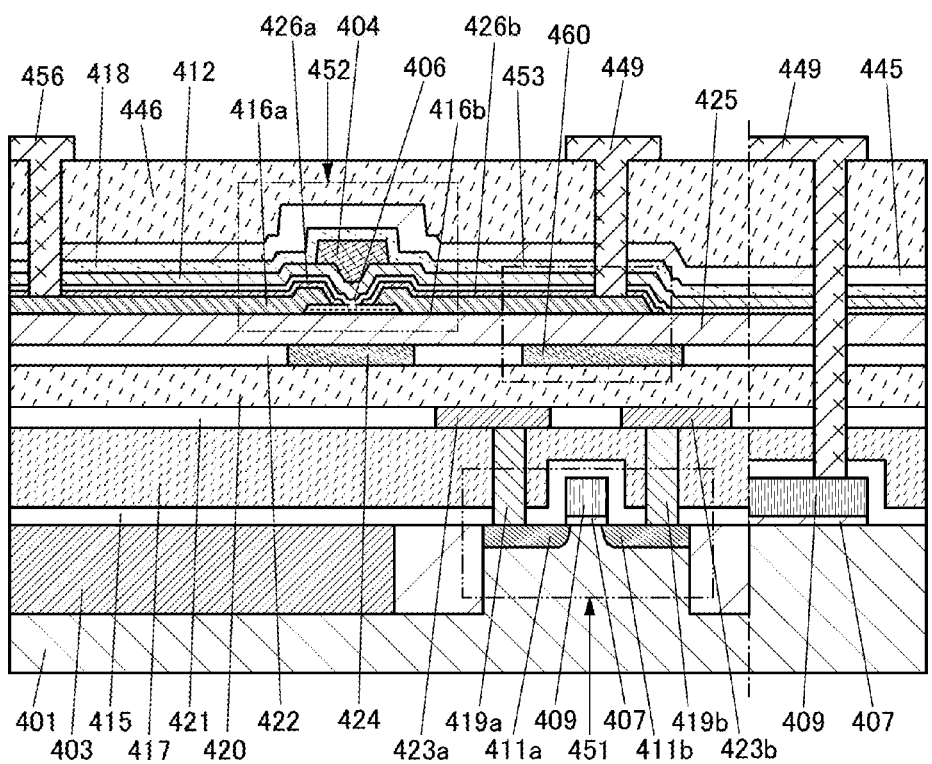
FIG. 34 illustrates an example of a semiconductor device.

A semiconductor device illustrated in FIG. 34 includes an element separation layer 403 and an n-channel transistor 451.

The element separation layer 403 is formed in a p-type semiconductor substrate 401. The n-channel transistor 451 includes a gate insulating layer 407, a gate electrode 409, an n-type impurity region 411a, and an n-type impurity region 411b. An insulating layer 415 and an insulating layer 417 are provided over the transistor 451.

In the semiconductor substrate 401, the transistor 451 is separated from other semiconductor elements (not illustrated) by the element separation layer 403. The element separation layer 403 can be formed by a local oxidation of silicon (LOCOS) method, a shallow trench isolation (STI) method, or the like.

Note that in the transistor 451, sidewall insulating layers may be formed on side surfaces of the gate electrode 409, and a region whose impurity concentration is different from those of the n-type impurity region 411a and the n-type impurity region 411b may be provided in the n-type impurity region 411a and the n-type impurity region 411b.

In openings formed by selectively etching parts of the insulating layer 415 and the insulating layer 417, a contact plug 419a and a contact plug 419b are formed. An insulating layer 421 is provided over the insulating layer 417, the contact plug 419a, and the contact plug 419b. In openings formed by selectively etching part of the insulating layer 421, a wiring 423a at least partly overlapping with the contact plug 419a, and a wiring 423b at least partly overlapping with the contact plug 419b are formed. The wiring 423a is connected to the contact plug 419a. The wiring 423b is connected to the contact plug 419b.

Further, an insulating layer 420 formed by a sputtering method, a CVD method, or the like is provided over the insulating layer 421, the wiring 423a, and the wiring 423b. An insulating layer 422 is formed over the insulating layer 420. An electrode 424 is formed in an opening which is formed by selectively etching a part of the insulating layer 422, and at least partly overlaps with the stack 406. A stack 406 includes an oxide semiconductor layer. The electrode 424 serves as a back gate electrode of a transistor 452 and can control the threshold voltage of the transistor 452. In an opening which is formed by selectively etching a part of the insulating layer 422, an electrode 460 is formed to overlap with the first drain electrode 416b or a second drain electrode 426b.

An insulating layer 425 formed by a sputtering method, a CVD method, or the like is provided over the insulating layer 422, the electrode 424, and the electrode 460. The transistor 452 is provided over the insulating layer 425.

As the transistor 452, any of the transistors described in the above embodiments can be used. A change in the electrical characteristics of any of the transistors described in the above embodiment is suppressed and thus the transistors are electrically stable. Accordingly, a semiconductor device with high reliability can be provided as the semiconductor device of this embodiment in FIG. 34.

Note that FIG. 34 illustrates the case where a transistor having a structure similar to that of the transistor 100 described in the above embodiment is used as the transistor 452.

The transistor 452 includes the stack 406 over the insulating layer 425; a source electrode 416a and a drain electrode 416b which are over the stack 406 (an oxide semiconductor layer included in the stack 406); a source electrode 426a over the source electrode 416a; the drain electrode 426b over the drain electrode 416b; a gate insulating layer 412 over the stack 406; and a gate electrode 404 over the gate insulating layer 412. In addition, an insulating layer 418, an insulating layer 445, and an insulating layer 446 which cover the transistor 452 are provided. Over the insulating layer 446, a wiring 449 which is connected to the drain electrode 416b and a wiring 456 which is connected to the source electrode 416a are provided. The wiring 449 functions as a node at which the drain electrode of the transistor 452 is electrically connected to the gate electrode 409 of the n-channel transistor 451.

In this embodiment, the structure where the wiring 449 is connected to the drain electrode 416b is described; however, the structure is not limited thereto. For example, the wiring 449 may be connected to the drain electrode 426b. Further, the structure where the wiring 456 is connected to the source electrode 416a is shown; however, the structure is not limited thereto. For example, the wiring 456 may be connected to the source electrode 426a.

A part where the drain electrode 416b and the electrode 460 overlap with the oxide insulating layer 425 interposed therebetween or a part where the drain electrode 426b and the electrode 460 overlap with the insulating layer 425 interposed therebetween functions as a capacitor 453. For example, VSS is supplied to the electrode 460.

Note that the capacitor 453 is not necessarily provided. For example, in the case where parasitic capacitance of the n-channel transistor 451 or the like is sufficiently large, a structure without the capacitor 453 may be employed.

The transistor 451 is formed using a semiconductor other than an oxide semiconductor, such as single crystal silicon, so that the transistor can operate at a sufficiently high speed. Thus, when the transistor is used as a reading transistor, information can be read at a high speed.

The transistor 452 is preferably a transistor showing an extremely low off-state current. In this embodiment, a transistor including an oxide semiconductor is described as an example of a transistor showing an extremely low off-state current.

<Display Device>

The transistor described above can be used for a display device. Moreover, some or all of driver circuits which include the transistor described in the above embodiment can be formed over a substrate where a pixel portion is formed, whereby a system-on-panel can be obtained. Structural examples of a display device to which the above-described transistor can be used are described with reference to FIGS. 35A to 35C, FIGS. 36A and 36B, and FIGS. 37A and 37B.

As a display element provided in the display device, a liquid crystal element, a light-emitting element, or the like can be used. A light-emitting element includes, in its category, an element whose luminance is controlled by current or voltage, and specifically an inorganic EL element, an organic EL element, and the like. Furthermore, a display medium whose contrast is changed by an electric effect, such as electronic ink, can be used as the display element. A display device including a liquid crystal element and a display device including an EL element are described below as examples of the display device.

[Liquid Crystal Display Device and EL Display Device]

Figure 35A:
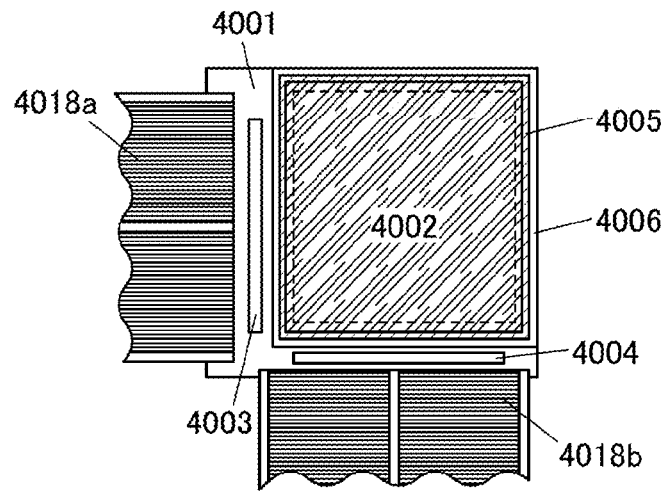
FIGS. 35A to 35C each illustrate an example of a display device.

In FIG. 35A, a sealant 4005 is provided so as to surround a pixel portion 4002 provided over a first substrate 4001. The pixel portion 4002 is sealed by the first substrate 4001, the sealant 4005, and a second substrate 4006. In FIG. 35A, a signal line driver circuit 4003 and a scan line driver circuit 4004 each are formed using a single crystal semiconductor or a polycrystalline semiconductor over another substrate, and mounted in a region different from the region surrounded by the sealant 4005 over the first substrate 4001. Various signals and potentials are supplied to the signal line driver circuit 4003, the scan line driver circuit 4004, and the pixel portion 4002 through flexible printed circuits (FPCs) 4018a and 4018b.

Figure 35B:
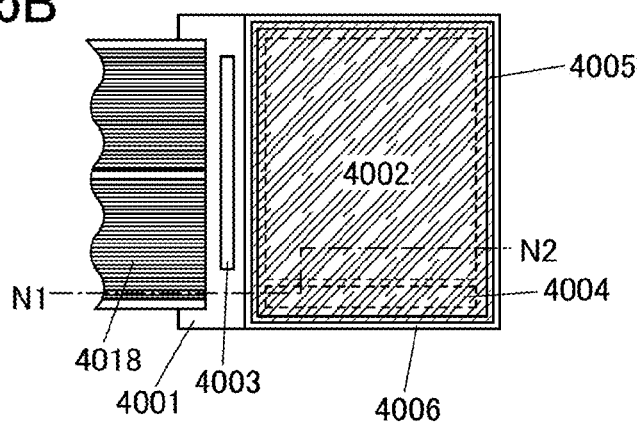
Figure 35C:
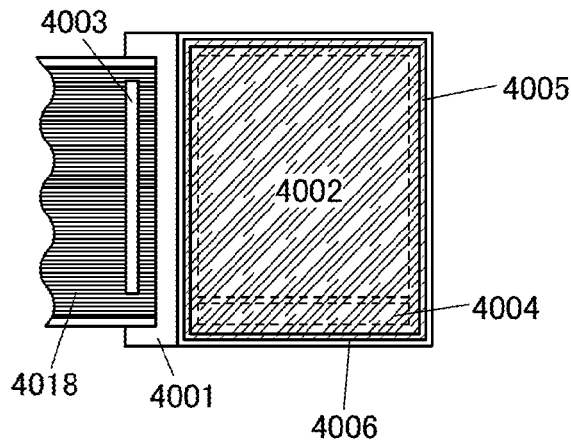

In FIGS. 35B and 35C, the sealant 4005 is provided so as to surround the pixel portion 4002 and the scan line driver circuit 4004 which are provided over the first substrate 4001. The pixel portion 4002 and the scan line driver circuit 4004 are sealed together by the first substrate 4001, the sealant 4005, and the second substrate 4006. Further, in FIGS. 35B and 35C, the signal line driver circuit 4003 which is formed using a single crystal semiconductor or a polycrystalline semiconductor over another substrate is mounted in a region that is different from the region surrounded by the sealant 4005 over the first substrate 4001. In FIGS. 35B and 35C, various signals and potentials are supplied to the signal line driver circuit 4003, the scan line driver circuit 4004, and the pixel portion 4002 through an FPC 4018.

Although FIGS. 35B and 35C each illustrate an example in which the signal line driver circuit 4003 is formed separately and mounted on the first substrate 4001, an embodiment of the present invention is not limited to this structure. The scan line driver circuit may be separately formed and then mounted, or only part of the signal line driver circuit or only part of the scan line driver circuit may be separately formed and then mounted.

The connection method of a separately formed driver circuit is not particularly limited; wire bonding, a chip on glass (COG), a tape carrier package (TCP), a chip on film (COF), or the like can be used. FIG. 35A illustrates an example in which the signal line driver circuit 4003 and the scan line driver circuit 4004 are mounted by a COG; FIG. 35B illustrates an example in which the signal line driver circuit 4003 is mounted by a COG; FIG. 35C illustrates an example in which the signal line driver circuit 4003 is mounted by a TCP.

The display device in this specification also includes the following modules in its category: a module to which a connector such as an FPC or a TCP is attached; a module having a TCP or the like at the tip of which a printed wiring board is provided; and a module in which an integrated circuit (IC) is directly mounted on a display element by a COG.

The pixel portion 4002 and the scan line driver circuit 4004 provided over the first substrate 4001 include a plurality of transistors to which the transistor which is described in the above embodiment can be applied.

FIGS. 36A and 36B are cross-sectional views taken along dashed-dotted line N1-N2 in FIG. 35B. As shown in FIGS. 36A and 36B, the semiconductor device has an electrode 4015, and the electrode 4015 is electrically connected to a terminal included in the FPC 4018 through an anisotropic conductive layer 4019. The electrode 4015 is electrically connected to a wiring 4014 through an opening formed in an insulating layer 4020 and an insulating layer 4022.

The electrode 4015 is formed of the same conductive layer as a first electrode 4030, and the wiring 4014 is formed of the same conductive layer as a source and drain electrodes of transistors 4010 and 4011.

In FIG. 36A, the electrode 4015 and the wiring 4014 are connected to each other in the opening formed in the insulating layer 4020 and the insulating layer 4022, and in FIG. 36B, the electrode 4015 and the wiring 4014 are connected to each other in a plurality of openings formed in the insulating layer 4020 and the insulating layer 4022. Since the surface of the electrode 4015 is uneven due to the plurality of openings, the area of contact between the electrode 4015 to be formed later and the anisotropic conductive layer 4019 can be increased. Thus, favorable connection of the FPC 4018 and the electrode 4015 can be obtained.

The pixel portion 4002 and the scan line driver circuit 4004 provided over the first substrate 4001 include a plurality of transistors. In FIGS. 36A and 36B, the transistor 4010 included in the pixel portion 4002 and the transistor 4011 included in the scan line driver circuit 4004 are shown as an example. The insulating layer 4020 is provided over the transistors 4010 and 4011 in FIG. 36A, and a planarization layer 4021 is further provided over the insulating layer 4020 in FIG. 36B. An insulating layer 4023 is an insulating film which functions as a base layer and the insulating layer 4022 functions as a gate insulating layer.

In this embodiment, the transistor described in the above embodiment can be applied to the transistors 4010 and 4011.

A change in the electrical characteristics of the transistor described in the above embodiment is suppressed, and thus the transistor is electrically stable. Accordingly, the semiconductor device of this embodiment illustrated in FIGS. 36A and 36B can be a highly reliable semiconductor device.

FIGS. 36A and 36B illustrate the case where a transistor having a structure similar to that of the transistor 100 described in the above embodiment is used as each of the transistors 4010 and 4011. FIG. 36B illustrates the case where a transistor having a structure similar to that of the transistor 100 described in the above embodiment is used as the transistor 4011. Further, FIG. 36B illustrates the case where a transistor having a structure similar to that of the transistor 163 described in the above embodiment is used as the transistor 4011. Specifically, the structural example is illustrated in which a conductive layer 4017 is provided so as to overlap with a channel formation region of the oxide semiconductor layer of the transistor 4011 for the driver circuit with the insulating layer 4023 positioned therebetween. The conductive layer 4017 can function as a back gate electrode.

The transistor 4010 included in the pixel portion 4002 is electrically connected to the display element to constitute part of a display panel. A variety of display elements can be used as the display element as long as display can be performed.

An example of a liquid crystal display device using a liquid crystal element as a display element is illustrated in FIG. 36A. In FIG. 36A, a liquid crystal element 4013 which is the display element includes the first electrode 4030, a second electrode 4031, and a liquid crystal layer 4008. Insulating films 4032 and 4033 serving as alignment films are provided so that the liquid crystal layer 4008 is sandwiched therebetween. The second electrode 4031 is provided on the second substrate 4006 side, and the first electrode 4030 and the second electrode 4031 overlap with each other with the liquid crystal layer 4008 positioned therebetween.

A spacer 4035 is a columnar spacer obtained by selective etching of an insulating layer and is provided in order to control the distance between the first electrode 4030 and the second electrode 4031. A spherical spacer may alternatively be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal exhibiting a blue phase for which an alignment film is not involved may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 vol. % or more of a chiral material is mixed is used for the liquid crystal layer in order to widen the temperature range.

The liquid crystal composition which includes the liquid crystal exhibiting a blue phase and a chiral material has a short response time of 1 msec or less, and has optical isotropy, which makes the alignment process unnecessary and the viewing angle dependence small. In addition, since an alignment film is not involved and thus rubbing treatment is unnecessary, electrostatic discharge damage caused by the rubbing treatment can be prevented, so that defects and damage of the liquid crystal display device in the manufacturing process can be reduced. Thus, productivity of the liquid crystal display device can be increased. A transistor using an oxide semiconductor layer has a possibility that the electrical characteristics may change significantly by the influence of static electricity to deviate from the designed range. Therefore, it is more effective to use a liquid crystal material exhibiting a blue phase for the liquid crystal display device including the transistor using the oxide semiconductor layer.

The inherent resistance of the liquid crystal material is greater than or equal to $1 \times 10^9$ Ω·cm, preferably greater than or equal to $1 \times 10^{11}$ Ω·cm, further preferably greater than or equal to $1 \times 10^{12}$ Ω·cm. The inherent resistance in this specification is measured at 20° C.

In the transistor used in this embodiment, which uses a highly-purified oxide semiconductor layer, the current in an off state (the off-state current) can be made small. Accordingly, an electrical signal such as an image signal can be held for a longer period in the pixel, and a writing interval can be set longer in an on state. Accordingly, frequency of refresh operation can be reduced, which leads to an effect of suppressing power consumption.

The magnitude of a storage capacitor provided in the liquid crystal display device is set considering the leakage current of the transistor in the pixel portion or the like so that electric charge can be held for a predetermined period. The magnitude of the storage capacitor may be set considering the off-state current of the transistor or the like. Since the transistor including a highly purified oxide semiconductor layer is used, it is enough to provide a storage capacitor having a capacitance that is less than or equal to ⅓, preferably less than or equal to ⅕ of the liquid crystal capacitance of each pixel.

In the transistor including the above oxide semiconductor, relatively high field-effect mobility can be obtained, whereby high-speed operation is possible. Consequently, when the above transistor is used in a pixel portion of a semiconductor device having a display function, high-quality images can be obtained. Since a driver circuit portion and the pixel portion can be formed over one substrate with the use of the above transistor, the number of components of the semiconductor device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an Advanced Super View (ASV) mode, and the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be applied with a polarizing substrate and a retardation substrate. In addition, a backlight, a side light, or the like may be used as a light source.

As a display method in the pixel portion, a progressive method, an interlace method, or the like can be employed. Further, color elements controlled in each pixel for color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the size of the display region may be different between respective dots of color elements. One embodiment of the present invention can be applied not only to a display device for color display, but also to a display device for monochrome display.

Further, a light-emitting element utilizing electroluminescence (an organic EL element or an inorganic EL element) can alternatively be used as the display element in the display device.

In an organic EL element, by application of voltage to the light-emitting element, electrons and holes are separately injected from a pair of electrodes into a layer containing the light-emitting organic compound, and current flows. Then, the carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which is further sandwiched between electrodes, and its light emission mechanism is localized type light emission that utilizes inner-shell electron transition of metal ions. An example in which an organic EL element is used as the light-emitting element is described here.

In order to extract light emitted from the light-emitting element, at least one of the pair of electrodes is transparent. The transistor and the light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the side opposite to the substrate and the substrate side.

FIG. 36B illustrates an example of an EL display device (also referred to as a light-emitting device) using a light-emitting element as a display element. A light-emitting element 4513 which is the display element is electrically connected to the transistor 4010 in the pixel portion 4002. The structure of the light-emitting element 4513 is the stacked-layer structure including the first electrode 4030, an electroluminescent layer 4511, and the second electrode 4031; however, this embodiment is not limited to this structure. The structure of the light-emitting element 4513 can be changed as appropriate depending on the direction in which light is extracted from the light-emitting element 4513, or the like.

A bank 4510 can be formed using an organic insulating material or an inorganic insulating material. It is particularly preferable that the bank 4510 be formed using a photosensitive resin material to have an opening over the first electrode 4030 so that a sidewall of the opening slopes with continuous curvature.

The electroluminescent layer 4511 consists of either a single layer or a plurality of layers stacked.

A protective layer may be formed over the second electrode 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is confined by the first substrate 4001, the second substrate 4006, and the sealant 4005, a filler 4514 is provided for sealing. It is preferable that the panel be packaged (sealed) with a protective film (such as a laminate film or an ultraviolet curable resin film) or a cover member with high air-tightness and little degasification so that the panel is not exposed to the outside air, in this manner.

As the filler 4514, an ultraviolet curable resin or a thermosetting resin can be used as well as an inert gas such as nitrogen or argon; for example, polyvinyl chloride (PVC), an acrylic resin, a polyimide resin, an epoxy resin, a silicone resin, polyvinyl butyral (PVB), ethylene vinyl acetate (EVA), or the like can be used. For example, nitrogen is used for the filler.

In addition, if necessary, an optical film, such as a polarizing plate, a circularly polarizing plate (including an elliptically polarizing plate), a retardation plate (a quarter-wave plate or a half-wave plate), or a color filter, may be provided as appropriate on a light-emission surface of the light-emitting element. Further, the polarizing plate or the circularly polarizing plate may be provided with an anti-reflection film. For example, anti-glare treatment by which reflected light can be diffused by unevenness of the surface so as to reduce the glare can be performed.

The first electrode layer and the second electrode layer (each of which is also called a pixel electrode, a common electrode, a counter electrode, or the like) for applying voltage to the display element each have either a light-transmitting property or a light-reflecting property, which depends on the direction in which light is extracted, the position where the electrode layer is provided, the pattern structure of the electrode layer, and the like.

The first electrode 4030 and the second electrode 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode 4030 and the second electrode 4031 each can also be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called a conductive polymer) can also be used for any of the first electrode 4030 and the second electrode 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given Since the transistor is easily broken owing to static electricity or the like, a protective circuit for protecting the driver circuit is preferably provided. The protection circuit is preferably formed using a nonlinear element.

As described above, by applying the transistor described in the above embodiment, a highly reliable semiconductor device having a display function can be provided.

[Example of Pixel Circuit]

Figure 37A:
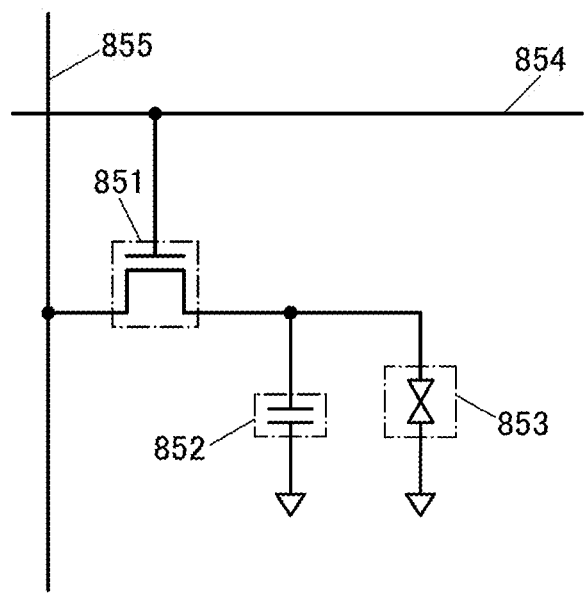
FIGS. 37A and 37B each illustrate an example of a pixel circuit applicable to a display device.
Figure 37B:
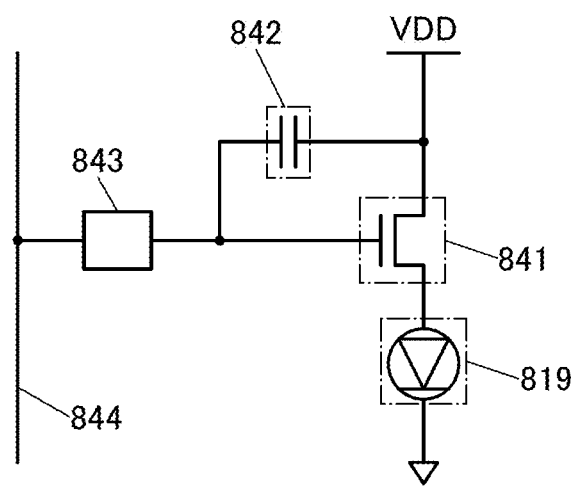

FIGS. 37A and 37B illustrate examples of a pixel circuit applicable to a display device. FIG. 37A is a circuit diagram of an example of a pixel circuit applicable to a liquid crystal display device. The pixel circuit illustrated in FIG. 37A includes a transistor 851, a capacitor 852, and a liquid crystal element 853 in which a space between a pair of electrodes is filled with a liquid crystal.

One of a source and a drain of the transistor 851 is electrically connected to a signal line 855, and a gate of the transistor 851 is electrically connected to a scan line 854.

One of electrodes of the capacitor 852 is electrically connected to the other of the source and the drain of the transistor 851, and the other of the electrodes of the capacitor 852 is electrically connected to a wiring for supplying a common potential.

One of electrodes of the liquid crystal element 853 is electrically connected to the other of the source and the drain of the transistor 851, and the other of the electrodes of the liquid crystal element 853 is electrically connected to a wiring for supplying a common potential. Note that the common potential supplied to the wiring electrically connected to the other of the electrodes of the capacitor 852 may be different from the common potential supplied to the wiring electrically connected to the other of the electrodes of the liquid crystal element 853.

FIG. 37B is a circuit diagram of an example of a pixel circuit applicable to an EL display device.

The pixel circuit in FIG. 37B includes a switching element 843, a transistor 841, a capacitor 842, and a light-emitting element 819.

A gate of the transistor 841 is electrically connected to one electrode of the switching element 843 and one electrode of the capacitor 842. A source of the transistor 841 is electrically connected to one electrode of the light-emitting element 819. A drain of the transistor 841 is electrically connected to the other electrode of the capacitor 842 and is supplied with a high power supply voltage VDD. The other electrode of the switching element 843 is electrically connected to a signal line 844. The other electrode of the light-emitting element 819 has a potential which is smaller than the high power supply potential VDD, e.g., a lower power supply voltage VSS or a ground potential GND.

Note that the high power supply voltage VDD refers to a power supply potential on the high voltage side. Note that the low power supply voltage VSS refers to a power supply potential on the low voltage side. Further, a ground potential GND can be used as the high power supply voltage or the low power supply voltage. For example, in the case where a ground potential is used as the high power supply voltage, the low power supply voltage is voltage lower than the ground potential, and in the case where a ground potential is used as the low power supply voltage, the high power supply voltage is voltage higher than the ground potential.

Note that as the transistor 841, the above-described transistor including the stack including the oxide semiconductor layer is used. The transistor has stable electrical characteristics. Thus, the EL display device can have high display quality.

As the switching element 843, a transistor is preferably used. When the transistor is used as the switching element, the area of a pixel can be reduced, so that the EL display device can have high resolution. Alternatively, the above-described transistor including the stack including the oxide semiconductor layer may be used as the switching element 843. When the transistor is used as the switching element 843, the switching element 843 can be formed in the same process as the transistor 841, so that the productivity of the EL display device can be improved.

[Example of Touch Sensor and Display Module]

A touch sensor and a display module that can be combined with a display device of one embodiment of the present invention are described with reference to FIGS. 36A and 36B, FIGS. 37A and 37B, FIGS. 38A and 38B, FIG. 39, FIG. 40, and FIG. 41.

Figure 38A:
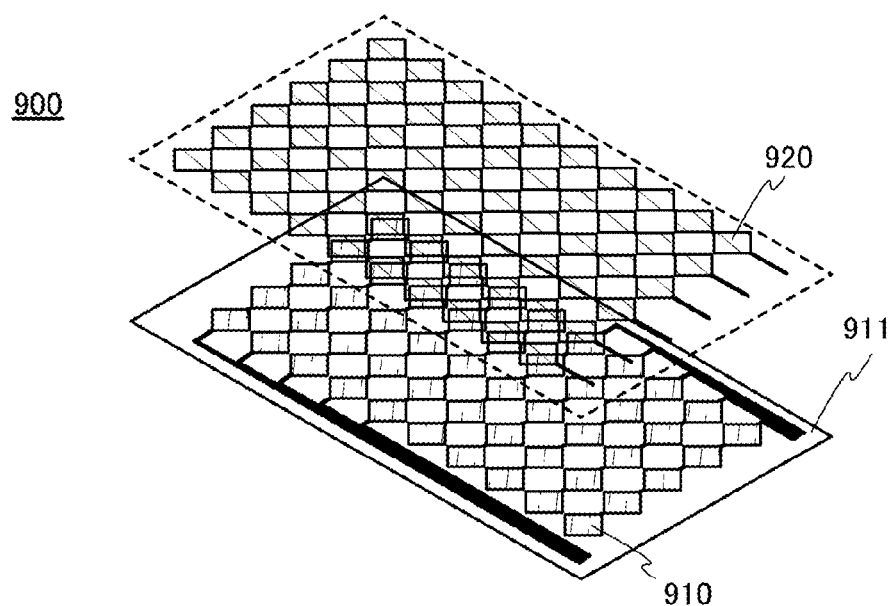
FIGS. 38A and 38B illustrate a touch sensor.
Figure 38B:
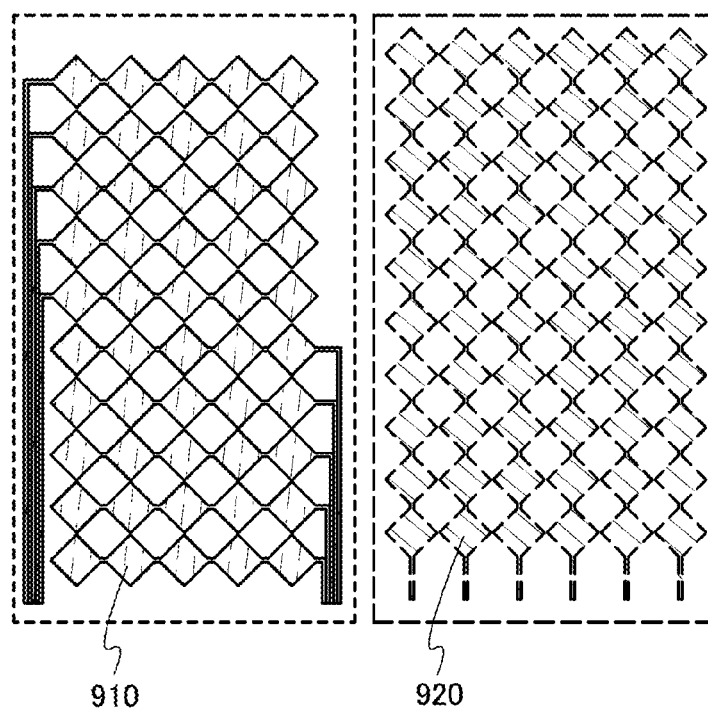
Figure 39:
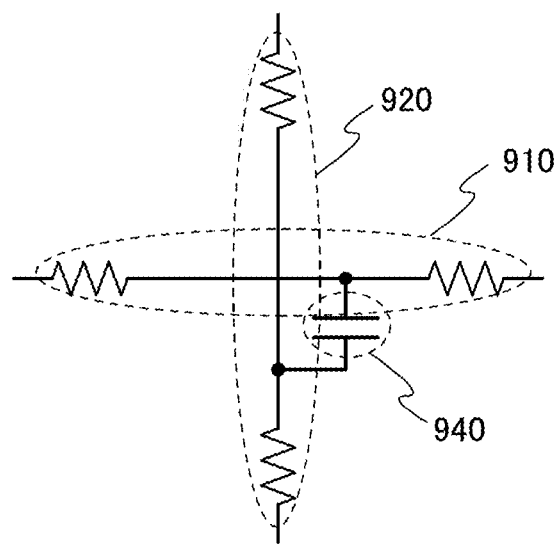
FIG. 39 is a circuit diagram of a touch sensor.

FIG. 38A is an exploded perspective view of a structural example of a touch sensor 900. FIG. 38B is a plan view of a structural example of an electrode of the touch sensor 900. FIG. 39 is a cross-sectional view of a structural example of the touch sensor 900.

The touch sensor 900 illustrated in FIGS. 38A and 38B includes, over a substrate 911, a plurality of conductive layers 910 arranged in the X-axis direction and a plurality of conductive layers 920 arranged in the Y-axis direction intersecting with the X-axis direction. In FIGS. 38A and 38B, a plan view of the plurality of conductive layers 910 of the touch sensor 900 and a plan view of the plurality of conductive layers 920 of the touch sensor 900 are separately illustrated.

FIG. 39 is an equivalent circuit diagram of an intersection portion of the conductive layer 910 and the conductive layer 920 of the touch sensor 900 illustrated in FIGS. 38A and 38B. As illustrated in FIG. 39, a capacitor 940 is formed at the intersection portion of the conductive layer 910 and the conductive layer 920.

The plurality of conductive layers 910 and the plurality of conductive layers 920 have structures in each of which a plurality of quadrangular conductive films are connected to each other. The plurality of conductive layers 910 and the plurality of conductive layers 920 are provided so that the quadrangular conductive films of the plurality of conductive layers 910 does not overlap with the quadrangular conductive films of the plurality of conductive layers 920. At the intersection portion of the conductive layer 910 and the conductive layer 920, an insulating film is provided between the conductive layer 910 and the conductive layer 920 to prevent the conductive layers 910 and 920 from being in contact with each other.

Figure 40:
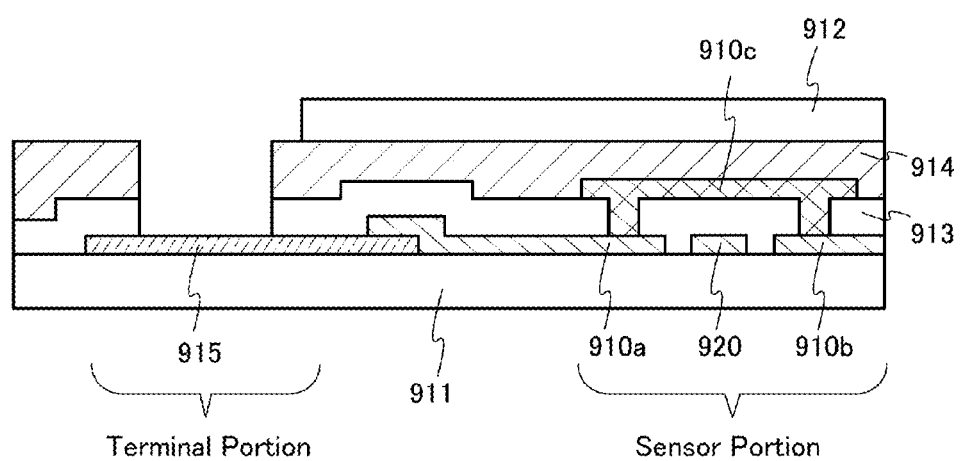
FIG. 40 is a cross-sectional view of a touch sensor.

FIG. 40 is a cross-sectional view illustrating an example of a connection structure of the conductive layers 910 and the conductive layer 920 of the touch sensor 900 in FIGS. 38A and 38B. FIG. 40 illustrates, as an example, a cross-sectional view of a portion where conductive layers 910a, 910b, and 910c intersect with the conductive layer 920.

As illustrated in FIG. 40, the conductive layers 910 include the conductive layer 910a and the conductive layer 910b in the first layer and the conductive layer 910c in the second layer over an insulating layer 913. The conductive layer 910a and the conductive layer 910b are electrically connected by the conductive layer 910c. The conductive layer 920 is formed using the conductive layer in the first layer. An insulating layer 914 is formed so as to cover the conductive layers 910 and 920 and an electrode 915. As the insulating layers 913 and 914, silicon oxynitride films may be formed, for example. A base film formed using an insulating film may be provided between the substrate 911 and each of the conductive layers 910 and the electrode 915. As the base film, for example, a silicon oxynitride film can be formed.

The conductive layers 910 and the conductive layer 920 are formed using a conductive material that transmits visible light, such as indium tin oxide containing silicon oxide, indium tin oxide, zinc oxide, indium zinc oxide, or zinc oxide to which gallium is added.

The conductive layer 910a is connected to the electrode 915. A terminal for connection to an FPC is formed using the electrode 915. Similarly to the conductive layers 910, the conductive layer 920 is connected to the electrode 915. The electrode 915 can be formed of a tungsten film, for example.

An opening portion is formed in the insulating layers 913 and 914 over the electrode 915 to electrically connect the electrode 915 and the FPC. A substrate 912 is attached to the insulating layer 914 using an adhesive, an adhesive film, or the like. The substrate 911 side is bonded to a color filter substrate of a display panel with an adhesive or an adhesive film, so that a touch panel is completed.

Next, a display module is described with reference to FIG. 41.

Figure 41:
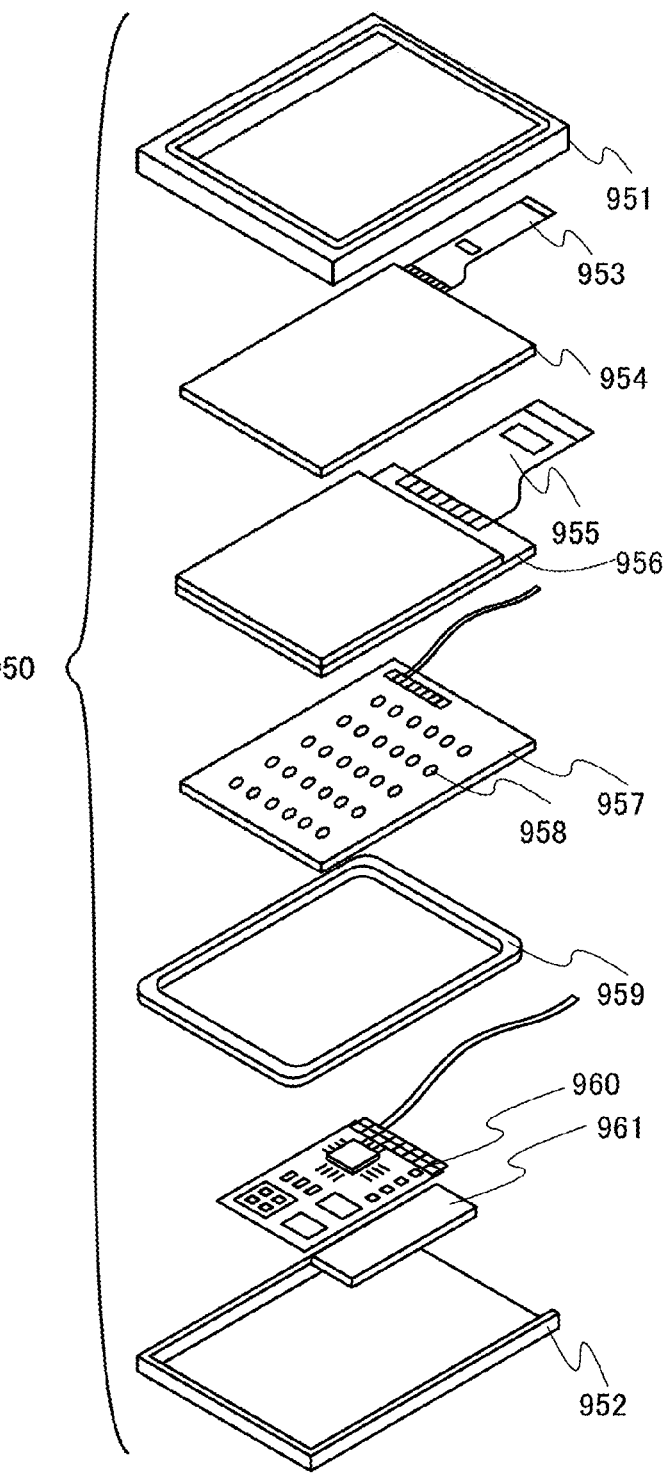
FIG. 41 illustrates a display module.

In a display module 950 in FIG. 41, a touch panel 954 connected to an FPC 953, a display panel 956 connected to an FPC 955, a backlight unit 957, a frame 959, a printed board 960, and a battery 961 are provided between an upper cover 951 and a lower cover 952.

The shapes and sizes of the upper cover 951 and the lower cover 952 can be changed as appropriate in accordance with the sizes of the touch panel 954 and the display panel 956.

The touch panel 954 can be a resistive touch panel or a capacitive touch panel and may be formed so as to overlap with the display panel 956. A counter substrate (sealing substrate) of the display panel 956 can have a touch panel function. A photosensor may be provided in each pixel of the display panel 956 so that the touch panel 954 can function as an optical touch panel.

The backlight unit 957 includes a light source 958. The light source 958 may be provided at an end portion of the backlight unit 957 and a light diffusing plate may be used.

The frame 959 protects the display panel 956 and functions as an electromagnetic shield for blocking electromagnetic waves generated by the operation of the printed board 960. The frame 959 may function as a radiator plate.

The printed board 960 is provided with a power supply circuit and a signal processing circuit for outputting a video signal and a clock signal. As a power source for supplying power to the power supply circuit, an external commercial power source or a power source using the battery 961 provided separately may be used. The battery 961 can be omitted in the case of using a commercial power source.

The display module 950 can be additionally provided with a member such as a polarizing plate, a retardation plate, or a prism sheet.

[Electronic Devices]

A semiconductor device disclosed in this specification can be applied to a variety of electronic devices (including game machines). Examples of the electronic devices include display devices of televisions, monitors, and the like, lighting devices, desktop personal computers and laptop personal computers, word processors, image reproduction devices which reproduce still images or moving images stored in recording media such as digital versatile discs (DVDs), portable CD players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as video cameras and digital still cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, medical equipment such as dialyzers, detectors detecting fire, smoke, electric leakage, gas leakage, or the like, and various sensors such as proximity sensors, infrared sensors, vibration sensors, radiation sensors, and human sensors. Further, the examples include industrial equipment such as guide lights, traffic lights, belt conveyors, elevators, escalators, industrial robots, and power storage systems. In addition, moving objects driven by oil engines and electric motors using power from the non-aqueous secondary batteries, and the like are also included in the category of electrical devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of the electronic devices are illustrated in FIGS. 42A to 42C.

Figure 42A:
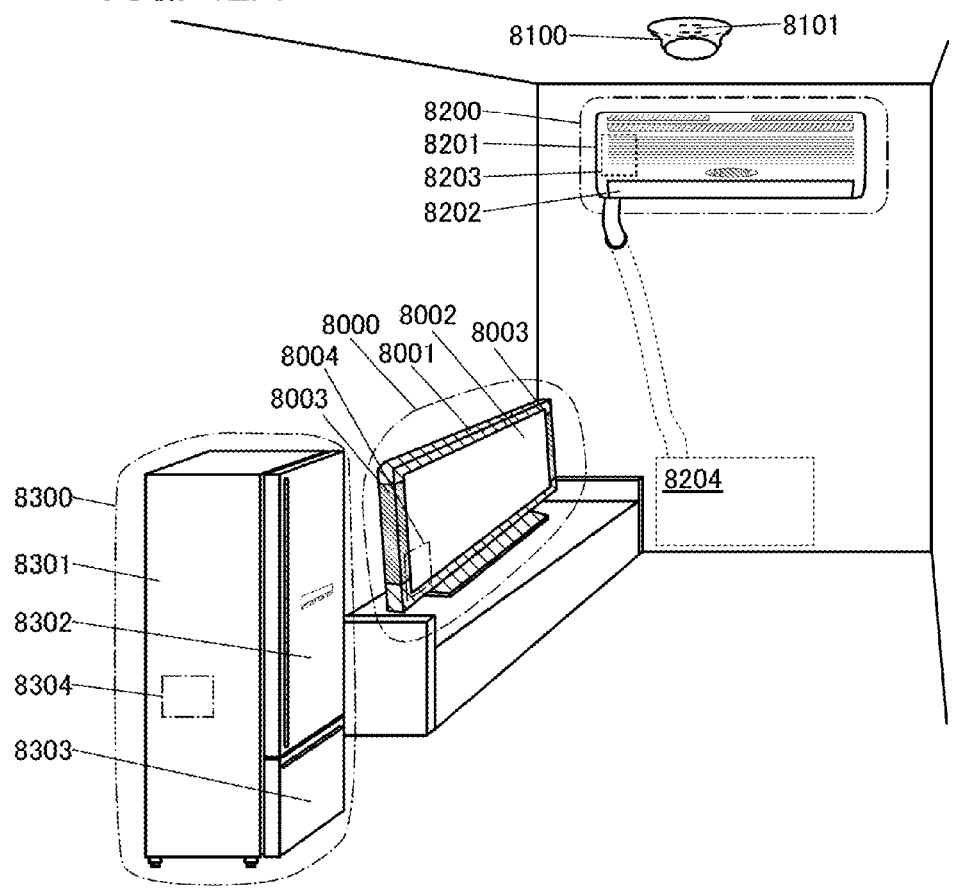
FIGS. 42A to 42C illustrate examples of an electronic device.
Figure 42B:
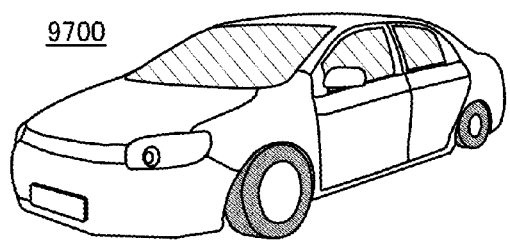
Figure 42C:
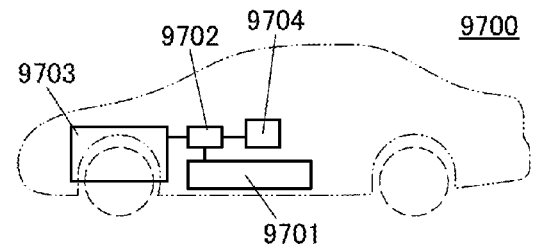

Specifically, in FIG. 42A, the display device 8000 corresponds to a display device for TV broadcast reception and includes a housing 8001, a display portion 8002, speaker portions 8003, a CPU 8004, and the like. A CPU including any of the above transistors can save power of the display device 8000. A display device including any of the above transistors is used as the display portion 8002, whereby display quality of the display device 8000 can be increased.

In FIG. 42A, an alarm system 8100 is a residential fire alarm, which includes a sensor portion and a microcomputer 8101. The above-described transistor can be used for the microcomputer 8101.

In FIG. 42A, a CPU that uses the above-described transistor is included in an air conditioner which includes an indoor unit 8200 and an outdoor unit 8204.

Specifically, the indoor unit 8200 includes a housing 8201, an air outlet 8202, a microcomputer 8203, and the like. Although the microcomputer 8203 is provided in the indoor unit 8200 in FIG. 42A, the microcomputer 8203 may be provided in the outdoor unit 8204. Alternatively, the microcomputer 8203 may be provided in both the indoor unit 8200 and the outdoor unit 8204. When the microcomputer uses the above-described transistor, the power saving of the air conditioner can be achieved.

In FIG. 42A, a microcomputer that uses the above transistor is included in an electric refrigerator-freezer 8300. Specifically, the electric refrigerator-freezer 8300 includes a housing 8301, a refrigerator door 8302, a freezer door 8303, a microcomputer 8304, and the like. The microcomputer 8304 is provided in the housing 8301 in FIG. 42A. When the microcomputer 8304 uses the above-described transistor, the power saving of the electric refrigerator-freezer 8300 can be achieved.

FIGS. 42B and 42C illustrate an example of an electric vehicle. An electric vehicle 9700 is equipped with a secondary battery 9701. The output of power of the secondary battery 9701 is controlled by a control circuit 9702 and the power is supplied to a driving device 9703. The control circuit 9702 is controlled by a processing unit 9704 including a ROM, a RAM, a microcomputer, or the like which is not illustrated. When a microcomputer uses the above-described transistor, the power saving of the electric vehicle 9700 can be achieved.

The driving device 9703 includes a direct-current motor or an alternate-current motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the alternate-current motor is mounted, although not illustrated, an inverter which converts direct current into alternate current is also incorporated.

This embodiment can be implemented in appropriate combination with the structures described in the other embodiments.

(Embodiment 5)

In this embodiment, a semiconductor device (also referred to as a measurement device) for measuring the capacitance and the relative dielectric constant of an oxide semiconductor is described.

<Measurement Device for Comparative Example>

Figure 43:
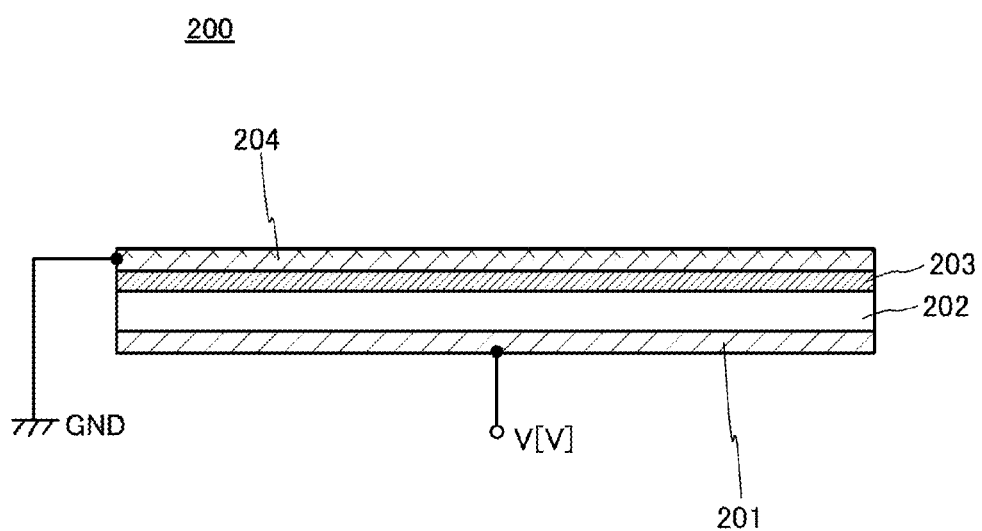
FIG. 43 illustrates an example of a measurement device.

In order to measure the capacitance of a semiconductor in an MIS (metal, insulator, semiconductor) structure, a measurement device like a measurement device 200 illustrated in FIG. 43 can be used. The measurement device 200 includes a first insulating layer 202 over a first electrode 201, a semiconductor layer 203 over the first insulating layer 202, and a second electrode 204 over the semiconductor layer 203.

Normally, when a positive voltage (V>0[V]) is applied to the first electrode 201 and a reference potential (GND) is supplied to the second electrode 204, electrons are distributed on a surface of the semiconductor layer 203 which is on the first insulating layer 202 side. At this time, the capacitance of the first insulating layer 202 is measured.

Next, when a negative voltage (V<0[V]) is applied to the first electrode 201, a depletion layer from which carriers are removed is formed in the semiconductor layer 203. At this time, the capacitance of the first insulating layer 202 and the capacitance of the depletion layer formed in the semiconductor layer 203 are measured.

The capacitance $C_{Total}$ of the MIS structure can be expressed by the following formula. $C_{Semi}$ represents the capacitance of the semiconductor. $C_{Insu}$ represents the capacitance of the insulating film.

$$\frac{1}{C_{Total}} = \frac{1}{C_{Semi}} + \frac{1}{C_{Insu}} \qquad \text{[FORMULA 1]}$$

However, in the case where the semiconductor layer 203 is an oxide semiconductor, the capacitance of the semiconductor layer 203 cannot be measured by the measurement device

Figure 45A:
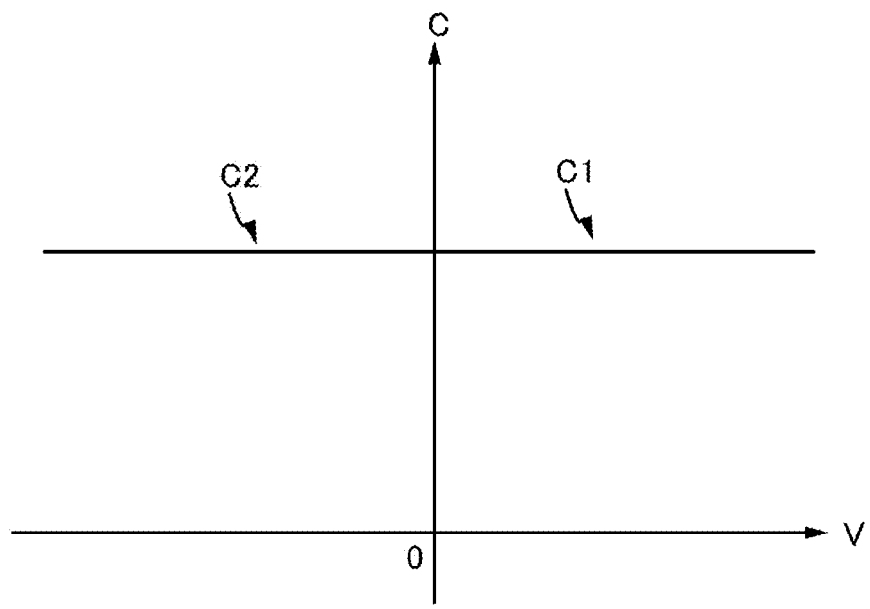
FIGS. 45A and 45B show CV characteristics.

200. FIG. 45A shows CV characteristics that are expected in the case where the semiconductor layer 203 is an oxide semiconductor.

In FIG. 45A, there is no difference between the capacitance value C1 which is obtained when a positive voltage is applied to the first electrode 201 and the capacitance value C2 which is obtained when a negative voltage is applied to the first electrode 201.

When an oxide semiconductor is in contact with an electrode including a metal such as Ti (titanium) or W (tungsten), n-type conductivity is imparted to the oxide semiconductor. In the measurement device 200, the semiconductor layer 203 is in contact with the second electrode 204. Thus, it is expected that n-type conductivity is imparted to the semiconductor layer 203. In addition, n-type conductivity is easily imparted to the oxide semiconductor. When n-type conductivity is imparted to the oxide semiconductor, a depletion layer from which carriers are removed is not formed in the semiconductor layer 203. Thus, in the case where the semiconductor layer 203 is an oxide semiconductor, the capacitance of the semiconductor cannot be measured by the measurement device 200.

<Measurement Device of One Embodiment of Present Invention>

Figure 44A:
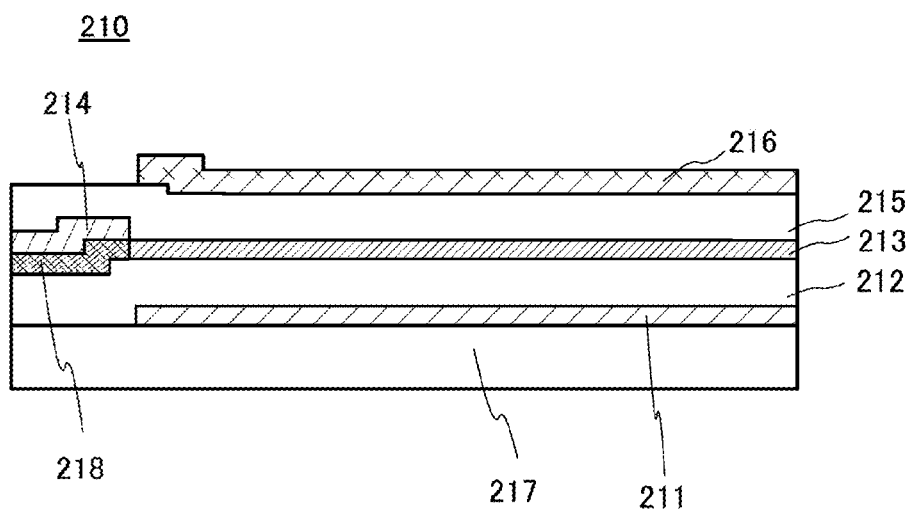
FIGS. 44A and 44B illustrate an example of a measurement device.

Thus, in this embodiment, a measurement device 210 which can measure the capacitance of an oxide semiconductor is described (FIG. 44A). FIG. 44A is a cross-sectional view of the measurement device 210.

The measurement device 210 includes a first insulating layer 212 over a first electrode 211, an oxide semiconductor layer 213 over the first insulating layer 212, a second electrode 214 over the oxide semiconductor layer 213, a second insulating layer 215 over the oxide semiconductor layer 213, and a third electrode 216 over the second insulating layer 215. The first electrode 211 includes a region overlapping with the oxide semiconductor layer 213. The first electrode 211 includes a region overlapping with the third electrode 216. The oxide semiconductor layer 213 includes a region overlapping with the third electrode 216. The measurement device 210 is provided over a supporting substrate 217.

Figure 44B:
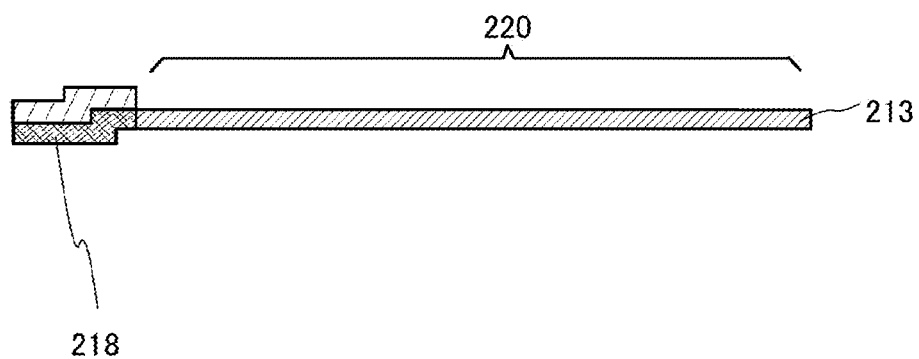

The oxide semiconductor layer 213 includes a region 218 in contact with the second electrode 214. N-type conductivity is imparted to an oxide semiconductor in the region 218. However, a region 220 in which the oxide semiconductor layer 213 is not in contact with the second electrode 214 includes a portion to which n-type conductivity is not imparted (FIG. 44B). Thus, a depletion layer from which carriers are removed is formed in the oxide semiconductor layer 213, whereby the capacitance can be measured.

For example, when a positive voltage is applied to the first electrode 211 and a reference potential is supplied to the second electrode 214 and the third electrode 216, electrons are distributed on a surface of the semiconductor layer 213 which is on the first insulating layer 212 side. At this time, the capacitance ($C_{Insu1}$) of the first insulating layer 212 is measured.

Next, when a negative voltage is applied to the first electrode 211, a depletion layer is formed in the oxide semiconductor layer 213. At this time, the capacitance ($C_{Insu1}$) of the first insulating layer 212, the capacitance ($C_{Semi}$) of the oxide semiconductor layer 213, and the capacitance ($C_{Insu2}$) of the second insulating layer 215 are measured.

The capacitance $C_{Total}$ of the measurement device 210 is expressed by the following formula. $C_{Semi}$ represents the capacitance of the oxide semiconductor layer 213. $C_{Insu1}$ represents the capacitance of the first insulating layer 212. $C_{Insu2}$ represents the capacitance of the second insulating layer 215.

$$\frac{1}{C_{Total}} = \frac{1}{C_{Insu1}} + \frac{1}{C_{Semi}} + \frac{1}{C_{Insu2}} \qquad \text{[FORMULA 2]}$$

Figure 45B:
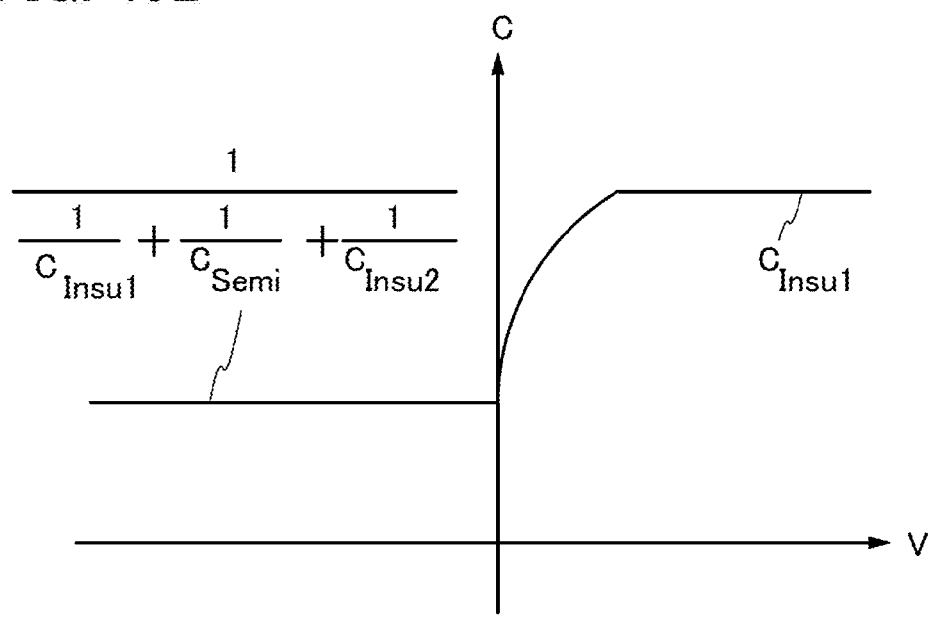

FIG. 45B shows measurement results that are expected in the case where capacitance is measured by the measurement device 210.

In general, the capacitance (C) is expressed by the following formula. Here, $\varepsilon_r$, $\varepsilon_0$, S, and d represent a relative dielectric constant, a vacuum permittivity, an area, and a film thickness, respectively.

$$C = \frac{\varepsilon_r \varepsilon_0 S}{d} \qquad \text{[FORMULA 3]}$$

For each of the first insulating layer 212 and the second insulating layer 215, an insulator having a known relative dielectric constant is used. The capacitance $C_{Total}$ is measured with this, so that the capacitance ($C_{Semi}$) of the oxide semiconductor layer 213 can be obtained. The relative dielectric constant of the oxide semiconductor layer 213 can be obtained from the above formula.

Here, the reason why the capacitance $C_{Total}$ can be measured by the measurement device 210 is considered.

Figure 46:
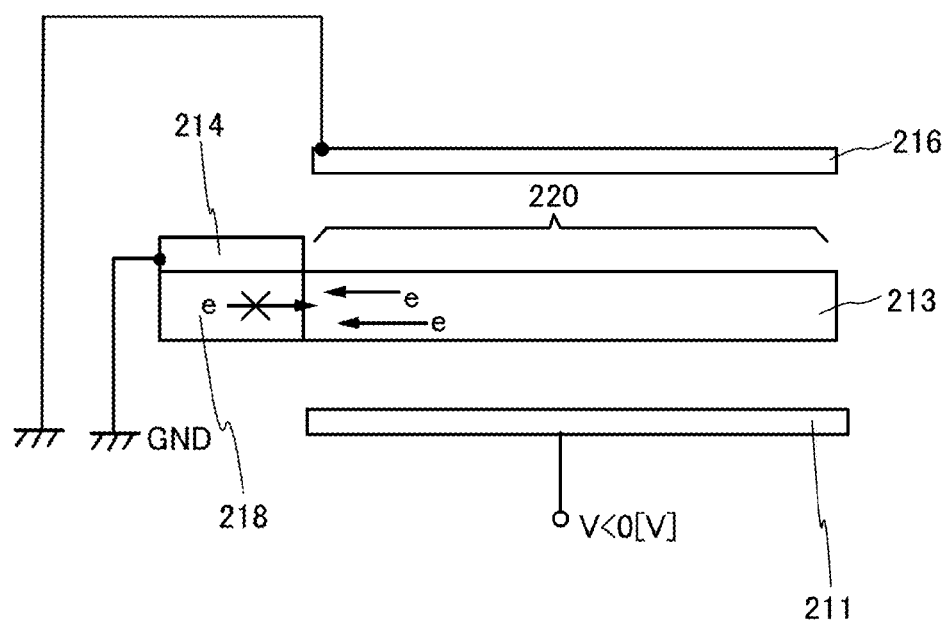
FIG. 46 illustrates an example of a measurement device.

N-type conductivity is imparted to the oxide semiconductor of the region 218. Carriers (e) in the region 218 repel the negative voltage applied to the first electrode 211, and do not move toward the center of the oxide semiconductor layer 213 (FIG. 46). Thus, a portion in which a depletion layer is formed is included in the region 220 of the oxide semiconductor layer 213 which is not in contact with the second electrode 214, in other words, the region 220 of the oxide semiconductor layer 213 in which the first electrode 211, the oxide semiconductor layer 213, and the third electrode 216 overlap with each other.

Even in the case where a part of the oxide semiconductor layer 213 becomes an n-type region, the carriers (e) in the oxide semiconductor layer 213 repel the negative voltage applied to the first electrode 211, and move toward the region 218 (FIG. 46). Thus, a portion in which the first electrode 211, the oxide semiconductor layer 213, and the third electrode 216 overlap with each other includes a depletion layer.

Therefore, the capacitance $C_{Total}$ can be measured by the measurement device 210.

Figure 47A:
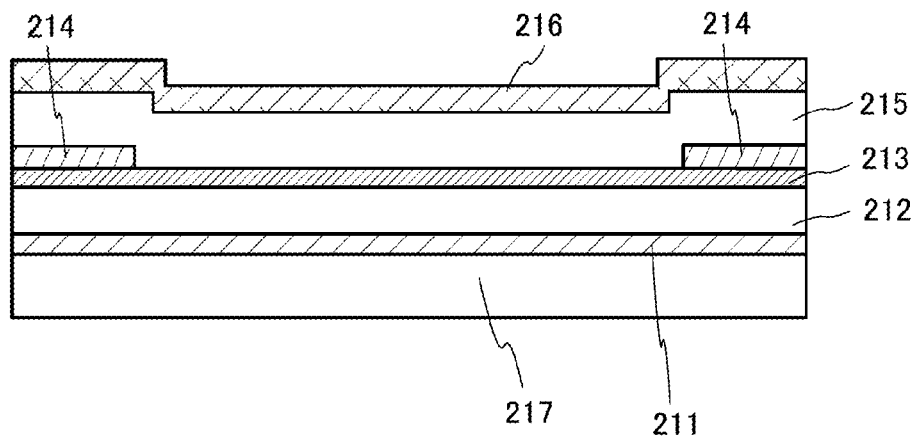
FIGS. 47A and 47B each illustrate an example of a measurement device.
Figure 47B:
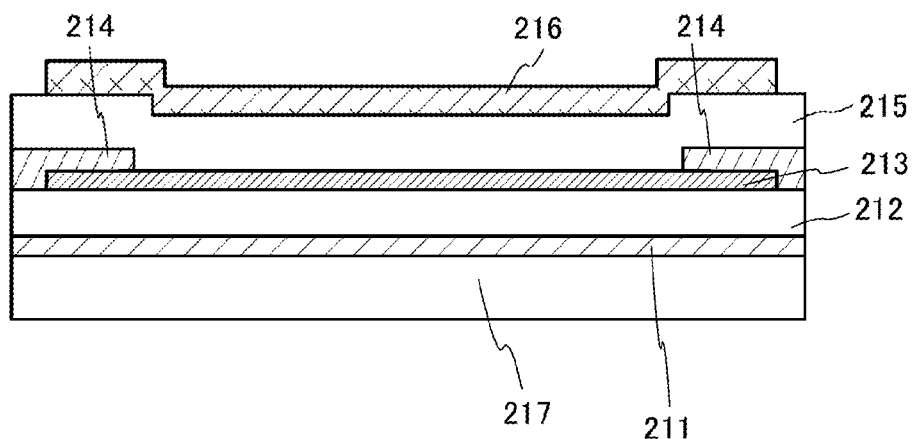
Figure 48:
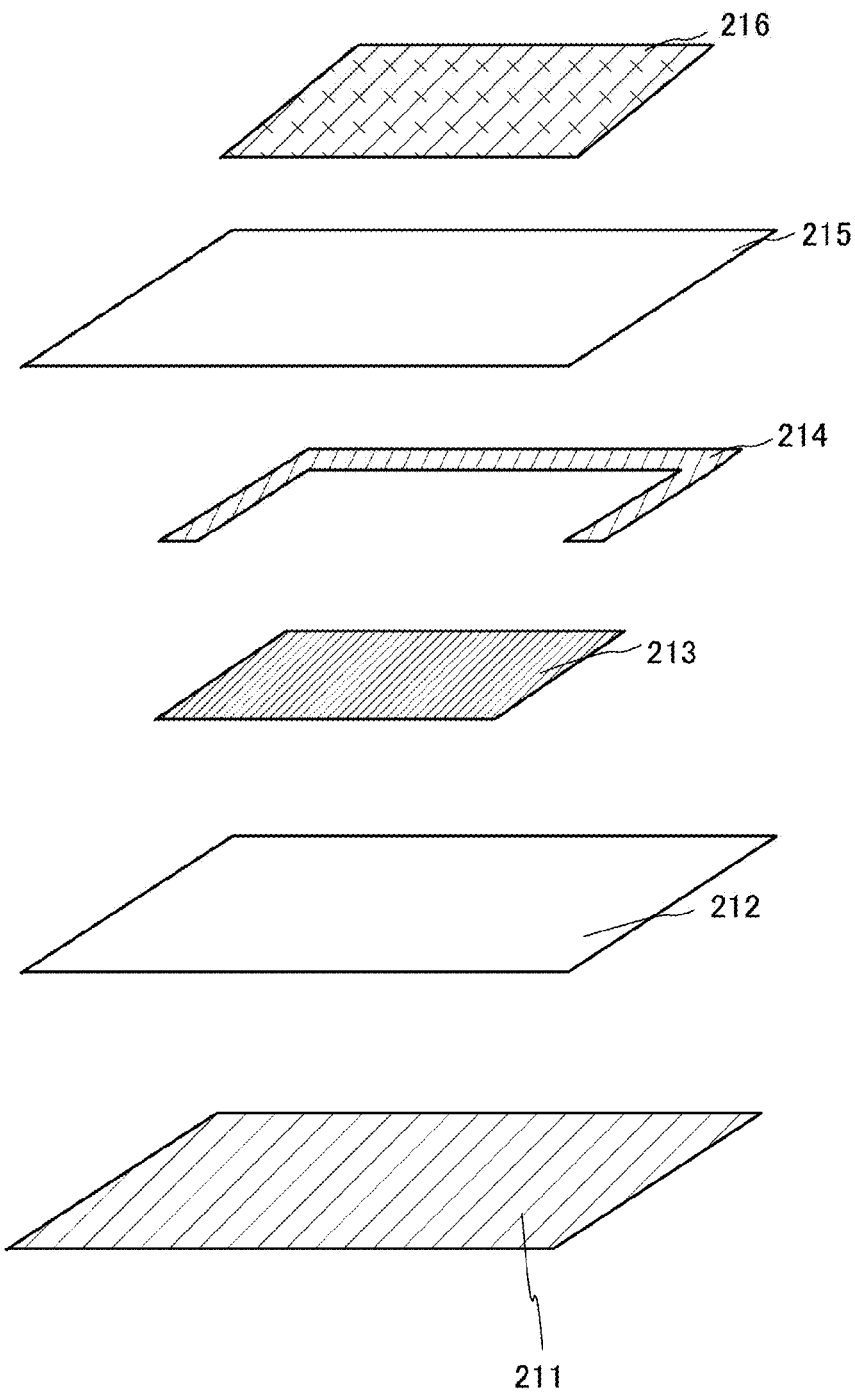
FIG. 48 illustrates an example of a measurement device.

The structure of the measurement device of one embodiment of the present invention is not limited to the structure illustrated in FIG. 44A. For example, a plurality of second electrodes 214 may be provided. In a measurement device 221 illustrated in FIG. 47A, two second electrodes 214 are provided. Like a measurement device 222 illustrated in FIG. 47B, the oxide semiconductor layer 213 and the third electrode 216 may each be processed into an island shape. Further, the first electrode 211 may be processed into an island shape. Like a measurement device 223 illustrated in FIG. 48, the second electrode 214 may be formed to have a U shape. Note that in FIG. 48, the measurement device is separated by components and is seen from an oblique direction.

Figure 49:
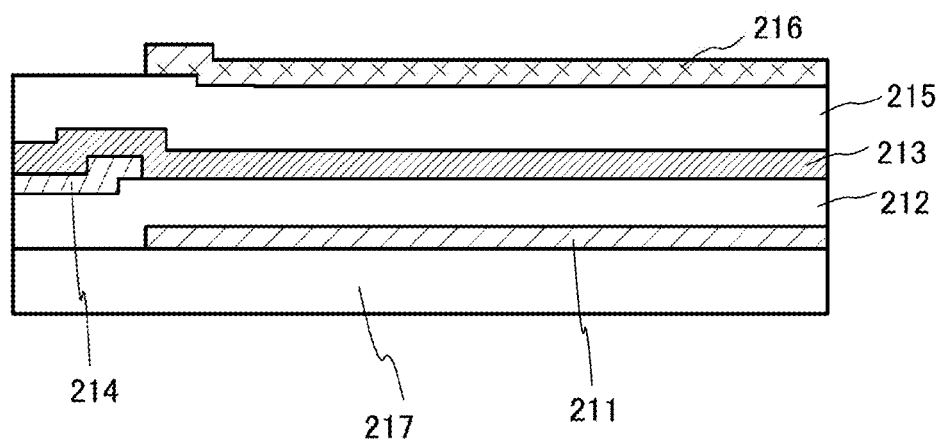
FIG. 49 illustrates an example of a measurement device.

Like a measurement device 224 illustrated in FIG. 49, the second electrode 214 may be provided below the oxide semiconductor layer 213. The second electrode 214 may be provided below the oxide semiconductor layer 213 also in the measurement device 221 in FIG. 47A and the measurement device 222 in FIG. 47B.

In FIGS. 44A and 44B, n-type conductivity is imparted to all part of the oxide semiconductor in the region 218. However, it is acceptable as long as the region 218 includes an oxide semiconductor to which n-type conductivity is imparted. For example, n-type conductivity may be imparted to only a surface portion of the region 218 or a portion close to the surface of the region 218. N-type conductivity may be imparted to a portion with a depth of about 10 nm from the surface of the region 218.

In the measurement device of one embodiment of the present invention, a voltage is applied to the first electrode 211 so that the potential of the first electrode 211 becomes higher than or lower than those of the second electrode 214 and the third electrode 216.

When a voltage with which the potential of the first electrode 211 becomes higher than those of the second electrode 214 and the third electrode 216 is applied to the first electrode 211, electrons are distributed on the surface of the oxide semiconductor layer 213 on the first insulating layer 212 side. This case corresponds to the above-described case where a positive voltage is applied to the first electrode 211 and the reference potential (GND) is applied to the second electrode 214 and the third electrode 216.

When a voltage with which the potential of the first electrode 211 becomes lower than those of the second electrode 214 and the third electrode 216 is applied to the first electrode 211, a depletion layer is formed in the oxide semiconductor layer 213. This case corresponds to the above-described case where a negative voltage is applied to the first electrode 211 and the reference potential (GND) is applied to the second electrode 214 and the third electrode 216.

Figure 50A:
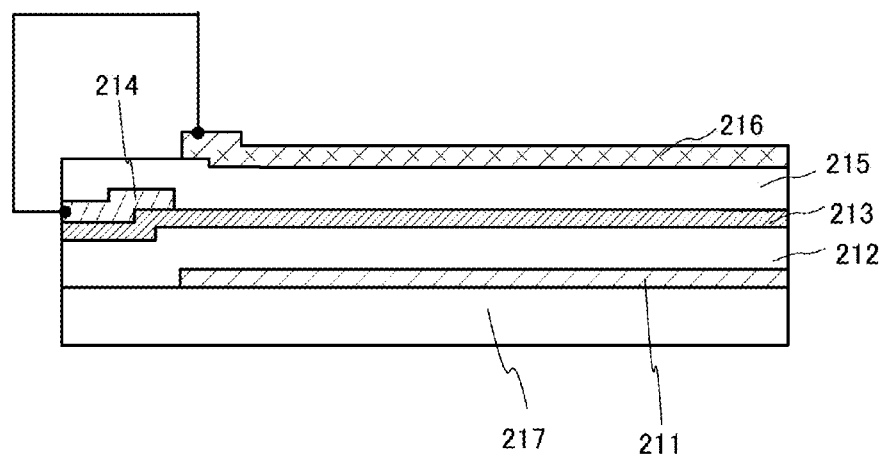
FIGS. 50A and 50B each illustrate an example of a measurement device.
Figure 50B:
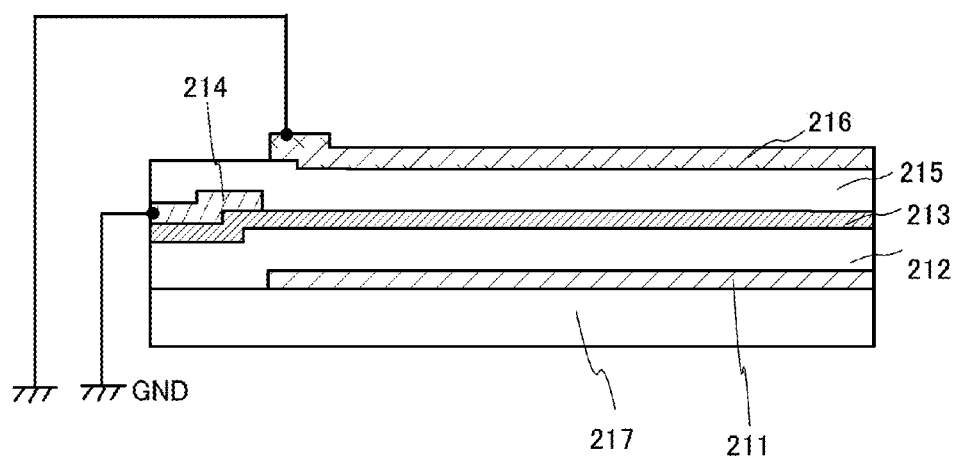

In the measurement device of one embodiment of the present invention, the second electrode 214 may be electrically connected with the third electrode 216 (FIG. 50A). For example, the reference potential (GND) may be applied to the second electrode 214 and the third electrode 216 (FIG. 50B).

In the measurement device of one embodiment of the present invention, a voltage may be applied to the third electrode 216 so that the potential of the third electrode 216 becomes higher than or lower than those of the first electrode 211 and the second electrode 214.

When a voltage with which the potential of the third electrode 216 becomes higher than those of the first electrode 211 and the second electrode 214 is applied to the third electrode 216, electrons are distributed on the surface of the oxide semiconductor layer 213 on the second insulating layer 215 side. At this time, the capacitance of the second insulating layer 215 is measured.

When a voltage with which the potential of the third electrode 216 becomes lower than those of the first electrode 211 and the second electrode 214 is applied to the third electrode 216, a depletion layer is formed in the oxide semiconductor layer 213.

At this time, the sum capacitance of the capacitance ($C_{Insu1}$) of the first insulating layer 212, the capacitance ($C_{Semi}$) of the oxide semiconductor layer 213, and the capacitance ($C_{Insu2}$) of the second insulating layer 215 is measured.

Figure 51A:
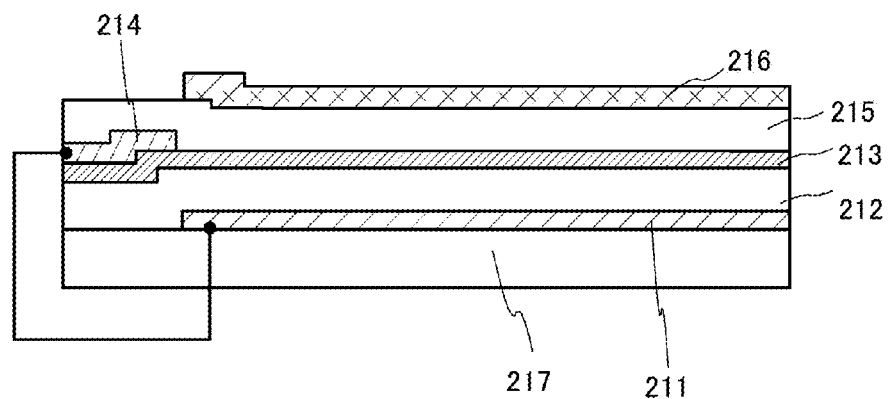
FIGS. 51A and 51B each illustrate an example of a measurement device.
Figure 51B:
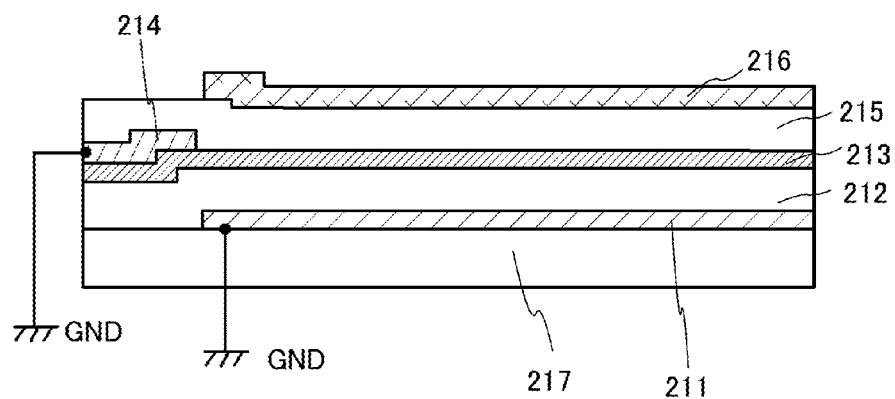

In the measurement device of one embodiment of the present invention, the first electrode 211 may be electrically connected with the second electrode 214 (FIG. 51A). For example, the reference potential (GND) may be applied to the first electrode 211 and the second electrode 214 (FIG. 51B).

<Material of Measurement Device>

Each component of the semiconductor device of one embodiment of the present invention is described. Each component of the semiconductor device may be a single film or a multi-layer film.

[Electrode]

The first electrode 211, the second electrode 214, and the third electrode 216 can be formed using materials for forming the gate electrode, the source electrode, and the drain electrode described in Embodiment 1.

[Insulating Layer]

The first insulating layer 212 and the second insulating layer 215 can be formed using materials for forming the insulating layer described in Embodiment 1. The relative dielectric constants of the materials used for the first insulating layer 212 and the second insulating layer 215 are preferably already known.

[Oxide Semiconductor Layer]

The oxide semiconductor layer 213 can be formed using a material used for the oxide semiconductor layer described in Embodiment 1.

[Supporting Substrate]

The supporting substrate 217 can be formed using a material similar to that of the substrate described in Embodiment 1.

This embodiment can be implemented in appropriate combination with the structures described in the other embodiments.

EXAMPLE 1

This example describes the results of measurement of capacitance of the oxide semiconductor layers using the measurement device of one embodiment of the present invention and measurement devices of Comparative Examples.

<Measurement Device of One Embodiment of Present Invention>

Figure 52:
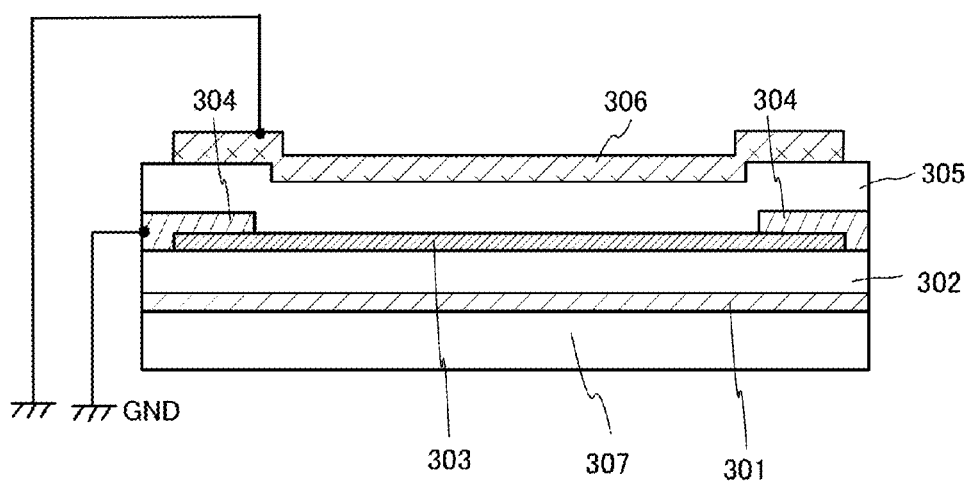
FIG. 52 illustrates an example of a measurement device.

FIG. 52 illustrates a measurement device 300 which is a measurement device of one embodiment of the present invention. The measurement device 300 has a similar structure to those of the measurement device 222 illustrated in FIG. 47B and the measurement device 223 illustrated in FIG. 48.

The method for manufacturing the measurement device 300 is described. In this example, an oxide semiconductor layer 303 and a second insulating layer 305 each have two thicknesses; that is, four kinds of measurement devices were fabricated.

A first electrode 301 was formed over a glass substrate which is a supporting substrate 307 by a sputtering method. Here, a tungsten film was used for the first electrode 301. The tungsten film was formed to have a thickness of 100 nm by a DC sputtering method using tungsten for a sputtering target.

Next, a first insulating layer 302 was formed over the first electrode 301. A 100-nm-thick silicon oxynitride film was formed by a PECVD method. Note that the relative dielectric constant of the first insulating layer 302 is 4.1.

Next, the oxide semiconductor layer 303 was formed over the first insulating layer 302. Here, the oxide semiconductor layer 303 was formed by a DC sputtering method using an oxide target containing In, Ga, and Zn at an atomic ratio of 1:1:1 as a sputtering target. The formation conditions were as follows: the substrate temperature was 300° C.; the formation gas was Ar (30 sccm) and $O_2$ (15 sccm); the deposition power was 0.5 kW; the deposition pressure was 0.4 Pa; and the distance between an electrode and the substrate was 60 mm. The thickness of the oxide semiconductor layer 303 was 100 nm or 300 nm.

Next, a second electrode 304 was formed over the oxide semiconductor layer 303. The second electrode was formed to have a U shape. Here, a tungsten film is used for the second electrode 304. The tungsten film was formed to have a thickness of 100 nm by a DC sputtering method using tungsten for a sputtering target. Then, the tungsten film was processed to form the second electrode 304.

Next, the second insulating layer 305 was formed over the oxide semiconductor layer 303. Here, a silicon oxide film is used for the second insulating layer 305. The silicon oxide film was formed by a DC sputtering method using silicon oxide for a sputtering target. The thickness of the second insulating layer 305 was 100 nm or 300 nm. Note that the relative dielectric constant of the second insulating layer 305 is 3.9.

Next, heat treatment was performed. The heat treatment was performed in an atmosphere containing nitrogen and oxygen at 300° C. for one hour.

Next, a third electrode 306 was formed over the second insulating layer 305. Here, an indium tin oxide film to which silicon oxide was added was used for the third electrode 306. The third electrode 306 was formed by a DC sputtering method. The thickness of the third electrode 306 was 150 nm.

A direct-current voltage and an alternate-current voltage are applied to the first electrode 301, and a capacitance voltage (CV) measurement was performed. The measurement frequency was 1 kHz, 2 kHz, and 5 kHz. The reference potential (GND) was applied to the second electrode 304 and the third electrode 306.

Figure 53:
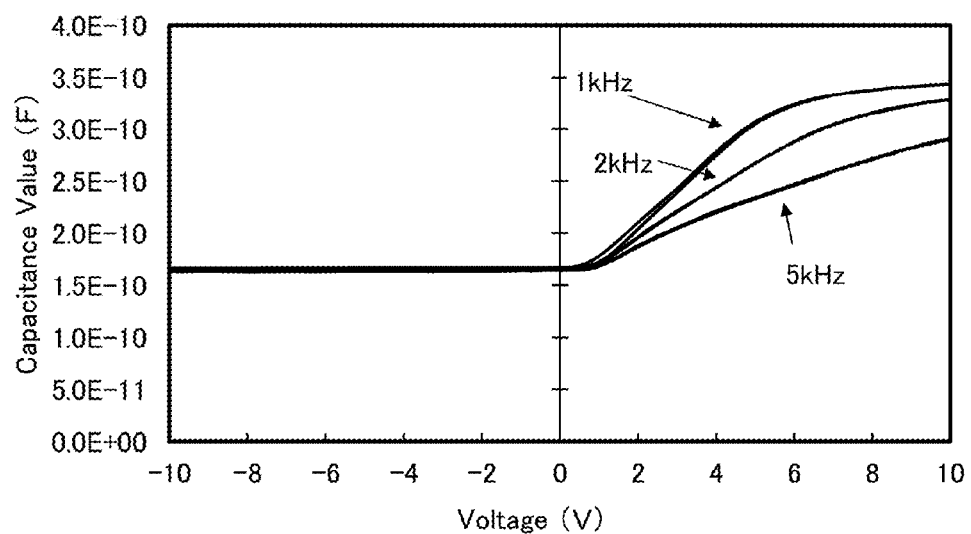
FIG. 53 shows the results of CV measurement.
Figure 54:
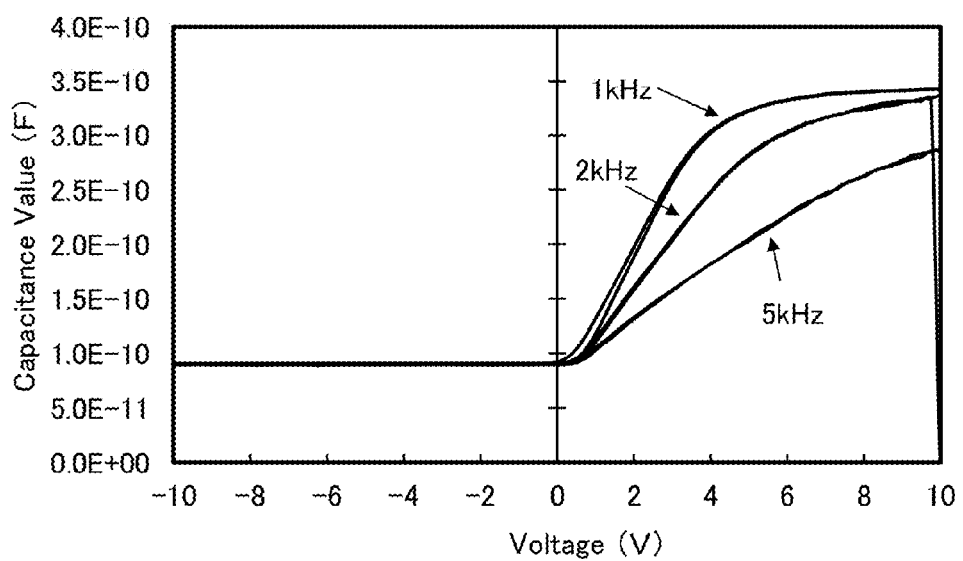
FIG. 54 shows the results of CV measurement.
Figure 55:
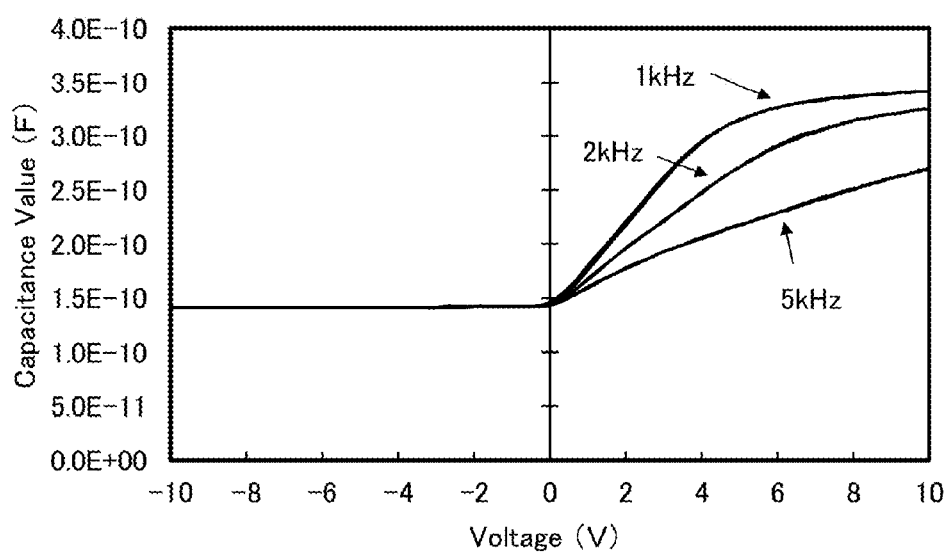
FIG. 55 shows the results of CV measurement.
Figure 56:
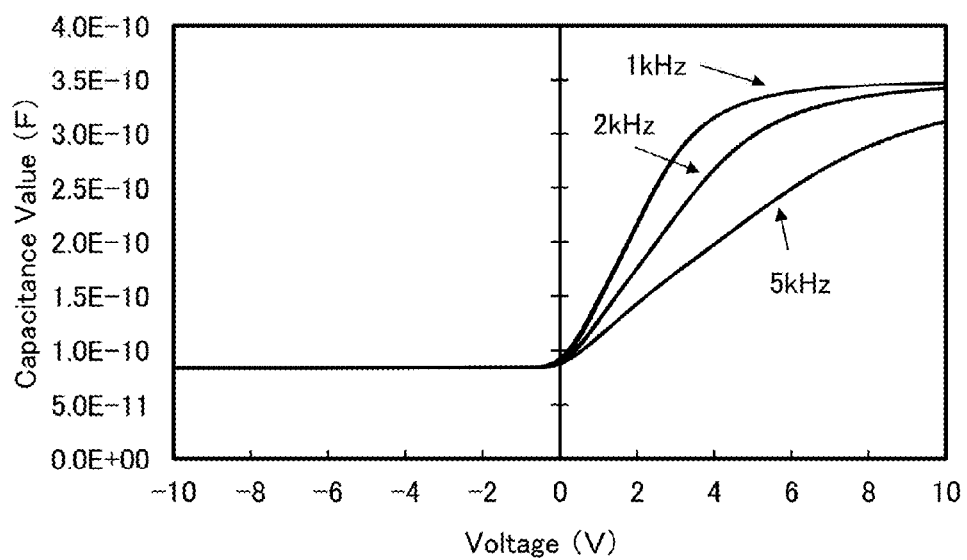
FIG. 56 shows the results of CV measurement.

The CV measurement results are shown in FIG. 53, FIG. 54, FIG. 55, and FIG. 56. FIG. 53 shows the CV measurement results when the thickness of the oxide semiconductor layer 303 is 100 nm and the thickness of the second insulating layer 305 is 100 nm. FIG. 54 shows the CV measurement results when the thickness of the oxide semiconductor layer 303 is 100 nm and the thickness of the second insulating layer 305 is 300 nm. FIG. 55 shows the CV measurement results when the thickness of the oxide semiconductor layer 303 is 300 nm and the thickness of the second insulating layer 305 is 100 nm. FIG. 56 shows the CV measurement results when the thickness of the oxide semiconductor layer 303 is 300 nm and the thickness of the second insulating layer 305 is 300 nm.

As shown in FIG. 53, FIG. 54, FIG. 55, and FIG. 56, by the measurement device 300 of one embodiment of the present invention, the capacitance value can be measured as a limited value when a negative voltage (V<0[V]) is applied to the first electrode 301. The capacitance value does not depend on the measurement frequency when the negative voltage (V<0[V]) is applied to the first electrode 301. This capacitance value is the sum of the capacitance of the first insulating layer 302, the capacitance of the second insulating layer 305, and the capacitance of the oxide semiconductor layer 303.

As described above, the relative dielectric constant of the first insulating layer 302 is 4.1 and the relative dielectric constant of the second insulating layer 305 is 3.9. The capacitance of the oxide semiconductor is calculated by subtracting the capacitance of the insulating layer 302 and the capacitance of the second insulating layer 305 from the capacitance value obtained when the negative voltage (V<0[V]) is applied to the first electrode 301, and the relative dielectric constant is obtained (Table 2).

Table 2 shows that the relative dielectric constant of the oxide semiconductor layer 303 is 11.82 (FIG. 53), 13.23 (FIG. 54), 17.65 (FIG. 55), and 15.96 (FIG. 56).

Table 2

|  | FIG. 53 | FIG. 54 | FIG. 55 | FIG. 56 |
|---|---|---|---|---|
| The capacitance when a negative voltage is applied to the first electrode | $1.60 \times 10^{-10}$ | $9.10 \times 10^{-11}$ | $1.41 \times 10^{-10}$ | $8.35 \times 10^{-11}$ |
| The relative dielectric constant of the oxide semiconductor layer | 11.82 | 13.23 | 17.65 | 15.96 |

In Non-Patent Documents 1, the relative dielectric constant of an oxide semiconductor used for device simulation is 10. In Non-Patent Document 2, the relative dielectric constant of an oxide semiconductor used for device simulation is 12. In Non-Patent Document 3, the relative dielectric constant (298 K) is 12.4. The relative dielectric constant of the oxide semiconductor which is obtained by using the measurement device 300 of one embodiment of the present invention has sufficient reliability.

COMPARATIVE EXAMPLE 1

Figure 57A:
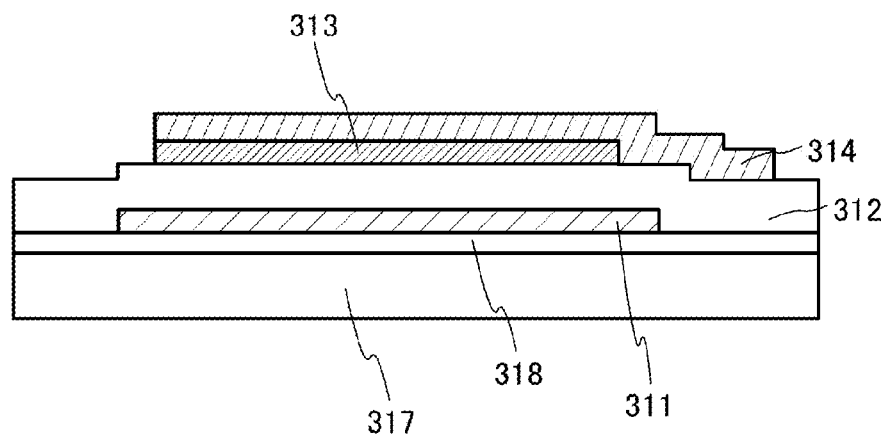
FIGS. 57A and 57B each illustrate an example of a measurement device.

FIG. 57A illustrates a measurement device 310. The measurement device 310 includes a first electrode 311, a first insulating layer 312, an oxide semiconductor layer 313, and a second electrode 314. The measurement device 310 is similar to the measurement device 200 illustrated in FIG. 43.

The method for manufacturing the measurement device 310 is described.

As a third insulating layer 318, a silicon oxynitride film was formed over a glass substrate which is a supporting substrate 317.

The first electrode 311 was formed over the third insulating layer 318 by a sputtering method. Here, a tungsten film was used for the first electrode 311. The tungsten film was formed to have a thickness of 100 nm by a DC sputtering method using tungsten for a sputtering target. The tungsten film was processed into an island shape.

Next, the first insulating layer 312 was formed over the first electrode 311. A 100-nm-thick silicon oxynitride film was formed by a PECVD method.

The oxide semiconductor layer 313 was formed over the first insulating layer 312. Here, the oxide semiconductor layer 313 was formed by a DC sputtering method using an oxide target containing In, Ga, and Zn at an atomic ratio of 1:1:1 as a sputtering target. The formation conditions were as follows: the substrate temperature was 300° C.; the formation gas was Ar (30 sccm) and $O_2$ (15 sccm); the deposition power was 0.5 kW; and the deposition pressure was 0.4 Pa. The thickness of the oxide semiconductor layer 313 was 40 nm.

Next, heat treatment was performed. The heat treatment was performed at 350° C. in the air for one hour.

Next, the second electrode 314 was formed over the oxide semiconductor layer 313. Here, a titanium film was used for the second electrode 314. The titanium film was formed to have a thickness of 100 nm by a DC sputtering method using titanium for a sputtering target. Then, the titanium film was processed into an island shape.

A direct-current voltage and an alternate-current voltage are applied to the first electrode 311, and a CV measurement was performed. The measurement frequency was 1 kHz, 10 kHz, 100 kHz, and 1 MHz.

Figure 58:
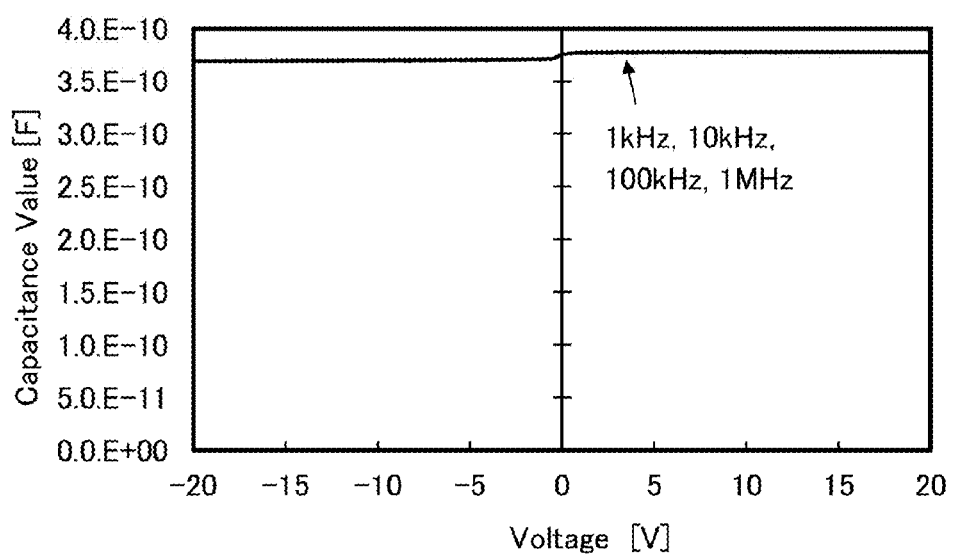
FIG. 58 shows the results of CV measurement.

The CV measurement results are shown in FIG. 58.

In FIG. 58, at any measurement frequency, there is no difference between the capacitance value obtained when a negative voltage (V<0[V]) is applied to the first electrode 311 and the capacitance value obtained when a positive voltage (V>0[V]) is applied to the first electrode 311. Thus, it is found that the capacitance of the oxide semiconductor layer 313 cannot be measured by the measurement device 310.

This is probably because the conductivity of the oxide semiconductor layer 313 is increased by the contact of the oxide semiconductor layer 313 with the second electrode 314.

COMPARATIVE EXAMPLE 2

Figure 57B:
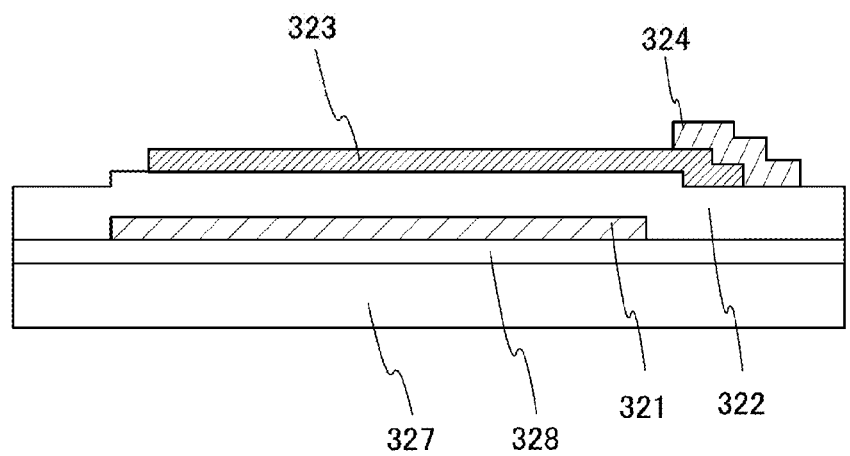

FIG. 57B illustrates a measurement device 320. The measurement device 320 includes a first electrode 321, a first insulating layer 322, an oxide semiconductor layer 323, and a second electrode 324. In the measurement device 320, the second electrode 324 does not overlap with the first electrode 321.

The method for manufacturing the measurement device 320 is described.

As a third insulating layer 328, a silicon nitride film was formed over a glass substrate which is a supporting substrate 327, and a silicon oxynitride film was formed.

The first electrode 321 was formed over the third insulating layer 328 by a sputtering method. Here, a tungsten film was used for the first electrode 321. The tungsten film was formed to have a thickness of 100 nm by a DC sputtering method using tungsten for a sputtering target. The tungsten film was processed into an island shape.

Next, the first insulating layer 322 was formed over the first electrode 321. A 100-nm-thick silicon oxynitride film was formed by a CVD method utilizing high-density plasma.

The oxide semiconductor layer 323 was formed over the first insulating layer 322. Here, the oxide semiconductor layer 323 was formed by a DC sputtering method using an oxide target containing In, Ga, and Zn at an atomic ratio of 1:1:1 as a sputtering target. The formation conditions were as follows: the substrate temperature was 300° C.; the formation gas was $O_2$ (100%); and the deposition pressure was 0.6 Pa. The thickness of the oxide semiconductor layer 323 was 30 nm.

Next, heat treatment was performed. The heat treatment was performed at 650° C. in a nitrogen atmosphere ($N_2$ (100%)) for six minutes by a GRTA apparatus.

Next, the second electrode 324 was formed over the oxide semiconductor layer 323. Here, a stacked film including a first titanium film, an aluminum film, and a second titanium film was used for the second electrode 324. The first titanium film, the aluminum film, and the second titanium film were formed to have a thickness of 100 nm, 200 nm, and 100 nm, respectively, by a DC sputtering method. Then, the stacked film was processed into an island shape.

A direct-current voltage and an alternate-current voltage are applied to the first electrode 321, and a CV measurement was performed. The measurement frequency was 1 kHz, 10 kHz, 100 kHz, and 1 MHz.

Figure 59:
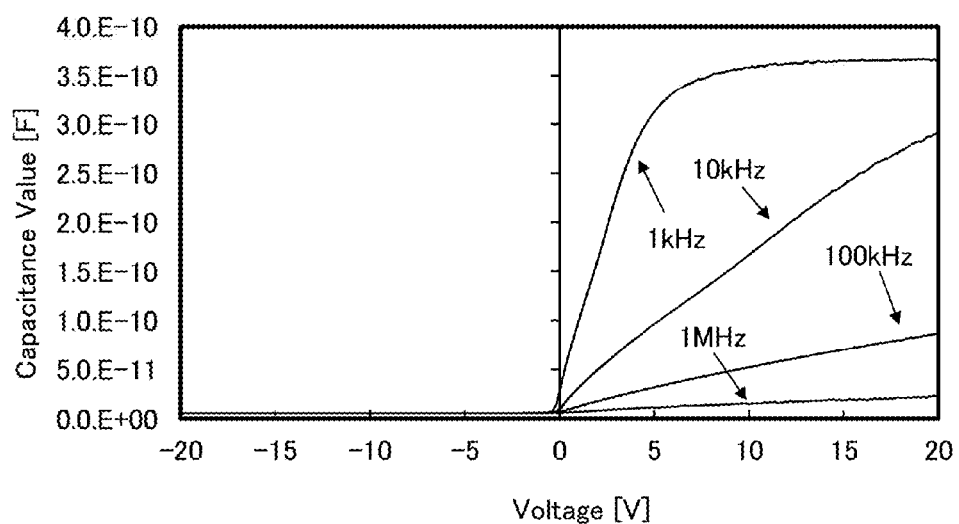
FIG. 59 shows the results of CV measurement.

The CV measurement results are shown in FIG. 59.

In FIG. 59, at any measurement frequency, the capacitance value becomes almost 0 (zero) when a negative voltage (V<0 [V]) is applied to the first electrode 321. Thus, it is found that the capacitance of the oxide semiconductor layer 323 cannot be measured by the measurement device 320.

This can be because the first electrode 321 does not overlap with the second electrode 324.

As described above, the capacitance (C) is expressed by the following formula. Here, $\varepsilon_r$, $\varepsilon_0$, S, and d represent a relative dielectric constant, a vacuum permittivity, an area, and a film thickness, respectively.

$$C = \frac{\varepsilon_r \varepsilon_0 S}{d} \quad \text{[FORMULA 4]}$$

Since the first electrode 321 does not overlap with the second electrode 324 in the measurement device 320, the value of S is small in the above formula. This may make the capacitance value almost 0 (zero).

This application is based on Japanese Patent Application serial No. 2012-287533 filed with Japan Patent Office on Dec. 28, 2012, the entire contents of which are hereby incorporated by reference.

What is claimed is:

1. A semiconductor device comprising:
a first oxide layer;
an oxide semiconductor layer which is over the first oxide layer and in which a channel is formed;
a first source electrode and a first drain electrode in contact with a top surface of the oxide semiconductor layer;
a second source electrode which is over the first source electrode and is electrically connected to the first source electrode;
a second drain electrode which is over the first drain electrode and is electrically connected to the first drain electrode;
a second oxide layer over the first source electrode and the first drain electrode;
a gate insulating layer over the second source electrode, the second drain electrode, and the second oxide layer; and
a gate electrode over the gate insulating layer,
wherein the second oxide layer is in contact with the top surface of the oxide semiconductor layer at least partly.

2. The semiconductor device according to claim 1, wherein at least one of the first oxide layer and the second oxide layer contains one or more kinds of metal elements which are the same as metal elements contained in the oxide semiconductor layer.

3. The semiconductor device according to claim 1, wherein at least one of electron affinity of the first oxide layer and electron affinity of the second oxide layer is smaller than electron affinity of the oxide semiconductor layer.

4. The semiconductor device according to claim 1, comprising a fourth oxide layer in contact with a top surface of the second oxide layer,
wherein the fourth oxide layer contains one or more kinds of metal elements which are the same as metal elements contained in the second oxide layer.

5. The semiconductor device according to claim 4, wherein electron affinity of the fourth oxide layer is smaller than electron affinity of the second oxide layer.

6. The semiconductor device according to claim 1,
wherein the first source electrode and the first drain electrode comprises a first material, and the second source electrode and the second drain electrode comprises a second material, and
wherein the first material has a lower oxidation potential than the second material.

7. The semiconductor device according to claim 1, wherein the gate insulating layer comprises a hafnium oxide film.

8. The semiconductor device according to claim 1, wherein the gate insulating layer comprises an aluminum oxide film.

9. The semiconductor device according to claim 1, comprising a protective insulating layer over the gate electrode,
   wherein the gate insulating layer comprises a silicon oxide film or a silicon oxynitride film, and
   wherein the protective insulating layer comprises a silicon nitride film or an aluminum oxide film.

10. A semiconductor device comprising:
   an insulating layer containing oxygen;
   a first oxide layer in contact with a top surface of the insulating layer;
   an oxide semiconductor layer which is over the first oxide layer and in which a channel is formed;
   a first source electrode and a first drain electrode in contact with a top surface of the oxide semiconductor layer;
   a second source electrode electrically connected to the first source electrode;
   a second drain electrode electrically connected to the first drain electrode;
   a second oxide layer over the first source electrode, the first drain electrode, the second source electrode, and the second drain electrode;
   a gate insulating layer over the second oxide layer; and
   a gate electrode over the gate insulating layer,
   wherein the second source electrode, the second drain electrode, and the second oxide layer are in contact with the top surface of the oxide semiconductor layer.

11. The semiconductor device according to claim 10, comprising a region where the insulating layer is in contact with the second oxide layer outside the oxide semiconductor layer.

12. The semiconductor device according to claim 10, comprising a third oxide layer between the insulating layer and the first oxide layer,
   wherein the third oxide layer contains one or more kinds of metal elements which are the same as metal elements contained in the first oxide layer.

13. The semiconductor device according to claim 12, wherein electron affinity of the third oxide layer is smaller than electron affinity of the first oxide layer.

14. The semiconductor device according to claim 10, wherein at least one of the first oxide layer and the second oxide layer contains one or more kinds of metal elements which are the same as metal elements contained in the oxide semiconductor layer.

15. The semiconductor device according to claim 10, wherein at least one of electron affinity of the first oxide layer and electron affinity of the second oxide layer is smaller than electron affinity of the oxide semiconductor layer.

16. The semiconductor device according to claim 10, comprising a fourth oxide layer in contact with a top surface of the second oxide layer,
   wherein the fourth oxide layer contains one or more kinds of metal elements which are the same as metal elements contained in the second oxide layer.

17. The semiconductor device according to claim 16, wherein electron affinity of the fourth oxide layer is smaller than electron affinity of the second oxide layer.

18. The semiconductor device according to claim 10,
   wherein the first source electrode and the first drain electrode comprises a first material, and the second source electrode and the second drain electrode comprises a second material, and
   wherein the first material has a lower oxidation potential than the second material.

19. The semiconductor device according to claim 10, wherein the gate insulating layer comprises a hafnium oxide film.

20. The semiconductor device according to claim 10, wherein the gate insulating layer comprises an aluminum oxide film.

21. The semiconductor device according to claim 10, comprising a protective insulating layer over the gate electrode,
   wherein the gate insulating layer comprises a silicon oxide film or a silicon oxynitride film, and
   wherein the protective insulating layer comprises a silicon nitride film or an aluminum oxide film.

22. A semiconductor device comprising:
   an insulating layer containing oxygen;
   a first oxide layer in contact with a top surface of the insulating layer;
   an oxide semiconductor layer which is over the first oxide layer and in which a channel is formed;
   a first source electrode and a first drain electrode in contact with a top surface of the oxide semiconductor layer;
   a second oxide layer over the first source electrode and the first drain electrode;
   a second source electrode and a second drain electrode over the second oxide layer;
   a gate insulating layer over the second source electrode, the second drain electrode, and the second oxide layer; and
   a gate electrode over the gate insulating layer,
   wherein the second source electrode is electrically connected to the first source electrode, and
   wherein the second drain electrode is electrically connected to the first drain electrode.

23. The semiconductor device according to claim 22, comprising a region where the insulating layer is in contact with the second oxide layer outside the oxide semiconductor layer.

24. The semiconductor device according to claim 22, comprising a third oxide layer between the insulating layer and the first oxide layer,
   wherein the third oxide layer contains one or more kinds of metal elements which are the same as metal elements contained in the first oxide layer.

25. The semiconductor device according to claim 24, wherein electron affinity of the third oxide layer is smaller than electron affinity of the first oxide layer.

26. The semiconductor device according to claim 22, wherein at least one of the first oxide layer and the second oxide layer contains one or more kinds of metal elements which are the same as metal elements contained in the oxide semiconductor layer.

27. The semiconductor device according to claim 22, wherein at least one of electron affinity of the first oxide layer and electron affinity of the second oxide layer is smaller than electron affinity of the oxide semiconductor layer.

28. The semiconductor device according to claim 22, comprising a fourth oxide layer in contact with a top surface of the second oxide layer,
   wherein the fourth oxide layer contains one or more kinds of metal elements which are the same as metal elements contained in the second oxide layer.

29. The semiconductor device according to claim 28, wherein electron affinity of the fourth oxide layer is smaller than electron affinity of the second oxide layer.

30. The semiconductor device according to claim 22,
   wherein the first source electrode and the first drain electrode comprises a first material, and the second source electrode and the second drain electrode comprises a second material, and
   wherein the first material has a lower oxidation potential than the second material.

31. The semiconductor device according to claim 22, wherein the gate insulating layer comprises a hafnium oxide film.

32. The semiconductor device according to claim 22, wherein the gate insulating layer comprises an aluminum oxide film.

33. The semiconductor device according to claim 22, comprising a protective insulating layer over the gate electrode,
wherein the gate insulating layer comprises a silicon oxide film or a silicon oxynitride film, and
wherein the protective insulating layer comprises a silicon nitride film or an aluminum oxide film.

34. A semiconductor device comprising:
a first oxide layer;
an oxide semiconductor layer which is over the first oxide layer;
a first source electrode and a first drain electrode in contact with a first portion of a top surface of the oxide semiconductor layer;
a second source electrode in contact with a part of a top surface and a side surface of the first source electrode and a second portion of the top surface of the oxide semiconductor layer;
a second drain electrode in contact with a part of a top surface and a side surface of the first drain electrode and a third portion of the top surface of the oxide semiconductor layer;
a second oxide layer over the first source electrode and the first drain electrode;
a gate insulating layer over the second source electrode, the second drain electrode, and the second oxide layer; and
a gate electrode over the gate insulating layer,
wherein the second oxide layer is in contact with a fourth portion of the top surface of the oxide semiconductor layer.

35. The semiconductor device according to claim 34, wherein at least one of the first oxide layer and the second oxide layer contains one or more kinds of metal elements which are the same as metal elements contained in the oxide semiconductor layer.

36. The semiconductor device according to claim 34, comprising a fourth oxide layer in contact with a top surface of the second oxide layer,
wherein the fourth oxide layer contains one or more kinds of metal elements which are the same as metal elements contained in the second oxide layer.

37. The semiconductor device according to claim 34, wherein the gate insulating layer comprises a hafnium oxide film.

38. The semiconductor device according to claim 34, wherein the gate insulating layer comprises an aluminum oxide film.

39. The semiconductor device according to claim 34, comprising a protective insulating layer over the gate electrode,
wherein the gate insulating layer comprises a silicon oxide film or a silicon oxynitride film, and
wherein the protective insulating layer comprises a silicon nitride film or an aluminum oxide film.

40. A semiconductor device comprising:
an insulating layer containing oxygen;
a first oxide layer in contact with a top surface of the insulating layer;
an oxide semiconductor layer which is over the first oxide layer;
a first source electrode and a first drain electrode in contact with a first portion of a top surface of the oxide semiconductor layer;
a second source electrode in contact with a part of a top surface and a side surface of the first source electrode and a second portion of the top surface of the oxide semiconductor layer;
a second drain electrode in contact with a part of a top surface and a side surface of the first drain electrode and a third portion of the top surface of the oxide semiconductor layer;
a second oxide layer over the first source electrode, the first drain electrode, the second source electrode, and the second drain electrode;
a gate insulating layer over the second oxide layer; and
a gate electrode over the gate insulating layer,
wherein the second oxide layer is in contact with a fourth portion of the top surface of the oxide semiconductor layer.

41. The semiconductor device according to claim 40, comprising a region where the insulating layer is in contact with the second oxide layer outside the oxide semiconductor layer.

42. The semiconductor device according to claim 40, comprising a third oxide layer between the insulating layer and the first oxide layer,
wherein the third oxide layer contains one or more kinds of metal elements which are the same as metal elements contained in the first oxide layer.

43. The semiconductor device according to claim 40, wherein at least one of the first oxide layer and the second oxide layer contains one or more kinds of metal elements which are the same as metal elements contained in the oxide semiconductor layer.

44. The semiconductor device according to claim 40, comprising a fourth oxide layer in contact with a top surface of the second oxide layer,
wherein the fourth oxide layer contains one or more kinds of metal elements which are the same as metal elements contained in the second oxide layer.

45. The semiconductor device according to claim 40, wherein the gate insulating layer comprises a hafnium oxide film.

46. The semiconductor device according to claim 40, wherein the gate insulating layer comprises an aluminum oxide film.

47. The semiconductor device according to claim 40, comprising a protective insulating layer over the gate electrode,
wherein the gate insulating layer comprises a silicon oxide film or a silicon oxynitride film, and
wherein the protective insulating layer comprises a silicon nitride film or an aluminum oxide film.

* * * * *